US011580397B2

(12) United States Patent
Terakanambi Sheshadri et al.

(10) Patent No.: US 11,580,397 B2
(45) Date of Patent: Feb. 14, 2023

(54) TENSOR DROPOUT USING A MASK HAVING A DIFFERENT ORDERING THAN THE TENSOR

(71) Applicant: SambaNova Systems, Inc., Palo Alto, CA (US)

(72) Inventors: Sathish Terakanambi Sheshadri, Milpitas, CA (US); Ram Sivaramakrishnan, San Jose, CA (US); Raghu Prabhakar, San Jose, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/665,289

(22) Filed: Feb. 4, 2022

(65) Prior Publication Data
US 2022/0391694 A1 Dec. 8, 2022

Related U.S. Application Data

(63) Continuation of application No. 17/337,126, filed on Jun. 2, 2021, now Pat. No. 11,256,987.

(51) Int. Cl.
| | |
|---|---|
| G06N 3/08 | (2006.01) |
| G06N 3/063 | (2006.01) |
| H03M 7/30 | (2006.01) |

(52) U.S. Cl.
CPC ............ *G06N 3/08* (2013.01); *G06N 3/063* (2013.01); *H03M 7/3066* (2013.01); *H03M 7/3077* (2013.01)

(58) Field of Classification Search
CPC .... H03M 7/3066; H03M 7/3077; G06N 3/08; G06N 3/063
See application file for complete search history.

(56) References Cited

U.S. PATENT DOCUMENTS

| | | | | |
|---|---|---|---|---|
| 5,519,802 A | * | 5/1996 | Field | ............... G02F 1/3775 |
| | | | | 359/241 |
| 10,079,178 B1 | | 9/2018 | Chen et al. | |

(Continued)

FOREIGN PATENT DOCUMENTS

WO 2010142987 A1 12/2010

OTHER PUBLICATIONS

Ba, Jimmy, et al., Adaptive dropout for training deep neural networks, Advances in neural information processing systems, 26, 2013, pp. 30843092.

(Continued)

*Primary Examiner* — Lam T Mai
(74) *Attorney, Agent, or Firm* — Flagship Patents; Sikander Khan; Bruce Young

(57) ABSTRACT

A method for selectively dropping out feature elements from a tensor in a neural network is disclosed. The method includes receiving a first tensor from a first layer of a neural network. The first tensor includes multiple feature elements arranged in a first order. A compressed mask for the first tensor is obtained. The compressed mask includes single-bit mask elements respectively corresponding to the multiple feature elements of the first tensor and has a second order that is different than the first order of their corresponding feature elements in the first tensor. Feature elements from the first tensor are selectively dropped out based on the compressed mask to form a second tensor which is propagated to a second layer of the neural network.

20 Claims, 26 Drawing Sheets

(56) References Cited

U.S. PATENT DOCUMENTS

| | | | |
|---|---|---|---|
| 10,594,338 B1* | 3/2020 | Lew | H04N 19/91 |
| 11,204,889 B1* | 12/2021 | Prabhakar | G06F 17/16 |
| 11,237,971 B1* | 2/2022 | Brown | G06F 15/7892 |
| 11,256,987 B1* | 2/2022 | Terakanambi Sheshadri | G06N 3/082 |
| 11,328,209 B1* | 5/2022 | Terakanambi Sheshadri | G06N 3/063 |
| 11,366,783 B1* | 6/2022 | Prabhakar | G06F 15/7885 |
| 2014/0040604 A1 | 2/2014 | Ould-Ahmed-Vall et al. | |
| 2014/0247654 A1 | 9/2014 | Rigano et al. | |
| 2015/0006858 A1 | 1/2015 | Toll et al. | |
| 2015/0286482 A1 | 10/2015 | Espasa et al. | |
| 2016/0246723 A1 | 8/2016 | Doshi et al. | |
| 2017/0017487 A1 | 1/2017 | Plotnikov | |
| 2017/0062715 A1* | 3/2017 | Rigano | H01L 45/12 |
| 2017/0090921 A1 | 3/2017 | Hughes et al. | |
| 2017/0286109 A1 | 10/2017 | Jha | |
| 2017/0293659 A1* | 10/2017 | Huang | H03M 7/3066 |
| 2017/0351012 A1 | 12/2017 | Shishkin et al. | |
| 2018/0081685 A1 | 3/2018 | Bhuiyan et al. | |
| 2018/0123039 A1* | 5/2018 | Rigano | H01L 45/128 |
| 2018/0180890 A1 | 6/2018 | Baerenrodt et al. | |
| 2018/0300606 A1* | 10/2018 | Corkery | G06F 1/3275 |
| 2019/0049307 A1 | 2/2019 | Finn et al. | |
| 2019/0074406 A1 | 3/2019 | Kim et al. | |
| 2019/0081637 A1 | 3/2019 | Pool | |
| 2019/0258008 A1 | 8/2019 | Hautala et al. | |
| 2019/0275824 A1 | 9/2019 | Lister | |
| 2019/0278828 A1* | 9/2019 | Park | G06N 3/084 |
| 2019/0369992 A1 | 12/2019 | Plotnikov | |
| 2020/0311539 A1 | 10/2020 | Cho et al. | |
| 2020/0336155 A1* | 10/2020 | Ovsiannikov | G06F 9/30145 |
| 2020/0336273 A1 | 10/2020 | Ovsiannikov et al. | |
| 2020/0356523 A1 | 11/2020 | Prabhakar et al. | |
| 2021/0011770 A1 | 1/2021 | Prabhakar et al. | |
| 2021/0049795 A1 | 2/2021 | Cao | |
| 2021/0218949 A1 | 7/2021 | He et al. | |
| 2021/0312278 A1* | 10/2021 | Kwon | G06N 3/0454 |
| 2021/0383151 A1* | 12/2021 | Germain | G06N 20/20 |
| 2022/0147328 A1* | 5/2022 | Brown | G06F 15/7892 |
| 2022/0164663 A1* | 5/2022 | Liu | G06F 7/523 |

OTHER PUBLICATIONS

Vigneshwaran, S., et al., Bit-Mask Based Compression of FPGA Bitstreams, International Journal of Soft Computing and Engineering (IJSCE), vol. 3 Issue 1, Mar. 2013, pp. 137-141.

Zunino, Andrea, et al., Excitation dropout: Encouraging plasticity in deep neural networks, International Journal of Computer Vision, 129.4 , 2021, pp. 1139-1152.

Prabhakar, Raghu, et al., Plasticine: a reconfigurable architecture for parallel patterns, 2017 ACM/IEEE 44th Annual International Symposium on Computer Architecture (ISCA). IEEE, 2017, 14 pgs.

Olukotun, Kunle. Plasticine—A Universal Data Analytics Accelerator. Leland Stanford Junior University Stanford United States, 2020.

Gondimalla, Ashish, et al., SparTen: a sparse tensor accelerator for convolutional neural networks, Proceedings of the 52nd Annual IEEE/ACM International Symposium on Microarchitecture, Oct. 2019, pp. 151-165.

U.S. Appl. No. 17/337,080—Non Final Office Action dated Oct. 4, 2021, 35 pgs.

Koeplinger et al., "Spatial: a Language and Compiler for Application Accelerators," Proceedings of the 39th ACM SIGPLAN Conference on Programming Language Design and Implementation (PLDI), Proceedings of the 43rd International Symposium on Computer Architecture, 2018, 16 pgs.

Podobas et al, a Survey on Coarse-Grained Reconfigurable Architectures From a Performance Perspective, IEEEAccess, vol. 2020. 3012084, Jul. 27, 2020, 25 pages.

M. Emani et al., "Accelerating Scientific Applications With SambaNova Reconfigurable Dataflow Architecture," in Computing in Science & Engineering, vol. 23, No. 2, pp. 114-119, Mar. 1-Apr. 2021, doi: 10.1109/MCSE.2021.3057203.

U.S. Appl. No. 17/337,080 Notice of Allowance, dated Feb. 3, 2022, 8 pages.

* cited by examiner

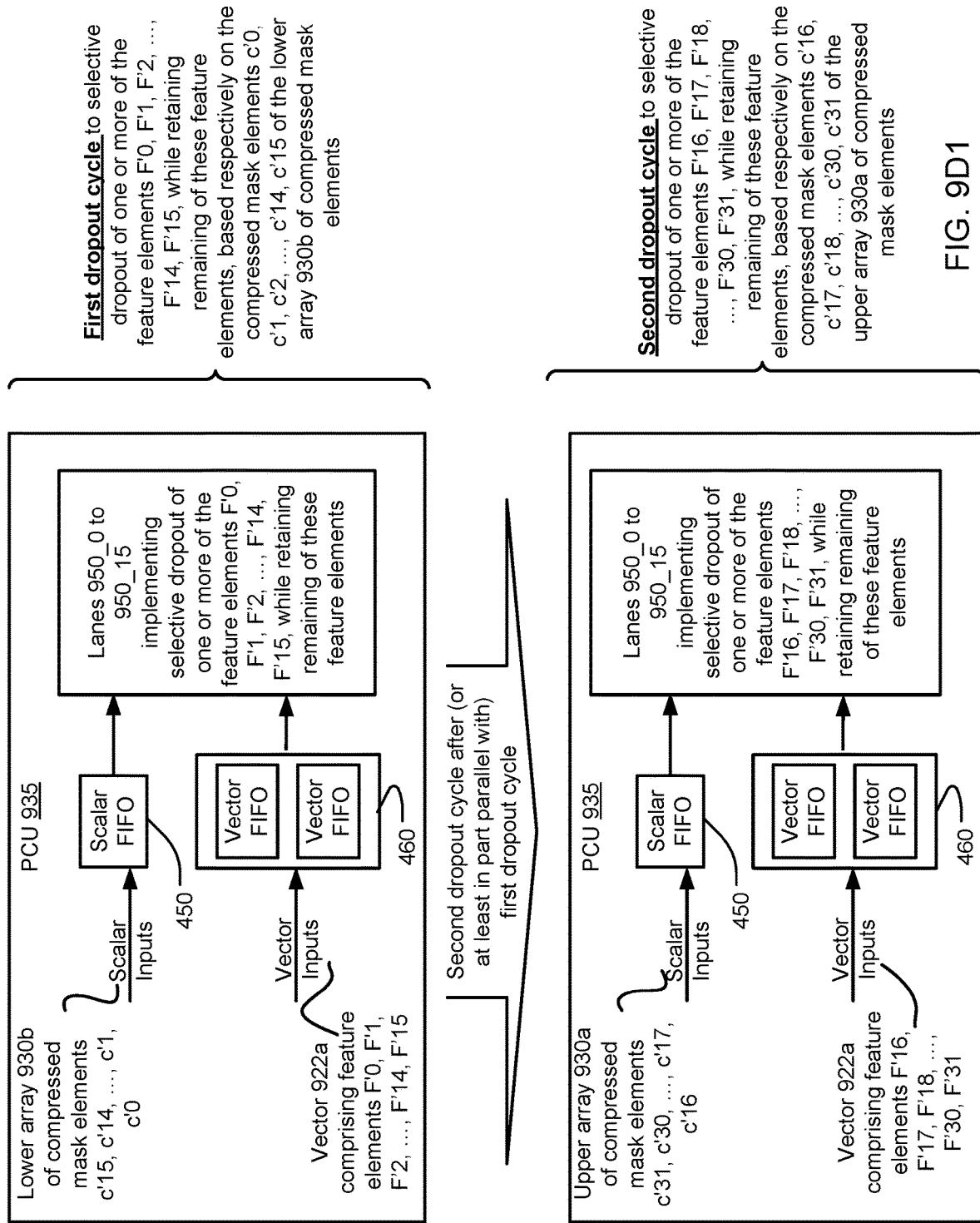

TENSOR DROPOUT USING A MASK HAVING A DIFFERENT ORDERING THAN THE TENSOR

CROSS REFERENCE TO RELATED APPLICATIONS

This application is a Continuation of U.S. patent application Ser. No. 17/337,126, now U.S. Pat. No. 11,256,987 B1, entitled "Memory Efficient Dropout, with Reordering of Dropout Mask Elements," filed on Jun. 2, 2021 which is hereby incorporated by reference in its entirety herein for any and all purposes.

FIELD OF THE TECHNOLOGY DISCLOSED

The present technology relates to computer architectures, and can be particularly applied to dropout implementations in machine learning and artificial intelligence applications.

INCORPORATIONS

The following are incorporated by reference for all purposes as if fully set forth herein:

Prabhakar et al., "Plasticine: A Reconfigurable Architecture for Parallel Patterns," ISCA '17, Jun. 24-28, 2017, Toronto, ON, Canada;

Koeplinger et al., "Spatial: A Language And Compiler For Application Accelerators," *Proceedings Of The 39th ACM SIGPLAN Conference On Programming Language Design And Implementation* (PLDI), Proceedings of the 43rd International Symposium on Computer Architecture, 2018;

U.S. Non-provisional patent application Ser. No. 16/239, 252, filed Jan. 3, 2019, entitled, "VIRTUALIZATION OF A RECONFIGURABLE DATA PROCESSOR,";

U.S. Non-provisional patent application Ser. No. 16/197, 826, filed Nov. 21, 2018, entitled, "CONFIGURATION LOAD OF A RECONFIGURABLE DATA PROCESSOR,";

U.S. Non-provisional patent application Ser. No. 16/198, 086, filed Nov. 21, 2018, entitled, "CONFIGURATION UNLOAD OF A RECONFIGURABLE DATA PROCESSOR,";

U.S. Non-provisional patent application Ser. No. 16/260, 548, filed Jan. 29, 2019, entitled, "MATRIX NORMAL/TRANSPOSE READ AND A RECONFIGURABLE DATA PROCESSOR INCLUDING SAME,";

U.S. Non-provisional patent application Ser. No. 16/536, 192, filed Aug. 8, 2019, entitled, "COMPILER FLOW LOGIC FOR RECONFIGURABLE ARCHITECTURES,"

U.S. Non-provisional patent application Ser. No. 16/407, 675, filed May 9, 2019, entitled, "CONTROL FLOW BARRIER AND RECONFIGURABLE DATA PROCESSOR,"

U.S. Non-provisional patent application Ser. No. 16/504, 627, filed Jul. 8, 2019, entitled, "QUIESCE RECONFIGURABLE DATA PROCESSOR,"

U.S. Non-provisional patent application Ser. No. 16/572, 516, filed Sep. 16, 2019, entitled, "EFFICIENT EXECUTION OF OPERATION UNIT GRAPHS ON RECONFIGURABLE ARCHITECTURES BASED ON USER SPECIFICATION,"

U.S. Non-provisional patent application Ser. No. 16/744, 077, filed Jan. 15, 2020, entitled, "COMPUTATIONALLY EFFICIENT SOFTMAX LOSS GRADIENT BACKPROPAGATION,"

U.S. Non-provisional patent application Ser. No. 16/590, 058, filed Oct. 1, 2019, entitled, "COMPUTATION UNITS FOR FUNCTIONS BASED ON LOOKUP TABLES,"

U.S. Non-provisional patent application Ser. No. 16/695, 138, filed Nov. 25, 2019, entitled, "COMPUTATIONAL UNITS FOR BATCH NORMALIZATION,"

U.S. Non-provisional patent application Ser. No. 16/688, 069, filed Nov. 19, 2019, entitled, "LOOK-UP TABLE WITH INPUT OFFSETTING,"

U.S. Non-provisional patent application Ser. No. 16/718, 094, filed Dec. 17, 2019, entitled, "COMPUTATIONAL UNITS FOR ELEMENT APPROXIMATION,"

U.S. Non-provisional patent application Ser. No. 16/560, 057, filed Sep. 4, 2019, entitled, "SIGMOID FUNCTION IN HARDWARE AND A RECONFIGURABLE DATA PROCESSOR INCLUDING SAME,"

U.S. Non-provisional patent application Ser. No. 16/572, 527, filed Sep. 16, 2019, entitled, "PERFORMANCE ESTIMATION-BASED RESOURCE ALLOCATION FOR RECONFIGURABLE ARCHITECTURES,"

U.S. Non-provisional patent application Ser. No. 15/930, 381, filed May 12, 2020, entitled, "COMPUTATIONALLY EFFICIENT GENERAL MATRIX-MATRIX MULTIPLICATION (GeMM),"

U.S. Non-provisional patent application Ser. No. 16/890, 841, filed Jun. 2, 2020, entitled, "ANTI-CONGESTION FLOW CONTROL FOR RECONFIGURABLE PROCESSORS,"

U.S. Non-provisional patent application Ser. No. 16/922, 975, filed Jul. 7, 2020, entitled, "RUNTIME VIRTUALIZATION OF RECONFIGURABLE DATA FLOW RESOURCES,"

U.S. Non-provisional patent application Ser. No. 16/996, 666, filed Aug. 18, 2020, entitled, "RUNTIME PATCHING OF CONFIGURATION FILES,"

US Non-provisional patent application Ser. No. 17/023, 15, filed Sep. 16, 2020, "COMPILE TIME LOGIC FOR DETECTING STREAMING COMPATIBLE AND BROADCAST COMPATIBLE DATA ACCESS PATTERNS"; and U.S. Non-provisional patent application Ser. No. 17/031, 679, filed Sep. 24, 2020, "SYSTEMS AND METHODS FOR MEMORY LAYOUT DETERMINATION AND CONFLICT RESOLUTION".

BACKGROUND

Reconfigurable processors can be configured to implement a variety of functions more efficiently or faster than might be achieved using a general purpose processor executing a computer program. So called coarse-grain reconfigurable architectures (e.g. CGRAs) are being developed in which the configurable units in the array are more complex than used in typical, more fine-grained field programmable gate arrays (FPGAs), and may enable faster or more efficient execution of various classes of functions. For example, CGRAs have been proposed that can enable implementation of energy-efficient accelerators for machine learning and artificial intelligence workloads. See, Prabhakar, et al., "Plasticine: A Reconfigurable Architecture for Parallel Patterns," ISCA '17, Jun. 24-28, 2017, Toronto, ON, Canada.

In machine learning problems, regularization is the process of adding information in order to prevent overfitting. A reconfigurable architecture system that implements a neural network topology often employs one or more regularization techniques. Dropout is a popular regularization technique used in neural network models, to prevent overfitting of data. Dropout can be implemented using dropout mask elements. It may be desirable to efficiently generate and/or efficiently store the mask elements used for dropout.

BRIEF DESCRIPTION OF THE DRAWINGS

FIG. 9D1 illustrates a computing unit configured to implement a first dropout cycle and a second dropout cycle on the tensor output by the layer of FIG. 9A.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
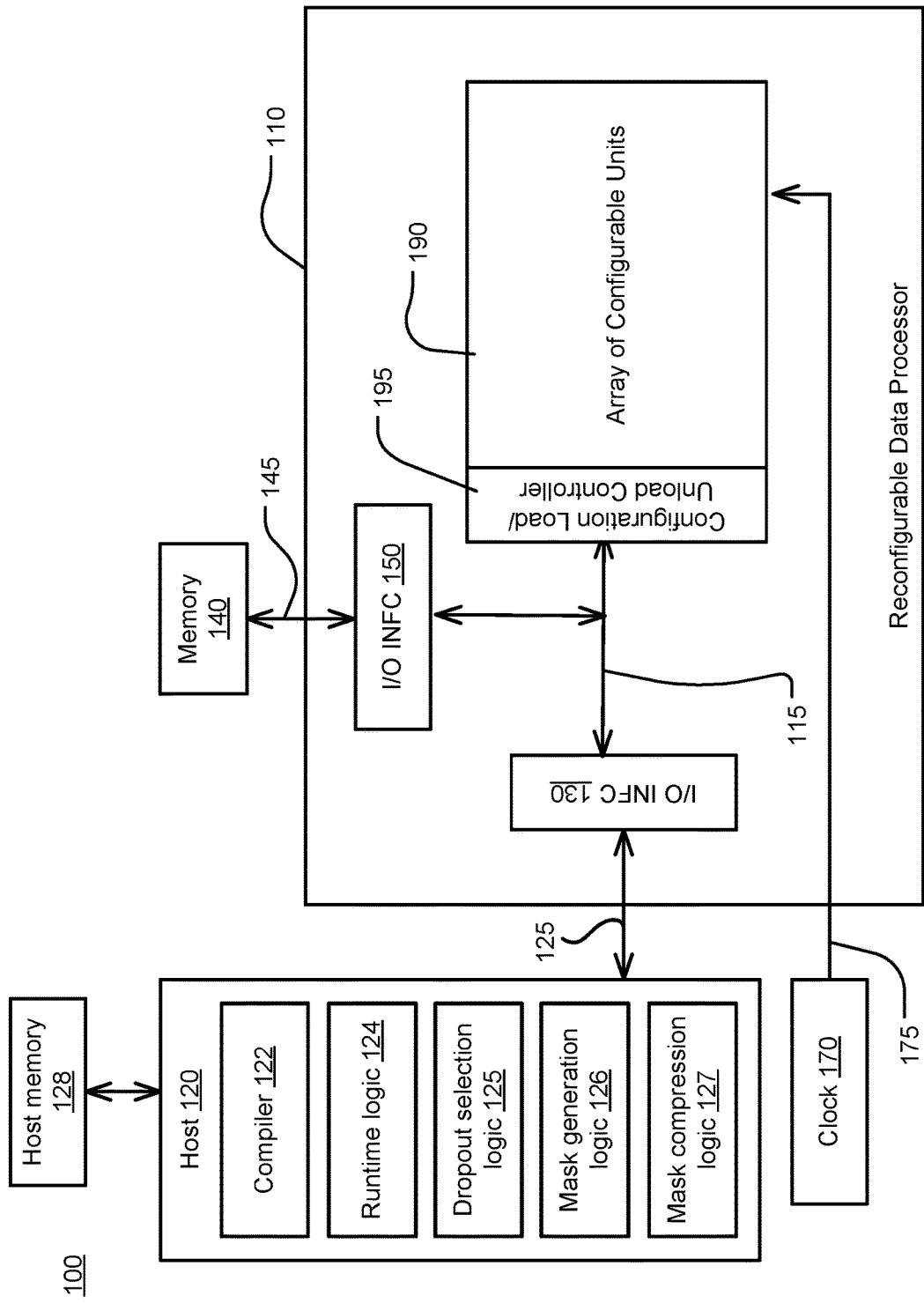
FIG. 1 is a system diagram illustrating a system including a host, a memory, and a reconfigurable data processor.

FIG. 1 is a system diagram illustrating a system including a host 120, a memory 140, and a reconfigurable data processor 110. In an example, the host 120, unlike the reconfigurable data processor 110, cannot be reconfigured based on the application program being executed on the host 120. Accordingly, the host 120 is also referred to as non-reconfigurable general-purpose hardware, or simply as general hardware. Thus, the term "general hardware" implies that such hardware resources are not configurable to suit the needs of a program being executed thereon.

In contrast, the reconfigurable data processor 110 and one or more reconfigurable components therewithin (e.g., an array 190 of configurable units) are referred to as "reconfigurable hardware", as the reconfigurable data processor 110 and the one or more components therewithin are configurable and reconfigurable to suit the needs of a program being executed thereon, as will be discussed herein in further detail in turn.

As shown in the example of FIG. 1, the host 120 executes a compiler 122 to compile applications, and a runtime logic 124 to execute the compiled applications on the reconfigurable data processor 110. For example, the compiler 122 compiles a high-level application and generates one or more corresponding execution files, where the execution files include configuration files or bit files (the terms configuration file and bit file are used interchangeably here). The runtime logic 124 is configured to load and execute the one or more configuration files on the reconfigurable data processor 110. The reconfigurable data processor 110 is configured to process the configuration files and generate corresponding outputs.

As shown in the example of FIG. 1, the reconfigurable data processor 110 includes the array 190 of configurable units and a configuration load/unload controller 195. The phrase "configuration load/unload controller", as used herein, refers to a combination of a configuration load controller and a configuration unload controller. The configuration load controller and the configuration unload controller may be implemented using separate logic and data path resources, or may be implemented using shared logic and data path resources as suits a particular embodiment. In some embodiments, a system may include only a configuration load controller of the types described herein. In some embodiments, a system may include only a configuration unload controller of the types described herein.

The processor 110 includes an external I/O interface 130 connected to the host 120, and an external I/O interface 150 connected to the memory 140. The I/O interfaces 130, 150 connect via a bus system 115 to the array 190 of configurable units and to the configuration load/unload controller 195. The bus system 115 may have a bus width capable of carrying one chunk of data, which for this example can be 128 bits (references to 128 bits throughout can be considered as an example chunk size more generally). In general, a chunk of the configuration file can have a number N of bits of data, and the bus system can be configured to transfer N bits of data in one bus cycle, where N is any practical bus width. A sub-file distributed in the distribution sequence can consist of one chunk, or other amounts of data as suits a particular embodiment. Procedures are described herein using sub-files consisting of one chunk of data each. Of course, the technology can be configured to distribute sub-files of different sizes, including sub-files that may consist of two chunks distributed in two bus cycles for example.

To configure configurable units in the array 190 of configurable units with a configuration file, the host 120 can send the configuration file to the memory 140 via the interface 130, the bus system 115, and the interface 150 in the reconfigurable data processor 110. The configuration file can be loaded in many ways, as suits a particular architecture, including in data paths outside the configurable processor 110. The configuration file can be retrieved from the memory 140 via the memory interface 150. Chunks of the configuration file can then be sent in a distribution sequence as described herein to configurable units in the array 190 of configurable units in the reconfigurable data processor 110.

The host 120 also executes a dropout selection logic 125, a mask generation logic 126, and a mask compression logic 127, each of which will be discussed herein in further detail in turn.

In an example, the memory 140 is within a chip that is different from a chip comprising the reconfigurable data processor 110, and hence, the memory 140 is referred to herein as an off-chip memory. Similarly, the memory 128 is within a chip that is different from a chip comprising the reconfigurable data processor 110, and hence, the memory 128 is also referred to herein as an off-chip memory. Thus, off-chip memory refers to the memory 140 and/or the memory 128, in some examples. In contrast, the reconfigurable array of units 190 comprises configurable memory units (such as PMUs illustrated in FIGS. 3 and 5), which are referred to herein as on-chip memory.

An external clock generator 170 or other clock signal sources can provide a clock signal 175 or clock signals to elements in the reconfigurable data processor 110, including the array 190 of configurable units, and the bus system 115, and the external data I/O interfaces.

Figure 2:
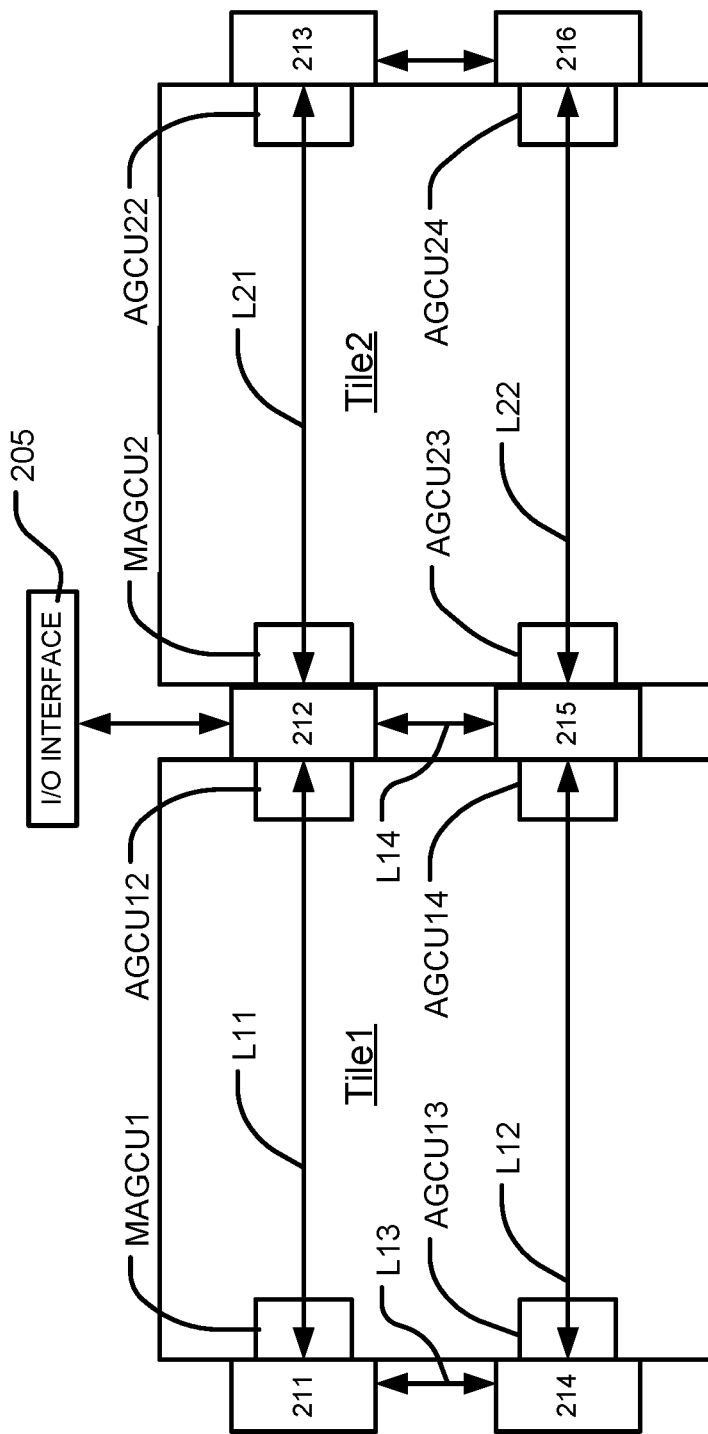
FIG. 2 is a simplified block diagram of a top-level network and components of a CGRA (Coarse Grain Reconfigurable Architecture).

FIG. 2 is a simplified block diagram of components of a CGRA (Coarse Grain Reconfigurable Architecture) processor. In this example, the CGRA processor has 2 tiles (Tile1, Tile2). The tile comprises an array of configurable units connected to a bus system, including an array-level network in this example. The bus system includes a top-level network connecting the tiles to the external I/O interface 205 (or any number of interfaces). In other embodiments, different bus system configurations may be utilized. The configurable units in each tile are nodes on the array level network in this embodiment.

Each of the two tiles has 4 AGCUs (Address Generation and Coalescing Units) (e.g. MAGCU1, AGCU12, AGCU13, AGCU14). The AGCUs are nodes on the top-level network and nodes on the array-level networks, and include resources for routing data among nodes on the top-level network and nodes on the array-level network in each tile.

Nodes on the top-level network in this example include one or more external I/O, including the interface 205. The interfaces to external devices include resources for routing data among nodes on the top-level network and external devices, such as high-capacity memory, host processors, other CGRA processors, FPGA devices and so on, that are connected to the interfaces.

One of the AGCUs in a tile is configured in this example to be a master AGCU (M AGCU), which includes an array configuration load/unload controller for the tile. In other embodiments, more than one array configuration load/unload controller can be implemented and one array configuration load/unload controller may be implemented by logic distributed among more than one AGCU.

The MAGCU1 includes a configuration load/unload controller for Tile1, and the MAGCU2 includes a configuration load/unload controller for Tile2. In other embodiments, a configuration load/unload controller can be designed for loading and unloading the configuration of more than one tile. In other embodiments, more than one configuration controller can be designed for the configuration of a single tile. Also, the configuration load/unload controller can be implemented in other portions of the system, including as a stand-alone node on the top-level network and the array-level network or networks.

The top-level network is constructed using top-level switches (211-216) connecting to each other as well as to other nodes on the top-level network, including the AGCUs, and the I/O interface 205. The top-level network includes links (e.g., L11, L12, L21, L22) connecting the top-level switches. Data travel in packets between the top-level switches on the links, and from the switches to the nodes on the network connected to the switches. For example, top-level switches 211 and 212 are connected by a link L11, top level switches 214 and 215 are connected by a link L12, top level switches 211 and 214 are connected by a link L13, and top-level switches 212 and 213 are connected by a link L21. The links can include one or more buses and supporting control lines, including for example a chunk-wide bus (vector bus). For example, the top-level network can include data, request and response channels operable in coordination for the transfer of data in a manner analogous to an AXI compatible protocol. See, AMBA® AXI and ACE Protocol Specification, ARM, 2017.

Top-level switches can be connected to AGCUs. For example, top-level switches 211, 212, 214 and 215 are connected to MAGCU1, AGCU12, AGC U13 and AGCU14 in the tile Tile1, respectively. Top-level switches 212, 213, 215 and 216 are connected to MAGCU2, AGCU22, AGCU23 and AGCU24 in the tile Tile2, respectively.

Top-level switches can be connected to one or more external I/O interfaces (e.g., interface 205).

Figure 3A:
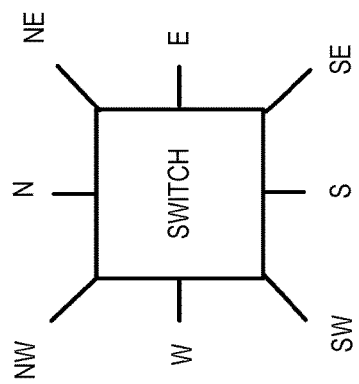
FIG. 3A illustrates an example switch unit connecting elements in an array level network.
Figure 3:
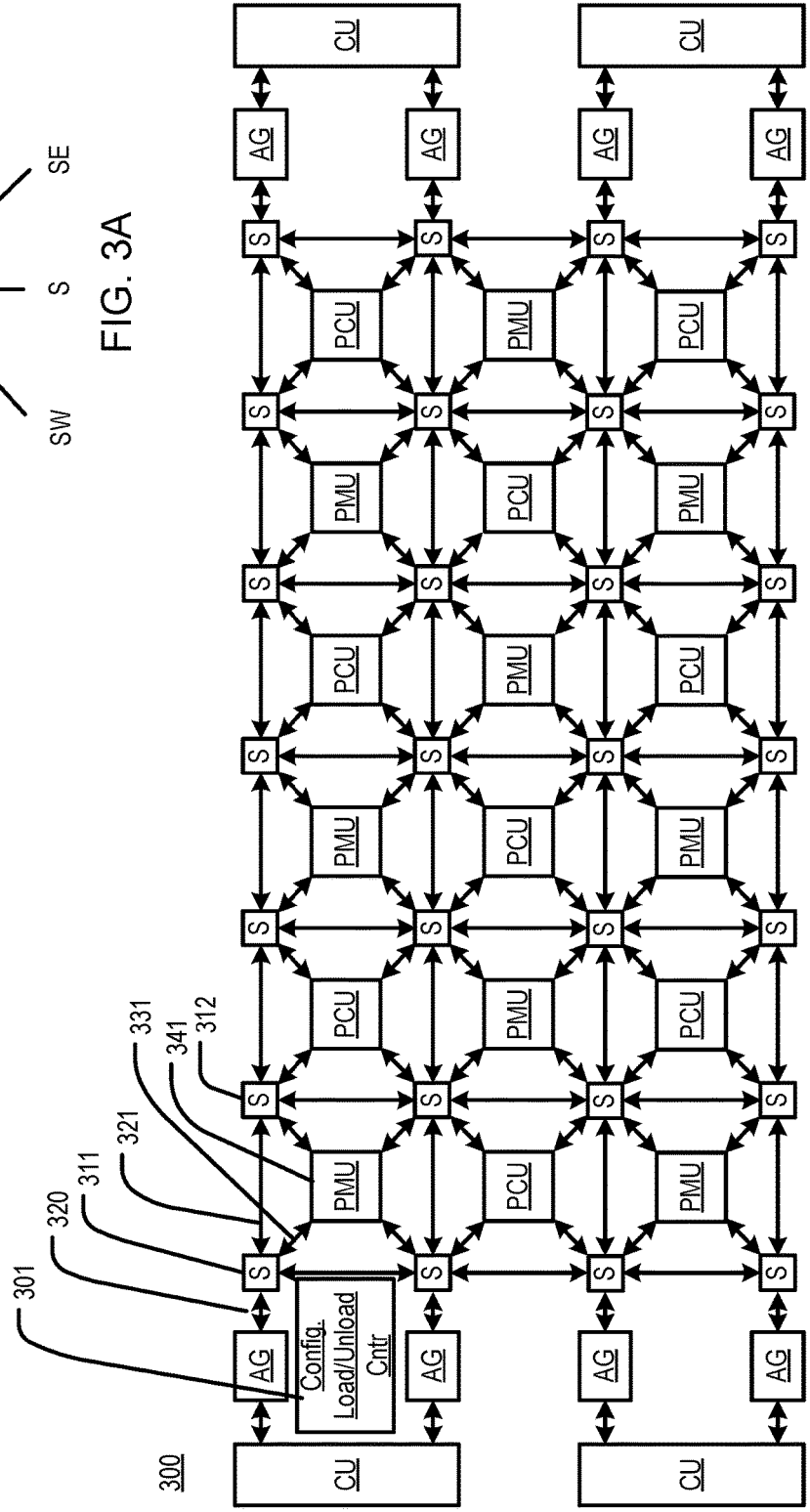
FIG. 3 is a simplified diagram of a tile and an array level network usable in the configuration of FIG. 2, where the configurable units in the array are nodes on the array level network.

FIG. 3 is a simplified diagram of a tile and an array-level network usable in the configuration of FIG. 2, where the configurable units in the array are nodes on the array-level network.

In this example, the array of configurable units 300 includes a plurality of types of configurable units. The types of configurable units in this example include Pattern Compute Units (PCU), Pattern Memory Units (PMU), switch units (S), and Address Generation and Coalescing Units (each including two address generators AG and a shared CU). For an example of the functions of these types of configurable units, see, Prabhakar et al., "Plasticine: A Reconfigurable Architecture For Parallel Patterns", ISCA '17, Jun. 24-28, 2017, Toronto, ON, Canada, which is incorporated by reference as if fully set forth herein. Each of these configurable units contains a configuration store comprising a set of registers or flip-flops that represent either the setup or the sequence to run a program, and can include the number of nested loops, the limits of each loop iterator, the instructions to be executed for each stage, the source of the operands, and the network parameters for the input and output interfaces.

Additionally, each of these configurable units contains a configuration store comprising a set of registers or flip-flops that store a status usable to track progress in nested loops or otherwise. A configuration file contains a bit-stream representing the initial configuration, or starting state, of each of the components that execute the program. This bit-stream is referred to as a bit-file. Program load is the process of setting up the configuration stores in the array of configurable units based on the contents of the bit file to allow all the components to execute a program (i.e., a machine). Program Load may also require the load of all PMU memories.

The array-level network includes links interconnecting configurable units in the array. The links in the array-level network include one or more, and in this case three, kinds of physical buses: a chunk-level vector bus (e.g., 128 bits of data), a word-level scalar bus (e.g., 32 bits of data), and a multiple bit-level control bus. For instance, the interconnect 321 between switch units 311 and 312 includes a vector bus interconnect with a vector bus width of 128 bits, a scalar bus interconnect with a scalar bus width of 32 bits, and a control bus interconnect.

The three kinds of physical buses differ in the granularity of data being transferred. In one embodiment, the vector bus can carry a chunk that includes 16-Bytes (=128 bits) of data as its payload. The scalar bus can have a 32-bit payload, and carry scalar operands or control information. The control bus can carry control handshakes such as tokens and other signals. The vector and scalar buses can be packet switched, including headers that indicate the destination of each packet and other information such as sequence numbers that can be used to reassemble a file when the packets are received out of order. Each packet header can contain a destination identifier that identifies the geographical coordinates of the destination switch unit (e.g. the row and column in the array), and an interface identifier that identifies the interface on the destination switch (e.g. North, South, East, West, etc.) used to reach the destination unit. The control network can be circuit switched based on timing circuits in the device, for example. The configuration load/unload controller can generate a header for each chunk of configuration data of 128 bits. The header is transmitted on a header bus to each configurable unit in the array of configurable units.

For a load operation, the configuration load controller can send the number N of chunks to a configurable unit in order from N−1 to 0. For this example, the 6 chunks are sent out in the most significant bit first order of Chunk 5→Chunk 4→Chunk 3→Chunk 2→Chunk 1→Chunk 0. (Note that this most significant bit first order results in Chunk 5 being distributed in round 0 of the distribution sequence from the array configuration load controller.) For an unload operation, the configuration unload controller can write out the unload data of the order to the memory. For both load and unload operations, the shifting in the configuration serial chains in a configuration data store in a configurable unit is from LSB (least-significant-bit) to MSB (most-significant-bit), or MSB out first.

FIG. 3A illustrates an example switch unit connecting elements in an array-level network. As shown in the example of FIG. 3A, a switch unit can have 8 interfaces. The North, South, East and West interfaces of a switch unit are used for connections between switch units. The Northeast, Southeast, Northwest and Southwest interfaces of a switch unit are each used to make connections to PCU or PMU instances.

In an example, the switch unit is configurable. For example, when a first configuration file is being executed, the switch unit can interconnect a first PCU with a first PMU (e.g., such that the first PCU stores data in the first PMU). On the other hand, when a second configuration file is being executed, the same switch unit can interconnect the first PCU with a second PMU (e.g., such that the first PCU stores data in the second PMU).

A set of 2 switch units in each tile quadrant have connections to an Address Generation and Coalescing Unit (AGCU) that include multiple address generation (AG) units and a coalescing unit (CU) connected to the multiple address generation units. The coalescing unit (CU) arbitrates between the AGs and processes memory requests. Each of the 8 interfaces of a switch unit can include a vector interface, a scalar interface, and a control interface to communicate with the vector network, the scalar network, and the control network.

During execution of a machine after configuration, data can be sent via one or more unit switches and one or more links between the unit switches to the configurable units using the vector bus and vector interface(s) of the one or more switch units on the array-level network.

In embodiments described herein, a configuration file or bit file, before configuration of the tile, can be sent from the configuration load controller using the same vector bus, via one or more unit switches and one or more links between the unit switches to the configurable unit using the vector bus and vector interface(s) of the one or more switch units on the array-level network. For instance, a chunk of configuration data in a unit file particular to a configurable unit PMU 341 can be sent from the configuration load/unload controller 301 to the PMU 341, via a link 320 between the configuration load/unload controller 301 and the West (W) vector interface of the switch unit 311, the switch unit 311, and a link 331 between the Southeast (SE) vector interface of the switch unit 311 and the PMU 341.

Figure 4:
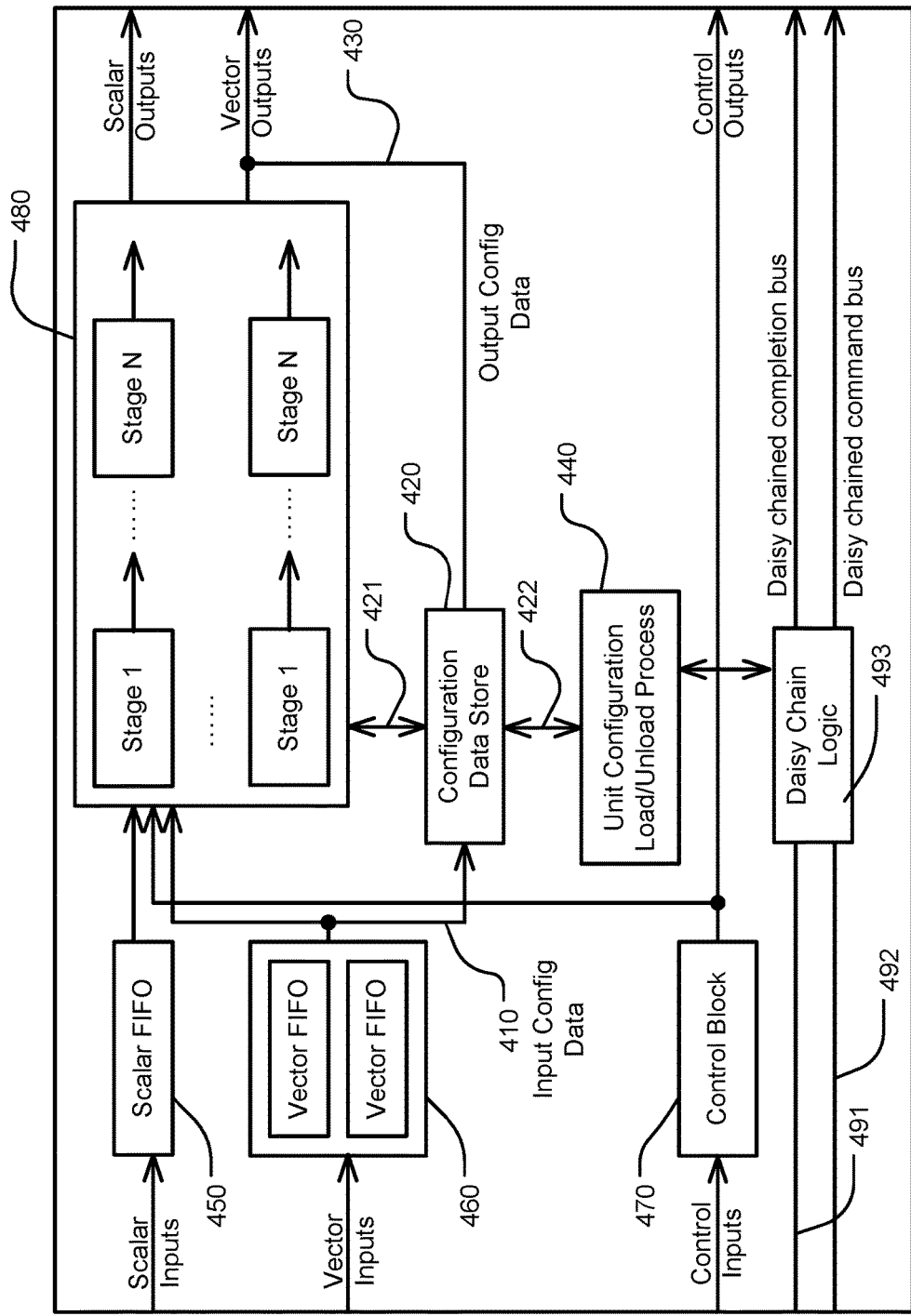
FIG. 4 is a block diagram illustrating an example configurable unit, such as a Pattern Compute Unit (PCU).

In this example, one of the AGCUs is configured to be a master AGCU, which includes a configuration load/unload controller (e.g. 301). The master AGCU implements a register through which the host (120, FIG. 1) can send commands via the bus system to the master AGCU. The master AGCU controls operations on an array of configurable units in a tile and implements a program control state machine to track the state of the tile based on the commands it receives from the host through writes to the register. For every state transition, the master AGCU issues commands to all components on the tile over a daisy chained command bus (FIG. 4). The commands include a program reset command to reset configurable units in an array of configurable units in a tile, and a program load command to load a configuration file to the configurable units.

The configuration load controller in the master AGCU is responsible for reading the configuration file from the memory and sending the configuration data to every configurable unit of the tile. The master AGCU can read the configuration file from the memory at preferably the maximum throughput of the top-level network. The data read from the memory are transmitted by the master AGCU over the vector interface on the array level network to the corresponding configurable unit according to a distribution sequence described herein.

In one embodiment, in a way that can reduce the wiring requirements within a configurable unit, configuration and status registers holding unit files to be loaded in a configuration load process, or unloaded in a configuration unload process, in a component are connected in a serial chain and can be loaded through a process of shifting bits through the serial chain. In some embodiments, there may be more than one serial chain arranged in parallel or in series. When a configurable unit receives, for example, the 128 bits of configuration data from the master AGCU in one bus cycle, the configurable unit shifts this data through its serial chain at the rate of 1 bit per cycle, where shifter cycles can run at the same rate as the bus cycle. It will take 128 shifter cycles for a configurable unit to load 128 configuration bits with the 128 bits of data received over the vector interface. The 128 bits of configuration data are referred to as a chunk. A configurable unit can require multiple chunks of data to load all its configuration bits.

The configurable units interface with the memory through multiple memory interfaces (150, FIG. 1). Each of the memory interfaces can be accessed using several AGCUs. Each AGCU contains a reconfigurable scalar datapath to generate requests for the off-chip memory. Each AGCU contains FIFOs (first-in-first-out buffers for organizing data) to buffer outgoing commands, data, and incoming responses from the off-chip memory.

The address generators AGs in the AGCUs can generate memory commands that are either dense or sparse. Dense requests can be used to bulk transfer contiguous off-chip memory regions, and can be used to read or write chunks of data from/to configurable units in the array of configurable units. Dense requests can be converted to multiple off-chip memory burst requests by the coalescing unit (CU) in the AGCUs. Sparse requests can enqueue a stream of addresses into the coalescing unit. The coalescing unit uses a coalescing cache to maintain metadata on issued off-chip memory requests and combines sparse addresses that belong to the same off-chip memory request to minimize the number of issued off-chip memory requests.

FIG. 4 is a block diagram illustrating an example configurable unit 400, such as a Pattern Compute Unit (PCU), which is configured based on configuration files corresponding to one or more applications. For example, a first configuration file corresponding to a first application can configure the PCU 400 in a first configuration when the first configuration file is being executed by the reconfigurable data processor 110, and a second configuration file corresponding to a second application can configure the PCU 400 in a second configuration when the second configuration file is being executed by the reconfigurable data processor 110, where the first and second configurations are different.

Configurable units in the array of configurable units include configuration data stores 420 (e.g., serial chains) to store unit files comprising a plurality of chunks (or sub-files of other sizes) of configuration data particular to the corresponding configurable units. Configurable units in the array of configurable units each include unit configuration load logic 440 connected to the configuration data store 420 via the line 422, to execute a unit configuration load process. The unit configuration load process includes receiving via the bus system (e.g. the vector inputs), chunks of a unit file particular to the configurable unit, and loading the received chunks into the configuration data store 420 of the configurable unit.

The configuration data stores in configurable units in the plurality of configurable units in this example comprise serial chains of latches, where the latches store bits that control the configuration of the resources in the configurable unit. A serial chain in a configuration data store can include a shift register chain for configuration data and a second shift register chain for state information and counter values connected in series.

A configurable unit can interface with the scalar, vector, and control buses using three corresponding sets of inputs and outputs (IO): scalar inputs/outputs, vector inputs/outputs, and control inputs/outputs. Scalar IOs can be used to communicate single words of data (e.g. 32 bits). Vector IOs can be used to communicate chunks of data (e.g. 128 bits), in cases such as receiving configuration data in a unit configuration load process, and transmitting and receiving data during operation after configuration across a long pipeline between multiple PCUs. Control IOs can be used to communicate control signals such as the start or end of the execution of a configurable unit. Control inputs are received by the control block 470, and control outputs are provided by the control block 470.

Each vector input is buffered using a vector FIFO in a vector FIFO block 460 which can include one or more vector FIFOs. Each scalar input is buffered using a scalar FIFO 450. Using input FIFOs decouples timing between data producers and consumers, and simplifies the inter-configurable-unit control logic by making it robust to input delay mismatches.

Input configuration data 410 can be provided to a vector FIFO as vector inputs, and then be transferred to the configuration data store 420. Output configuration data 430 can be unloaded from the configuration data store 420 using the vector outputs.

The CGRA uses a daisy-chained completion bus to indicate when a load/unload command has been completed. The master AGCU transmits the program load and unload commands to configurable units in the array of configurable units over a daisy-chained command bus. As shown in the example of FIG. 4, a daisy-chained completion bus 491 and a daisy-chained command bus 492 are connected to the daisy chain logic 493, which communicates with the unit configuration load logic 440. The daisy chain logic 493 can include the load complete status logic, as described below. The daisy-chained completion bus is further described below. Other topologies for the command and completion buses are clearly possible but not described here.

A configurable unit includes multiple reconfigurable datapaths in the block 480. A datapath in a configurable unit can be organized as a multi-stage (Stage 1 . . . Stage N), reconfigurable SIMD (Single Instruction, Multiple Data) pipeline. Physical configuration of various stages and components of the SIMD is based on the configuration files loaded in the PCU, and they are reconfigurable based on the configuration files. The chunks of data pushed into the configuration serial chain in a configurable unit include configuration data for each stage of each datapath in the configurable unit. The configuration serial chain in the configuration data store 420 is connected to the multiple datapaths in the block 480 via the lines 421.

A Pattern Memory Unit (e.g. PMU) can contain scratchpad memory coupled with a reconfigurable scalar datapath intended for address calculation, along with the bus interfaces used in the PCU. PMUs can be used to distribute on-chip memory throughout the array of reconfigurable units. In one embodiment, address calculation within the memory in the PMUs is performed on the PMU datapath, while the core computation is performed within the PCU.

Figure 5:
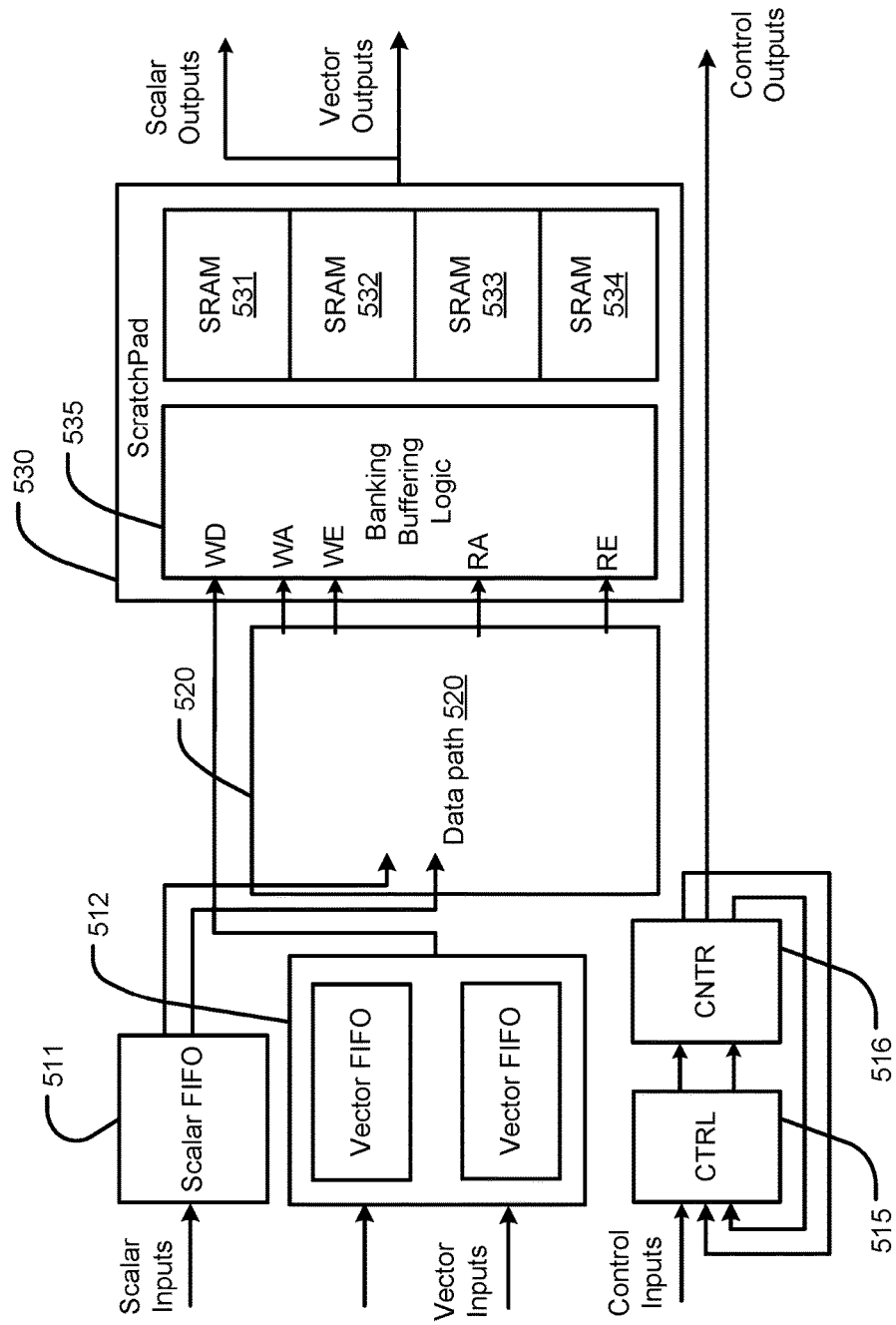
FIG. 5 is a block diagram illustrating an example configurable unit, such as a Pattern Memory Unit (PMU).

FIG. 5 is a block diagram illustrating an example configurable unit 500, such as a Pattern Memory Unit (PMU), which is configured based on configuration files corresponding to one or more applications. For example, a first configuration file corresponding to a first application can configure the PMU 500 in a first configuration when the first configuration file is being executed by the reconfigurable data processor 110, and a second configuration file corresponding to a second application can configure the PMU 500 in a second configuration when the second configuration file is being executed by the reconfigurable data processor 110, where the first and second configurations are different.

A PMU can contain scratchpad memory 530 coupled with a reconfigurable scalar data path 520 intended for address calculation (RA, WA) and control (WE, RE) of the scratchpad memory 530, along with the bus interfaces used in the PCU 400.

The bus interfaces can include scalar inputs, vector inputs, scalar outputs and vector outputs, usable to provide write data WD. The data path can be organized as a multi-stage reconfigurable pipeline, including stages of functional units FUs and associated pipeline registers PRs that register inputs and outputs of the functional units. PMUs can be used to store distributed on-chip memory throughout the array of reconfigurable units.

A scratchpad is built with multiple SRAM banks (e.g., 531, 532, 533, 534). Banking and buffering logic 535 for the SRAM banks in the scratchpad can be configured to operate in several banking modes to support various access patterns. A computation unit as described herein can include a Look-Up Table stored in the scratchpad memory 530, from a configuration file or from other sources. In a computation unit as described herein, the scalar data path 520 can translate a section of a raw input value I for addressing Look-Up Tables implementing a function f(I), into the addressing format utilized by the SRAM scratchpad memory 530, adding appropriate offsets and so on, to read the entries of the Look-Up Table stored in the scratchpad memory 530 using the sections of the input value I. Each PMU can include write address calculation logic and read address calculation logic that provide the write address WA, write enable WE, read address RA and read enable RE to the banking buffering logic 535. Based on the state of the local FIFOs 511 and 512 and external control inputs, the control block 515 can be configured to trigger the write address computation, read address computation, or both, by enabling the appropriate counters 516. A programmable counter chain 516 (Control Inputs, Control Outputs) and control block 515 can trigger PMU execution.

This is one simplified example of a configuration of a configurable processor for implementing a computation unit as described herein. The configurable processor can be configured in other ways to implement a computation unit. Other types of configurable processors can implement the computation unit in other ways. Also, the computation unit can be implemented using dedicated logic in some examples, or a combination of dedicated logic and instruction-controlled processors.

Dropout Implementation Using Mask

Figure 6A:
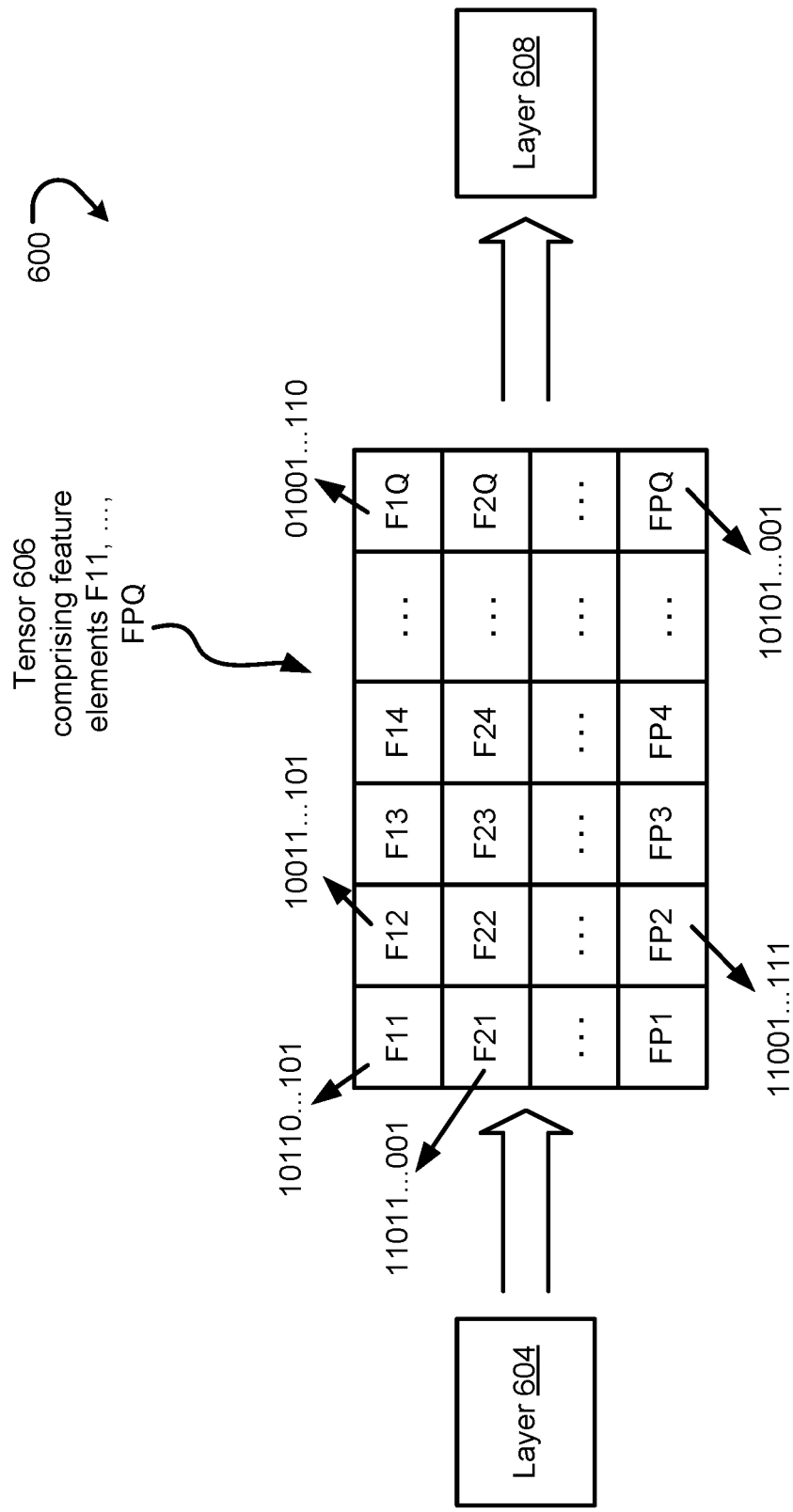
FIG. 6A illustrates a system to propagate an output tensor of a layer of a neural network to a subsequent layer of the neural network.

FIG. 6A illustrates a system 600 to propagate an output tensor 606 of a layer 604 of a neural network to a subsequent layer 608 of the neural network. Each of the layers 604, 608 implements a corresponding function. Examples of such functions include, but are not limited to, non-linearities like Rectified Linear Unit (ReLU) and its variants (e.g., leaky ReLU), convolution, transpose convolution, hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose.

In an example, the tensor 606 output by the layer 604 comprises a plurality of feature elements, such as feature elements F11, F12, . . . , FPQ. Thus, the tensor 606 is a P×Q matrix of feature elements. Although a two-dimensional matrix of feature elements is illustrated in FIG. 6A, the tensor 606 can include a one, three, or higher dimensional matrix of feature elements. Each feature element comprises multiple bits, and some example values of example feature elements are illustrated in FIG. 6A. In an example and without limiting the scope of this disclosure, individual feature elements are represented in INT16 format, and hence, each feature element Fij (i=1, . . . P, and j=1, . . . , Q) is represented using corresponding 16 binary bits, although other data representation formats can also be used.

Figure 6B:
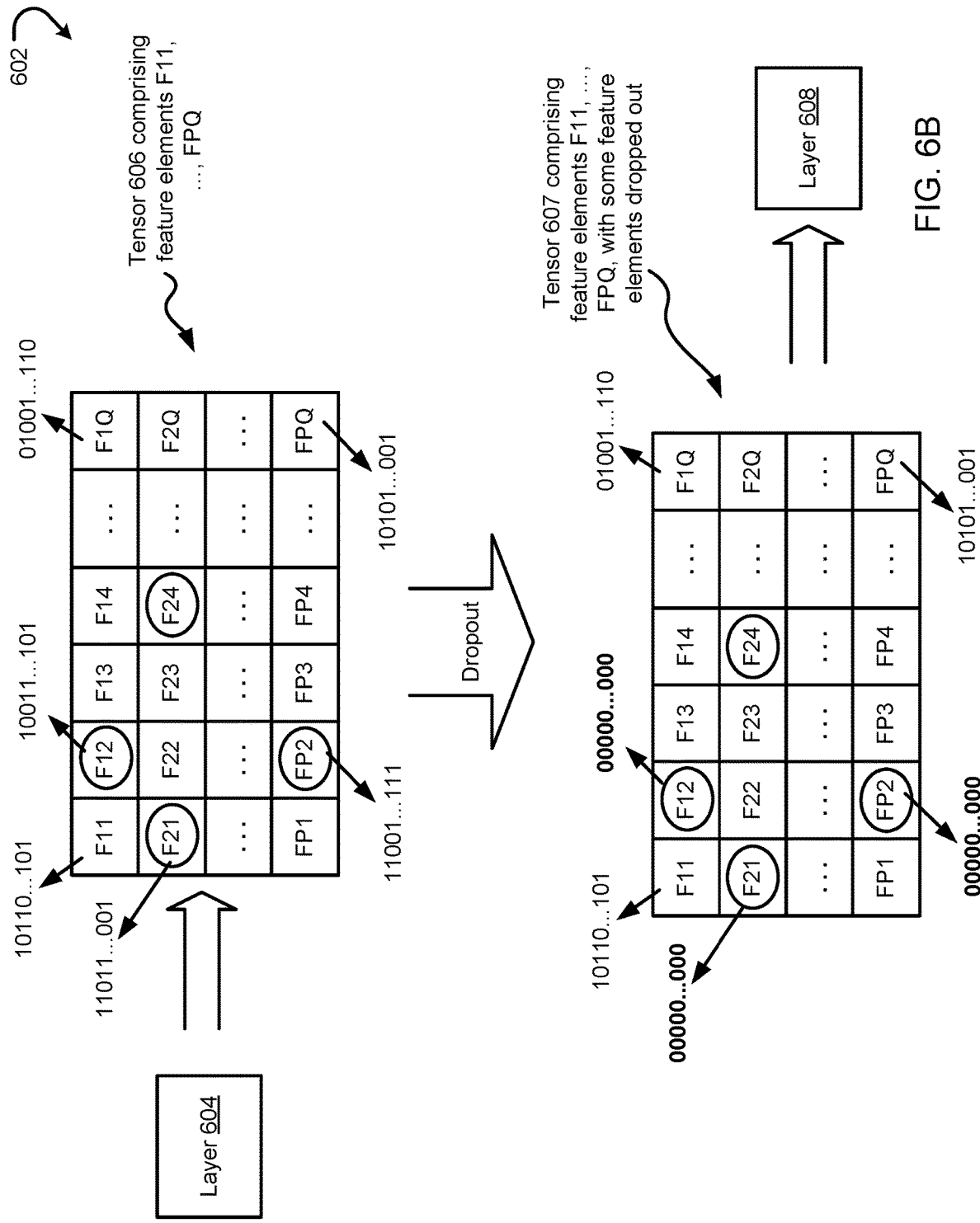
FIG. 6B illustrates a system to output a first tensor by a first layer of a neural network, to implement dropout on the first tensor output by the first layer to generate a second tensor, and propagate the second tensor to a second layer of the neural network.

In machine learning problems, regularization is the process of adding information in order to prevent overfitting. The regularization term, or penalty, imposes a cost on the optimization function for overfitting the function or to make the optimal solution unique. Regularization is widely used in the training phase of neural network models. Dropout is a popular regularization technique used in neural network models, to prevent overfitting of data. In an example, dropout is implemented per-layer in a neural network, and can be applied on one or more hidden layers and/or an input layer. FIG. 6B illustrates a system 602 to output a first tensor 606 by a first layer 604 of a neural network, to implement dropout on the first tensor 606 output by the first layer 604 to generate a second tensor 607, and propagate the second tensor 607 to a second layer 608 of the neural network. Thus, in FIG. 6B, dropout is applied to the system 600 of FIG. 6A.

As discussed with respect to FIG. 6A and as also illustrated in FIG. 6B, the layer 604 generates the tensor 606 comprising feature elements F11, FPQ. In an embodiment, the dropout is applied by randomly or pseudo-randomly selecting (or deterministically selecting) one or more feature elements of the tensor 606, and forcing the selected feature elements to zero, where selection of feature elements for dropout will be discussed herein in turn. In FIG. 6B, the feature elements selected for dropout are circled. Merely as an example, feature elements F12, F21, F24, and FP2 are selected for dropout. The tensor 607 is generated from the tensor 606, by dropping out the selected feature elements F12, F21, F24, and FP2. Thus, after the dropout, each of the selected feature elements F12, F21, F24, and FP2 in the tensor 607 are zero. The values of the remaining feature elements, which are not dropped out, remain the same in the tensors 606 and 608 (i.e., original values of the remaining feature elements from the tensor 606 are retained in the tensor 607).

In an example, individual feature elements in both tensors 606 and 607 are represented using the same data format, such as INT16 format, merely as an example. Thus, after dropout, the dimensionality of the dropped-out feature elements does not change, and each of the dropped-out feature elements also has 16 bits, with each bit being a zero, as illustrated.

Figure 6C:
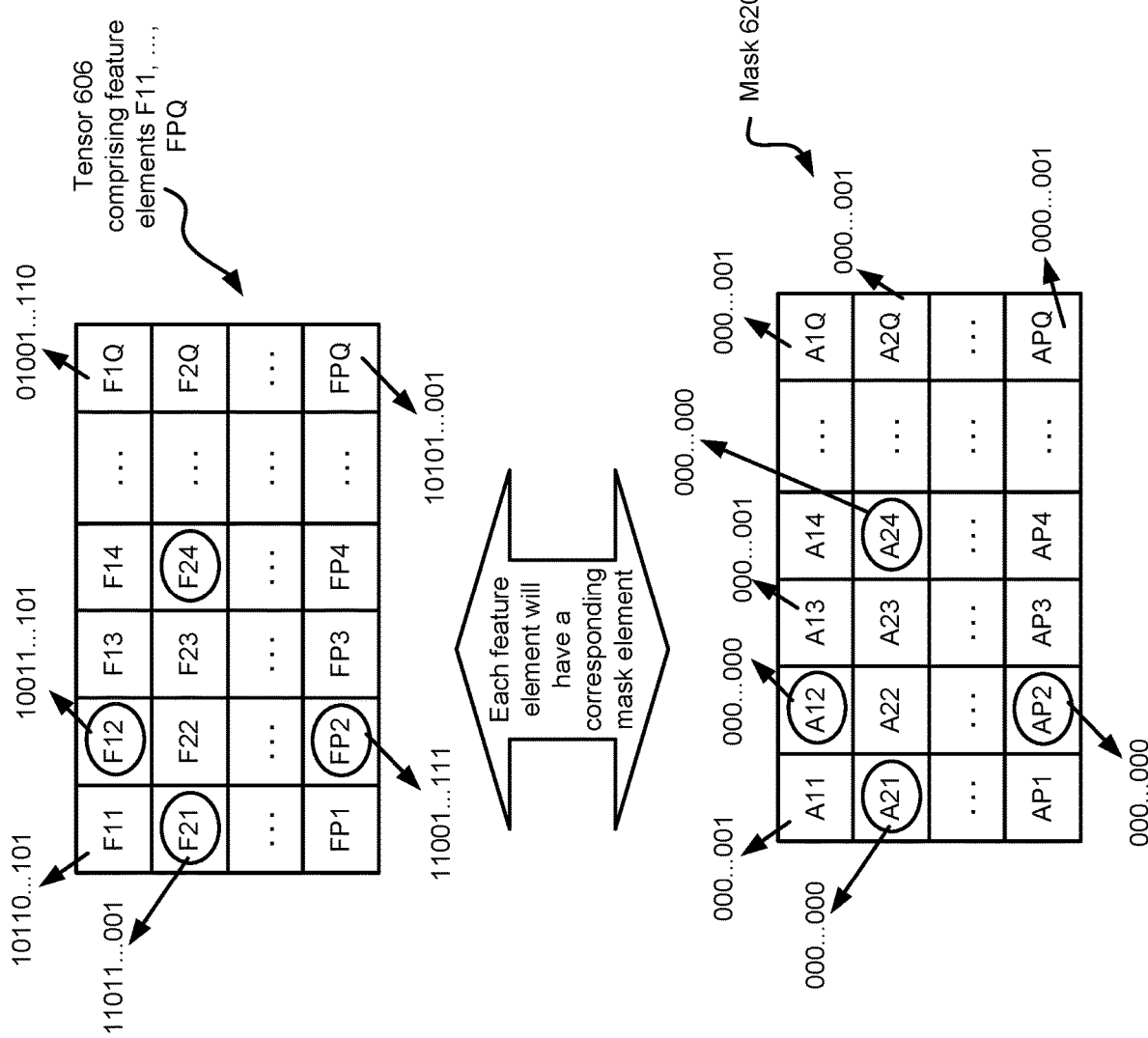
FIG. 6C illustrates a mask to be used to implement the dropout on the tensor of FIG. 6B.

In an embodiment, the dropout of various feature elements in the tensor 606 is performed by applying a mask to the tensor 606. FIG. 6C illustrates an example mask 620 to be used to implement the dropout on the tensor 606 of FIG. 6B. In an embodiment, the mask 620 comprises a plurality of mask elements A11, . . . , APQ, for implementing dropout on the tensor 606 comprising the plurality of feature elements. There is a one-to-one mapping between the mask elements Aij of the mask 620 and the feature elements Fij of the tensor 606, where i=1, . . . , P, and j=1, . . . , Q. For example, for each feature element Fij of the tensor 606, there is a corresponding mask element Aij of the mask 620.

In an embodiment, the mask elements Aij of the mask 620 and the feature elements Fij of the tensor 606 are in the same data format. Merely as an example, the mask elements Aij of the mask 620 and the feature elements Fij of the tensor 606 are in the data format INT16. Thus, in such an example, each of the mask elements Aij of the mask 620 and the feature elements Fij of the tensor 606 have 16 bits.

In an embodiment, individual mask elements Aij represent either a logical zero or a logical one using 16 corresponding bits (i.e., assuming data format INT16, for example). For example, some of the mask elements of the mask 620 have a value of 000 . . . 0001, and the remaining mask elements have a value of 000 . . . 000. Note the difference in the LSBs (Least Significant Bits) in these two values. For example, the value of each of the mask elements A12, A21, A24, and AP2 is 000 . . . 000 (i.e., LSB of 0), implying that corresponding feature elements F12, F21, F24, and FP2 from the tensor 606 are to be dropped out, as discussed with respect to FIG. 6B. The value of each of the remaining mask elements (such as mask elements A11, A13, A14, APQ) is 000 . . . 001 (i.e., LSB of 1), implying that the corresponding feature elements F11, F13, F14, FPQ from the tensor 606 are not to be dropped out, as discussed with respect to FIG. 6B. In other embodiments, other representations may be used to indicate which elements to drop out. Merely as an example, in the INT16 format, 16 consecutive '1' bits may be used for a mask element to indicate that a corresponding feature element is to be dropped out; and 16 consecutive '0' bits may be used for a mask element to indicate that a corresponding feature element is to be retained (i.e., not dropped out). Generally, any two distinct values may be used to distinguish between mask elements that indicates corresponding feature elements should be dropped out and corresponding feature elements should be retained. These mask values may be compared against their respective constants, and the results of the comparison used to convert a mask element into the compressible format, or the mask element may be directly compressed by generating a single '1' or '0' bit as appropriate.

Figure 7A:
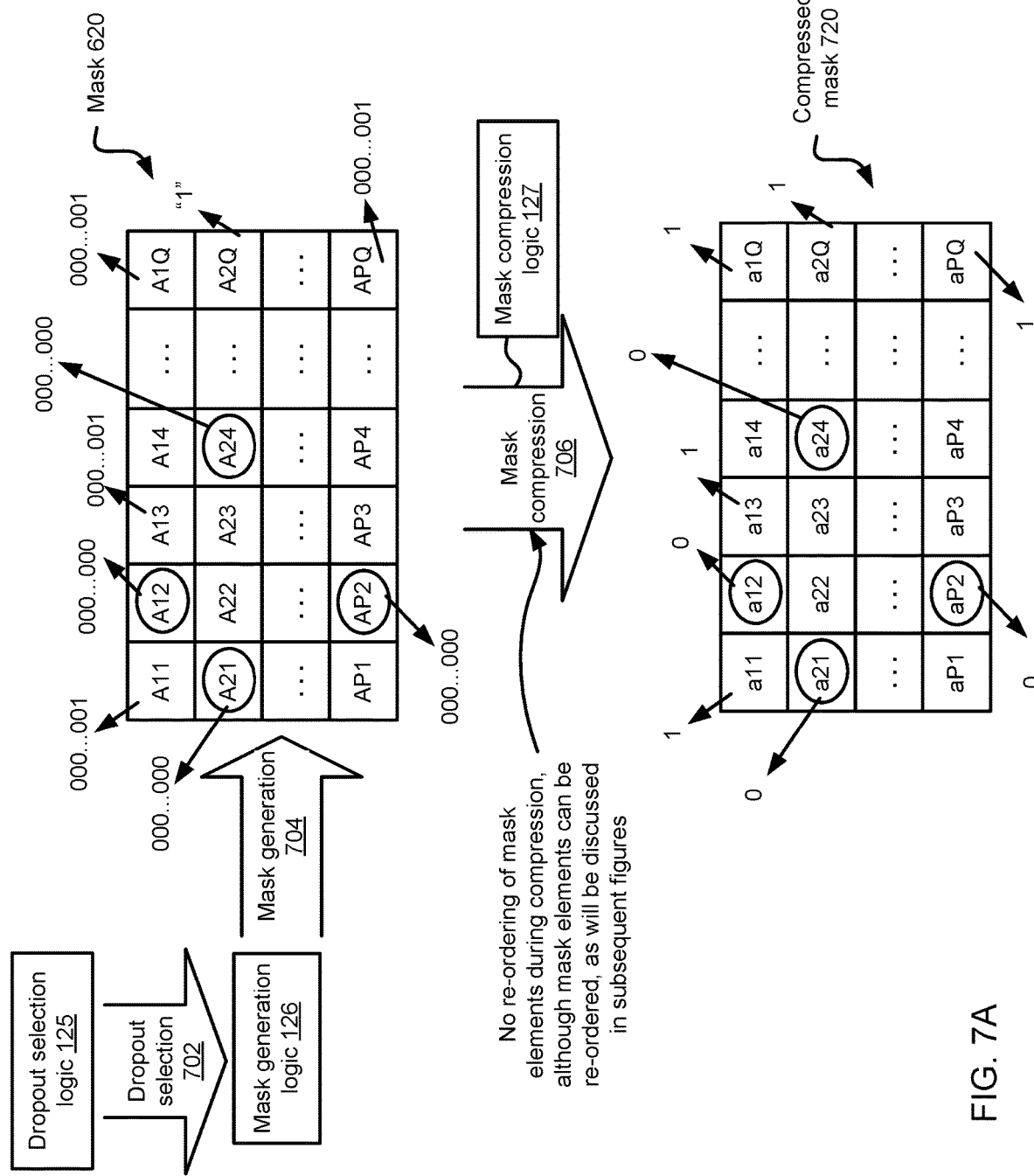
FIG. 7A illustrates generation and compression of mask elements of the mask of FIG. 6C.

FIG. 7A illustrates generation and compression of mask elements of the mask 620 of FIG. 6C. In an embodiment, the dropout selection logic 125 (also see FIG. 1) selects feature elements of the tensor 606 to be dropped out, and provides a dropout selection 702 to the mask generation logic 126 (also see FIG. 1). In one example, the dropout selection 702 provides the selection of the feature elements of the tensor 606 to be dropped out. In another example, the dropout selection 702 provides a percentage of the feature elements of the tensor 606 to be dropped out, and the mask generation logic 126 selects the feature elements to be dropped-out, based on the percentage.

In an embodiment, the percentage of the feature elements of the tensor 606 to be dropped out can be a user-selectable parameter and/or can be specified in the data flow graph associated with the application being executed in the neural network. The percentage of the feature elements of the tensor 606 to be dropped out can be any appropriate percentage between 0% and 100%. For example, the dropout selection logic 125 may specify that 5% of all the feature elements of the tensor 606 are to be dropped out. The dropout selection logic 125 and/or the mask generation logic 126 can then select 5% of all the feature elements of the tensor 606 for dropping out. The selection of the 5% of the feature elements can be random, pseudo-random, pre-specified, and/or can be based on a probability distribution (e.g., in accordance with the Poisson distribution).

Thus, the mask generation logic 126 is aware of the selection of the feature elements of the tensor 606 to be dropped-out, and generates the mask 620 (indicated as "mask generation 704" in FIG. 7A) based on the selection. For example, the mask generation logic 126 is aware of the selection of the feature elements F12, F21, F24, and FP2 of the tensor 606 to be dropped-out (see FIGS. 6B and 6C). Accordingly, in the generated mask 620, each of the corresponding mask elements A12, A21, A24, and AP2 is generated with a value of 000 . . . 000. In the generated mask 620, each of the remaining mask elements (e.g., corresponding to the feature elements that are not to be dropped out) is generated with a value of 000 . . . 001. Thus, the LSB of each mask element is generated to be either 0 or 1, depending on whether the corresponding feature element is to be dropped out or not. Bits of each mask element, other than the LSBs, are zeros anyway.

In an embodiment and as previously discussed, the mask elements Aij of the mask 620 and the feature elements Fij of the tensor 606 are in the same data format (e.g., have the same number of bits). Merely as an example, the mask elements Aij of the mask 620 and the feature elements Fij of the tensor 606 are in the data format INT16. Thus, in such an example, each of the mask elements Aij of the mask 620 and the feature elements Fij of the tensor 606 has 16 bits. The mask elements are originally generated to have a bit width matched to the bit width of the feature elements, e.g., to enable multiplication of a mask element Aij with a corresponding feature element Fij.

For example, both the mask element Aij and the corresponding feature element Fij have the same number of bits. Also, the mask element Aij has all zero bits, except for the LSB, which can be either a 0 or a 1. Accordingly, if the LSB of the mask element Aij is 1, then a multiplication of the Aij and Fij is simply the Fij, and the feature element Fij will not be dropped in the tensor 607 (i.e., the feature element Fij will retain its original value). On the other hand, if the LSB of the mask element Aij is 0, then a multiplication of the Aij and Fij is zero, and the feature element Fij will be dropped-out in the tensor 607. In order to facilitate the multiplication between individual mask element Aij and individual feature element Fij, the mask elements are originally generated to have the same number of bits as the feature elements. For example, both the mask elements Aij of the mask 620 and the feature elements Fij of the tensor 606 are in the same data format (such as data format INT16).

In an example, for training a neural network with dropout enabled, the same mask has to be applied on a tensor output by a layer in the forward path as on another corresponding tensor output by a corresponding layer on the backpropagation path. For example, assume that the mask 620 is applied to the output of the layer 604 of the forward path of the neural network. In the backpropagation path of the neural network, there would be another layer corresponding to the layer 604, and the same mask 620 has to also be applied to an output tensor of that other layer of the backpropagation path of the neural network. Thus, after applying the mask 620 to the tensor 606 output by the layer 604, the mask 620 has to be stored until the corresponding other backpropagation layer generates a corresponding output. Furthermore, multiple masks (e.g., similar to the mask 620) are to be generated and stored for multiple layers of the neural network. Storing the mask 620 consumes memory. Furthermore, note that the mask elements Aij have meaningful or relevant information in corresponding LSBs only (e.g., a LSB of a mask element is either zero or one, depending on whether the corresponding feature element is to be dropped-out or retained), and the remaining bits are zero and do not carry meaningful information. Accordingly, in an embodiment, the mask 620 is compressed to generate a compressed mask 720, as illustrated in FIG. 7A. Subsequently, the compressed mask 720 is used for the dropout of the tensor 606 output by the layer 604, and also used for the dropout of another tensor output by a corresponding other layer in the back propagation path.

As illustrated in FIG. 7A, the compression of the mask 620 (labelled as "mask compression 706" in FIG. 7A), to generate the compressed mask 720, is performed by the mask compression logic 127 (see FIG. 1). During compression, the mask compression logic 127 preserves the LSBs of the mask elements Aij in the compressed mask elements aij of the compressed mask 720, and discards the remaining bits of the mask elements Aij.

For example, mask element A11 of the mask 620 has a value of 000 . . . 001. A compressed mask element a11 of the compressed mask 720 is generated from the mask element A11 of the mask 620, and the compressed mask element a11 has a value of 1, which is the LSB of the mask element A11. Similarly, mask element A12 of the mask 620 has a value of 000 . . . 000. A compressed mask element a12 of the compressed mask 720 is generated from the mask element A12 of the mask 620, and the compressed mask element a12 has a value of 0, which is the LSB of the mask element A12. Other compressed mask elements of the compressed mask 720 are also generated in a similar manner.

In an example, individual mask elements Aij have an INT16 data format, whereas an individual compressed mask element aij comprises a single bit. Thus, a compression ratio of 16 is achieved in this example. This reduces memory consumption by a factor of 16, as well as reduces mask loading and/or unloading time. As will be discussed in further detail herein, the compressed mask 720 is in an encoded format as illustrated, and the decompression happens on-the-fly during computation on a given layer, i.e., no extra memory is spent to implement any decode logic.

Note that in the example of FIG. 7A, mask elements are not reordered during compression, and the mask elements Aij and compressed mask elements aij appear in the same order in the mask 620 and the compressed mask 720, respectively. However, in some other examples discussed herein later in turn, the mask elements can be reordered during the compression stage.

Figure 7B:
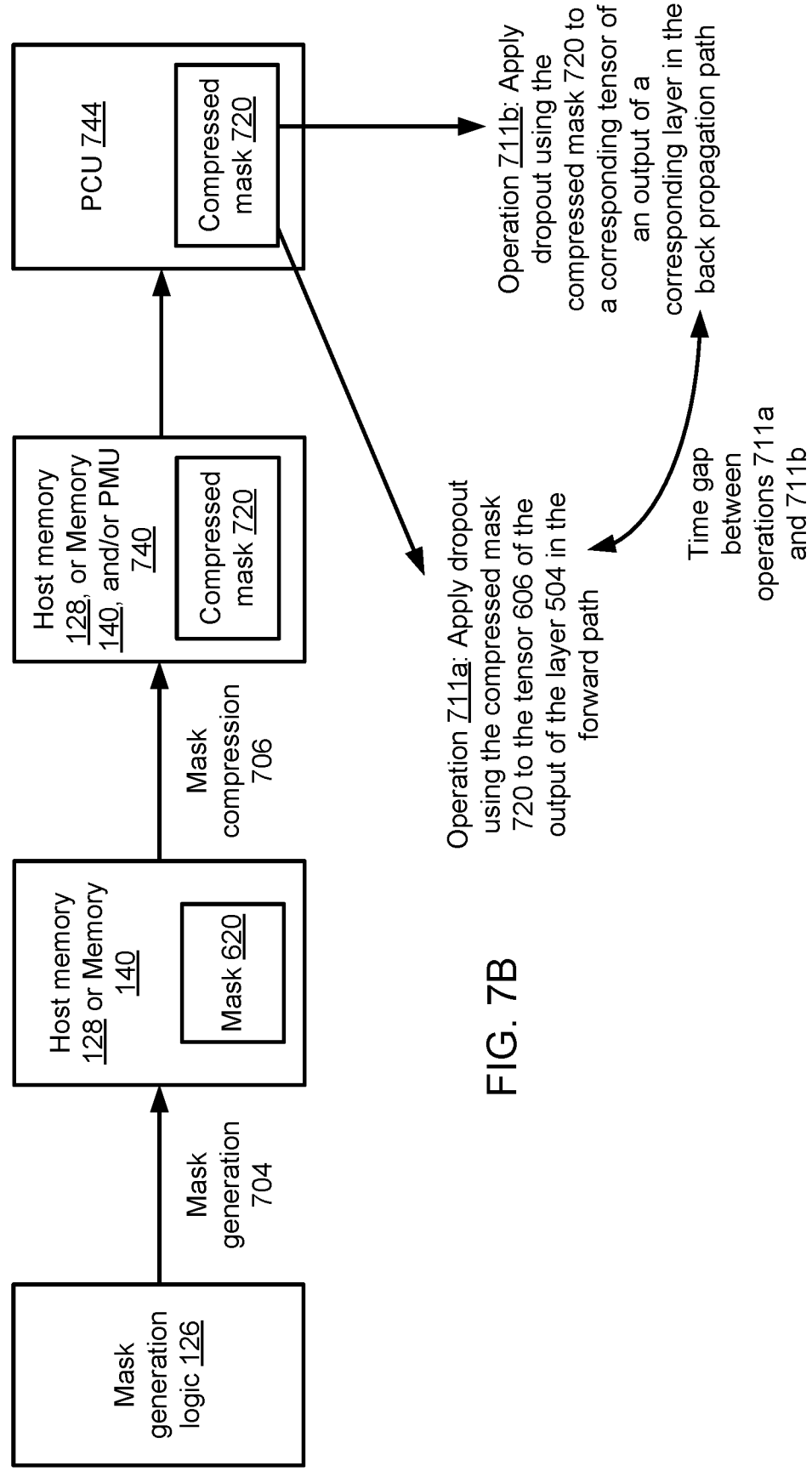
FIG. 7B illustrates generation and flow of a compressed mask of FIG. 7A.

FIG. 7B illustrates generation and flow of the compressed mask 720 of FIG. 7A. For example, as discussed with respect to FIG. 7A and as also illustrated in FIG. 7B, the mask generation logic 126 executing in the host 120 generates the mask 620 in the uncompressed format, which can be stored in the host memory 128 or the off-chip memory 140. In an example, the mask generation logic 126 executing in the host 120 generates and stores the mask 620 in the host memory 128, from which the mask 620 is transferred to the off-chip memory 140. In another example, the mask generation logic 126 executing in the host 120 generates and stores the mask 620 directedly in the off-chip memory 140. In yet another example, the mask generation logic 126 executing in the host 120 generates and stores the mask 620 in the host memory 128, from which the mask 620 is not transferred to the off-chip memory 140. In another example, the mask may be generated by the reconfigurable processor 110 and stored directly in the off-chip memory 140. In yet another example, the mask may be generated and compressed by the reconfigurable processor 110 and stored in the on-chip memory 530 in a PMU (341).

Subsequently, the mask compression logic 127 executing in the host 120 compresses the mask 620 (e.g., as discussed with respect to FIG. 7A, labelled as "mask compression 706" in FIGS. 7A and 7B) to generate the compressed mask 720, and the compressed mask 720 is stored in the host memory 128, the off-chip memory 140, and/or a reconfigurable memory unit such as a PMU 740 (see FIGS. 3 and 5 for PMUs). In an example, the mask compression logic 127 stores the compressed mask 720 in the host memory 128, from which the compressed mask 720 is transferred to the off-chip memory 140, and then to the PMU 740. In another example, the mask compression logic 127 stores the compressed mask 720 in the off-chip memory 140, from which the compressed mask 720 is transferred to the PMU 740. In yet another example, the mask compression logic 127 stores the compressed mask 720 directly to the PMU 740.

Subsequently, the compressed mask 720 is loaded from the PMU 740 to a reconfigurable compute unit such as a PCU 744 (see FIGS. 3 and 4 for PCUs). At operation 711a, the PCU 744 applies the compressed mask 720 to the tensor 606 output by the layer 604, to selectively dropout feature elements of the tensor 606 and thereby generate the tensor 607. At operation 711b, the PCU 744 also applies the same compressed mask 720 to another corresponding tensor output by another corresponding layer of the backpropagation path, to selectively dropout feature elements of the other tensor.

Note that operations 711a and 711b do not occur simultaneously. For example, after the dropout operation 711a of the tensor 607 of the forward path, the tensor 607 goes through various subsequent layers of the neural network, and is also propagated through various layers of the back propagation path. Accordingly, the dropout operation 711b in the corresponding layer of the backpropagation path is likely to occur sometime after the operation 711a. The time delay between the two operations may be based on a topology of the neural network, relative position of the layer 604 within the topology, execution speed of the neural network, and/or the like.

In one example, after the execution of operation 711a, the compressed mask 720 is deleted or overwritten from the PCU 744 and the PMU 740, but remains stored in the host memory 128 and/or the off-chip memory 140. During the later execution of operation 711b, the PMU 740 retrieves the compressed mask 720 from the host memory 128 and/or the off-chip memory 140, and then the PCU 744 retrieves the compressed mask 720 from the PMU 740.

In another example, after the execution of operation 711a, the compressed mask 720 remains stored in the PCU 744, for the later execution of operation 711b. In another example, after the execution of operation 711a, the compressed mask 720 is deleted or overwritten from the PCU 744 but remains stored in the PMU 740, and during the later execution of operation 711*b* the PCU 744 retrieves the compressed mask 720 from the PMU 740.

Because of the compression, the compressed mask 720 is relatively small in size (e.g., compared to the uncompressed mask 620) and consumes less memory space. Thus, in an example, the compressed mask 720 can remain loaded in the PMU 740 between operations 711*a* and 711*b*, thereby reducing the compressed mask loading/unloading time required during dropout in the backpropagation layer.

Figure 7C:
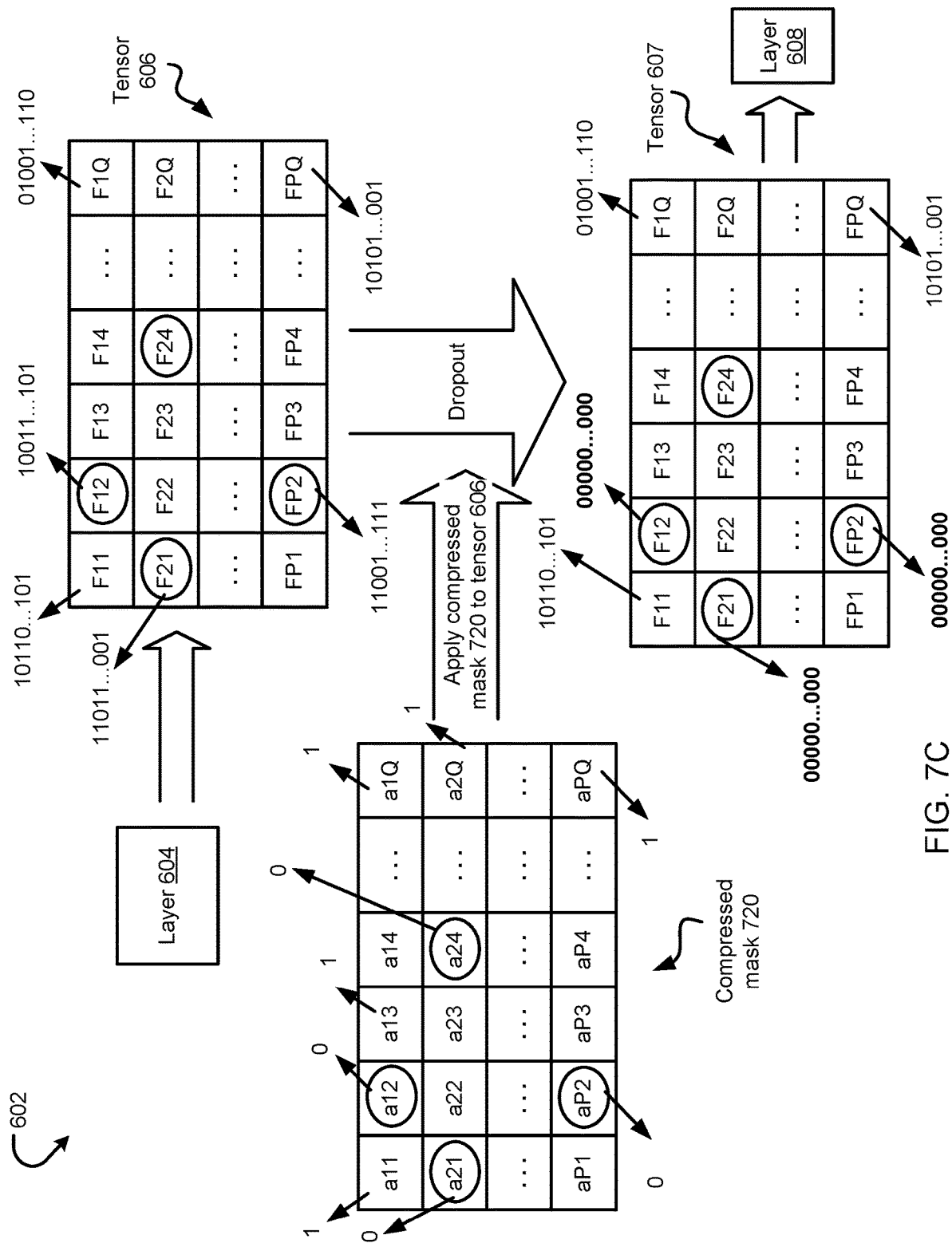
FIG. 7C illustrates application of a compressed mask to feature elements of a tensor, to generate another tensor having one or more dropped-out feature elements.

FIG. 7C illustrates application of the compressed mask 720 to the feature elements of the tensor 606, to generate the tensor 607 having one or more dropped-out feature elements. The compressed mask 720 of FIG. 7C is also illustrated in FIG. 7A, and as discussed, the compressed mask 720 has a single-bit "0" value for some of the compressed mask elements, such as compressed mask elements a12, a21, a24, and aP2. The compressed mask 720 has a single-bit "1" value for the remaining compressed masked elements, such as compressed masked elements a11, a13, a22, and aPQ. When the compressed mask 720 is applied to the tensor 606, the PCU 744 drops a feature element if the corresponding compressed mask element is 0. For example, feature elements F12, F21, F24, and FP2 in the tensor 607 have all zeros, e.g., as these features were dropped out. On the other hand, the PCU 744 does not drop a feature element (e.g., retains the feature element without any change) if the corresponding compressed mask element is 1. For example, each of the feature elements F11, F13, F22, and FPQ has the same values in both tensors 606 and 608 (i.e., these features retain their original values in the tensor 607, and are not dropped out).

Figure 8A:
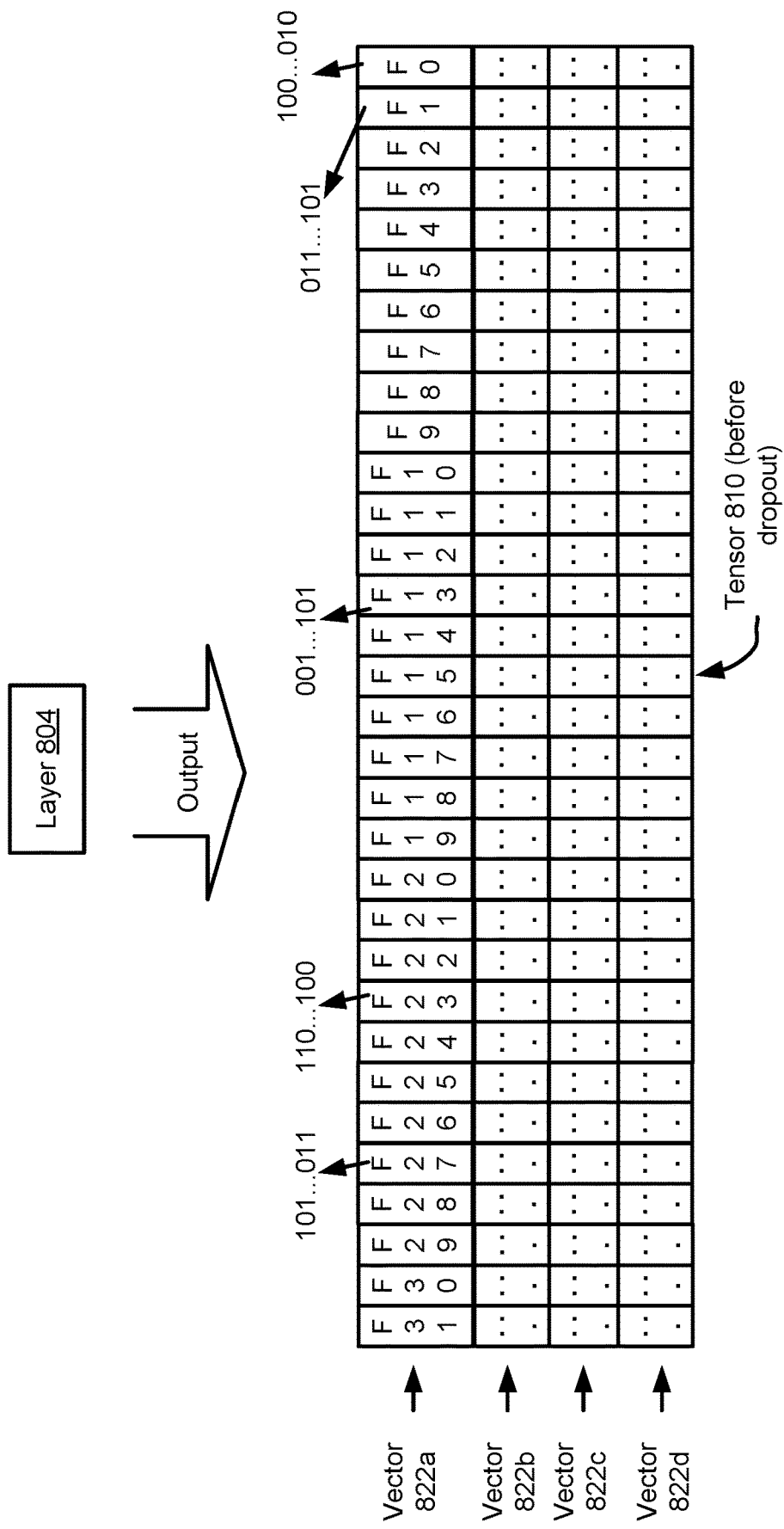
FIG. 8A illustrates an example tensor output by a layer of a neural network, where one or more feature elements of the tensor are to be selectively dropped out.
Figure 8B:
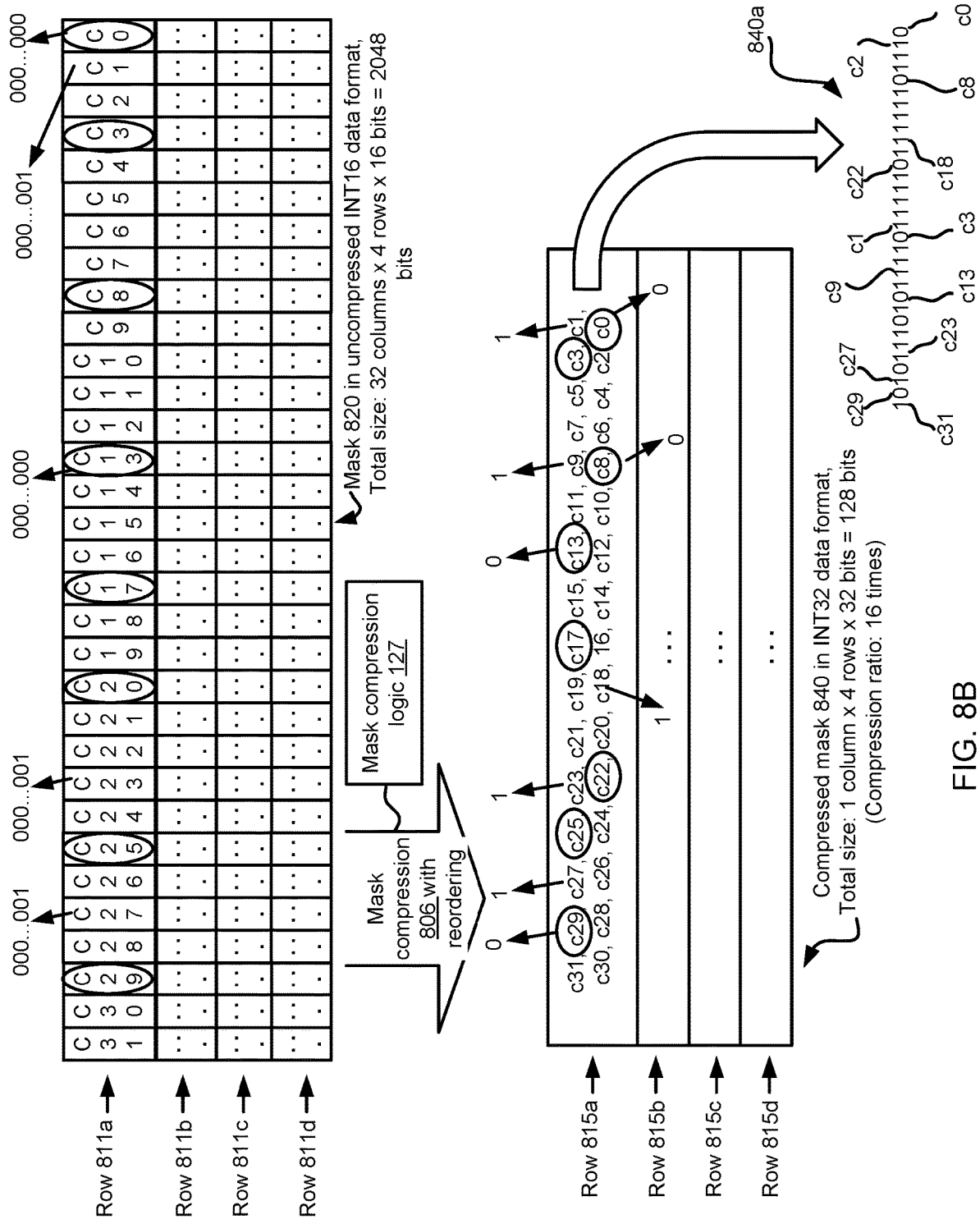
FIG. 8B illustrates a mask and a corresponding compressed mask for implementing the dropout of feature elements of the tensor of FIG. 8A.

FIG. 8A illustrates an example tensor 810 output by a layer 804 of a neural network, where one or more feature elements of the tensor 810 are to be selectively dropped out; and FIG. 8B illustrates a mask 820 and a corresponding compressed mask 840 for implementing the dropout of feature elements of the tensor 810 of FIG. 8A. Referring to FIG. 8A, the layer 804 outputs the tensor 810 having feature elements arranged in a 4×32 array. Thus, there are four rows of feature elements. Each row of feature elements forms a corresponding vector, and accordingly, four vectors 822*a*, 822*b*, 822*c*, and 822*d* are formed corresponding to the four rows of feature elements.

In FIG. 8A, feature elements of only the first row (i.e., the feature elements of the vector 822*a*) are labelled in FIG. 8A, which includes feature elements F0, F1, . . . , F31, generally referred to as Fi, where i varies from 0 to 31. In an embodiment, each feature element Fi is a multibit element, e.g., comprises 16 corresponding bits. Merely as an example, each feature element Fi is in INT16 data format, i.e., has 16 corresponding bits. In another example, each feature element Fi is in another appropriate 16-bit data format (e.g., which is supported by a PCU 835 discussed herein later with respect to FIG. 8E), such as BF-16 data format. Example values of some of the feature elements (such as feature elements F0, F1, F13, F23, and F27) are illustrated in FIG. 8A.

Referring now to FIG. 8B, illustrated is a mask 820 comprising a plurality of mask elements, for implementing selective dropout of feature elements of the tensor 810 of FIG. 8A. The mask elements of the mask 820 are also arranged in a 4×32 array (e.g., similar to the feature elements of the tensor 810 of FIG. 8A). Thus, there are four rows 811*a*, 811*b*, 811*c*, 811*d* of mask elements.

In FIG. 8B, mask elements of only the first row 811*a* are illustrated, which includes mask elements C0, C1, . . . , C31, generally referred to as Ci, where i varies from 0 to 31. Note that the labels using the capital letter "C" refer to the mask elements in the uncompressed form of the mask 820, whereas labels using the small letter "c" refer to compressed mask elements of a compressed mask 840.

In an example, each mask element of the mask 820 corresponds to a respective feature element of the tensor 810. For example, mask element C0 dictates whether the corresponding feature element F0 is to be dropped-out or retained, mask element C1 dictates whether the corresponding feature element F1 is to be dropped-out or retained, mask element C3 dictates whether the corresponding feature element F3 is to be dropped-out or retained, and so on, e.g., as discussed herein earlier with respect to FIGS. 6B-7C.

In an embodiment, each mask element Ci is a multibit element, e.g., comprises 16 corresponding bits. Merely as an example, each mask element Ci has a bit width that matches the bit width of the feature elements Fi of the tensor 810 (e.g., to maintain consistency of data, as discussed herein earlier with respect to FIGS. 6B-7C). Thus, in an example, each of the mask elements C0, . . . , C31 comprises 16 bits (i.e., has the same number of bits as the feature elements). In an example and as discussed herein, each of the mask elements C0, . . . , C31 can be represented in INT16 data format (although another 16-bit data format can also be used for the mask elements). In an example, irrespective of the 16-bit data format used for the feature elements (e.g., INT16, BF-16, or another appropriate 16 bit data format supported by the PCU 835), the mask elements C0, . . . , C31 are in INT16 data format. Example values of some of the mask elements are illustrated in FIG. 8B. Mask elements of the mask 820, which are encircled with a corresponding circle, include 16 bits of zero, indicating that corresponding feature elements are to be dropped. In the example of FIG. 8B, mask elements C0, C3, C8, C13, C17, C20, C25, and C29 have all zero bits, indicating that corresponding feature elements F0, F3, F8, F13, F17, F20, F25, and F29 are to be dropped. Each of the remaining mask elements of the mask 820 has 16 bits, with a LSB of 1 and zeros as the remaining bits, indicating that the corresponding feature elements are not to be dropped (i.e., corresponding feature elements are to be retained during the dropout). In other embodiments, other representations may be used to indicate which elements to drop out. Merely as an example, in the INT16 format, 16 consecutive '1' bits may be used for a mask element to indicate that a corresponding feature element is to be dropped out; and 16 consecutive '0' bits may be used for a mask element to indicate that a corresponding feature element is to be retained (i.e., not dropped out). Generally, any two distinct values may be used to distinguish between mask elements that indicates corresponding feature elements should be dropped out and corresponding feature elements should be retained. These mask values may be compared against their respective constants, and the results of the comparison used to convert a mask element into the compressible format, or the mask element may be directly compressed by generating a single '1' or '0' bit as appropriate.

For ease of identification, in the mask 820, the mask elements C0, C2, C4, . . . , C30 are termed as "even" numbered mask elements, and the mask elements C1, C3, C5, . . . , C31 are termed as "odd" numbered mask elements. Thus, odd and even numbered mask elements are interleaved in the mask 820.

As discussed with respect to FIGS. 7A and 7B, the mask 820 of FIG. 8B is compressed, to generate a corresponding compressed mask 840, e.g., by compressing individual mask elements Ci to generate corresponding compressed mask elements ci. For example, mask element C0 is compressed to generate corresponding compressed mask element c0, mask element C1 is compressed to generate corresponding compressed mask element c1, mask element C31 is compressed to generate corresponding compressed mask element c31, and so on. Thus, compressed mask elements c0, c1, . . . , c31 are generated from mask elements C0, C1, . . . , C31, respectively. During the compression, the LSB of each mask element (which can be either 1 or 0) is retained, and remaining bits (which are anyway zeros) are discarded. Thus, for example, mask element C0 having a value of 000 . . . 000 is compressed to generate compressed mask element c0 having a value of 0; mask element C1 having a value of 000 . . . 001 is compressed to generate compressed mask element c1 having a value of 1; mask element C29 having a value of 000 . . . 000 is compressed to generate compressed mask element c29 having a value of 0; mask element C31 having a value of 000 . . . 001 is compressed to generate compressed mask element c31 having a value of 1; and so on, as illustrated in FIG. 8B.

The compressed mask 840 has four rows 815a, 815b, 815c, 815d, with each row having 32 compressed mask elements. For example, mask elements of the row 811a of the mask 820 are compressed to generate the compressed mask elements of the row 815a of the compressed mask 840; mask elements of the row 811b of the mask 820 are compressed to generate the compressed mask elements of the row 815b of the compressed mask 840, and so on.

Each of the compressed mask elements c0, . . . , c31 of the row 815a are also termed as either odd or even. Note that whether a compressed mask element of the compressed mask 840 is termed as an "even" compressed mask element or an "odd" compressed mask element is not based on a relative position of the compressed mask element in the compressed mask 840. Rather, whether a compressed mask element of the compressed mask 840 is even or odd is based on whether the corresponding mask element in the mask 820 is termed as even or odd. For example, as discussed herein previously, in the mask 820, the mask elements C0, C2, C4, . . . , C30 are termed as "even" mask elements, and the mask elements C1, C3, C5, . . . , C31 are termed as "odd" mask elements. Thus, odd and even numbered mask elements are interleaved in the mask 820. Accordingly, as the compressed mask element c0 of the compressed mask 840 is generated from the even numbered mask element C0 of the mask 820, the compressed mask element c0 is termed as being even. Similarly, as the compressed mask element c1 of the compressed mask 840 is generated from the odd numbered mask element C1 of the mask 820, the compressed mask element c1 is termed as being odd. Thus, in the compressed mask 840, compressed mask elements c0, c2, c4, . . . , c30 are termed as "even" numbered compressed mask elements, and compressed mask elements c1, c3, c5, . . . , c31 are termed as "odd" numbered compressed mask elements. Such labelling of the compressed mask elements as being odd or even is irrespective or independent of the relative positions of the compressed mask elements in the compressed mask 840, as illustrated (e.g., as the compressed mask elements are rearranged, discussed below).

In FIG. 8B, when compressing the mask 820 to generate the compressed mask 840, in addition to the above discussed compression operation, a reordering (or rearranging) operation is also performed within each row, to reorder or rearrange the compressed mask elements in the compressed mask 840 (e.g., relative to an order of the mask elements in the mask 820).

For example, in the mask 820, the mask elements of the first row 811a are arranged in the following order: C31, C30, C29, . . . , C0. However, in the compressed mask 840, the compressed mask elements of the first row 815a are arranged (starting from the right) in the order c31, c29, . . . , c3, c1, c30, c28, . . . , c2, c0. Thus, the "non-consecutive" even-positioned mask elements C30, C28, C26, . . . , C0 of the mask 820 are compressed and "consecutively" arranged as even-numbered compressed mask elements c30, c28, c26, . . . , c0, respectively, in the compressed mask 840. Similarly, the "non-consecutive" odd-positioned mask elements C31, C29, C27, . . . , C1 of the mask 820 are compressed and "consecutively" arranged as odd-numbered compressed mask elements c31, c29, c27, . . . , c1 in the compressed mask 840.

Thus, in the mask 820, the even and odd mask elements are interleaved; whereas in the compressed mask 840, the even compressed mask elements are consecutively arranged, and the odd compressed mask elements are consecutively arranged.

The right-bottom corner of FIG. 8B illustrates the compressed mask row 840a, which includes example values of individual compressed mask elements c31, c29, . . . , c3, c1, c30, c28, . . . , c2, c0 of the first row 815a of the compressed mask 840. Merely as an example, the compressed mask row 840a is 10101110101111011111011111101110. Here, the LSB or bit 0 of the compressed mask row 840a is "0" corresponding to the compressed mask element c0; the bit 1 of the compressed mask row 840a is "1" corresponding to the compressed mask element c2; the bit 2 of the compressed mask row 840a is "1" corresponding to the compressed mask element c4; the bit 30 of the compressed mask row 840a is "0" corresponding to the compressed mask element c29; the bit 31 of the compressed mask row 840a is "1" corresponding to the compressed mask element c31; and so on. Thus, as illustrated, each row 815 of the compressed mask 840 has 32 bits, corresponding to the 32 mask elements of a row of the mask 820. In an example, each row 815 of the compressed mask 840 is in the INT32 data format. Thus, for example, the compressed mask row 840a having the 32 bits is in the INT32 data format (although another appropriate 32-bit data format can also be used). In an example, irrespective of the 16-bit data format used for the feature elements (e.g., INT16, BF-16, or another appropriate 16-bit data format), each of rows 815a, . . . , 815d of the compressed mask 840 is in INT32 data format.

Dropout of the feature elements of the vector 822a of the first row of the tensor 810 of FIG. 8A, using the compressed mask elements of the row 815a of the compressed mask 840, will be discussed herein in further detail below. Similar operations can be employed to implement dropout of the other vectors 822b, 822c, 822d of the tensor 810, as would be appreciated by those skilled in the art.

Figure 8C:
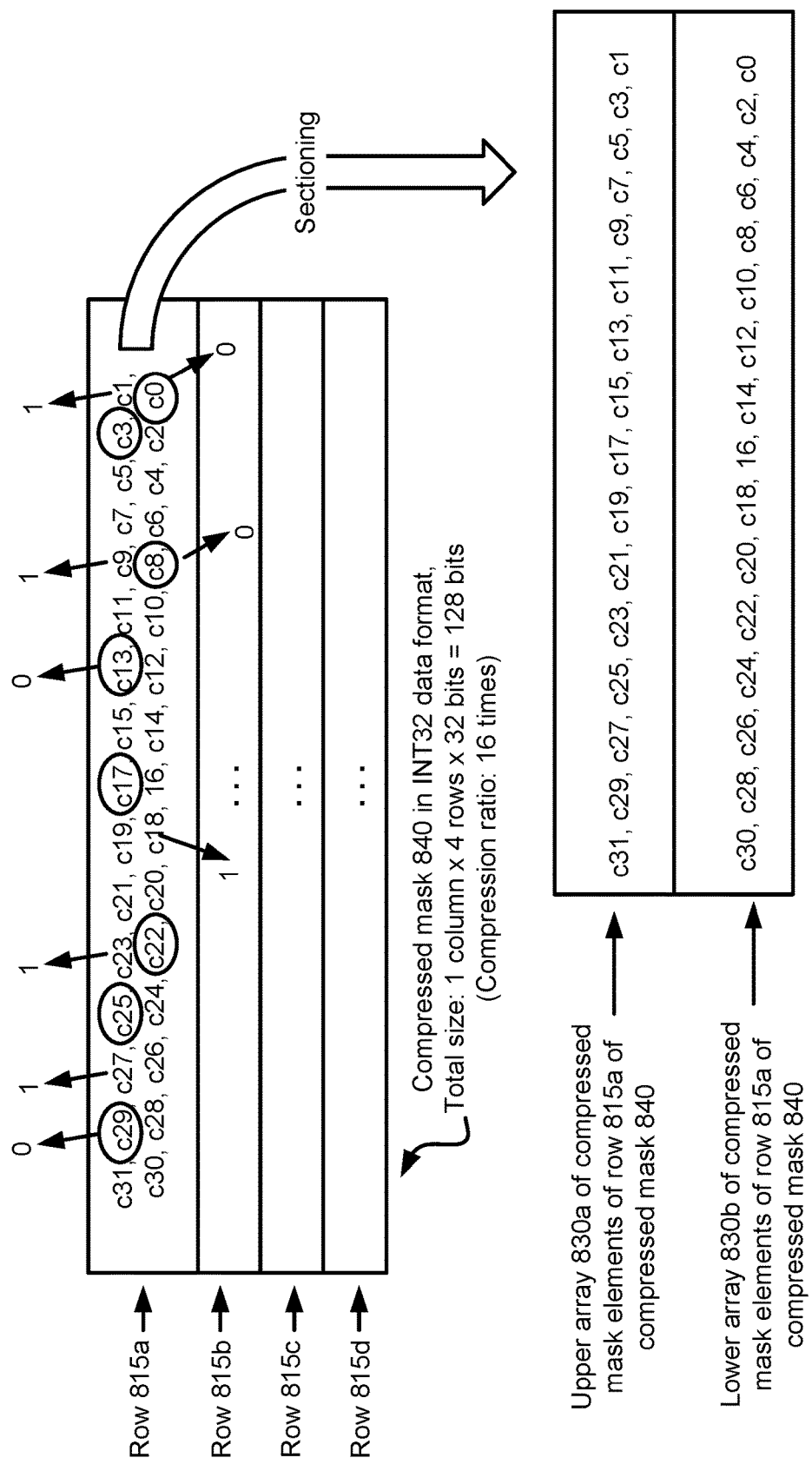
FIG. 8C illustrates sectioning a row of compressed mask elements in an upper array of compressed mask elements and a lower array of compressed mask elements.

FIG. 8C illustrates sectioning a row 815a of compressed mask elements in an upper array 830a of compressed mask elements and a lower array 830b of compressed mask elements. Thus, the 16 MSBs of the compressed mask elements in the row 815a are included in the upper array 830a, and the 16 LSBs of the compressed mask elements in the row 815a are included in the lower array 830b. Note that as discussed with respect to FIG. 8B, the row 815a of compressed mask elements had compressed mask elements reordered, such that odd numbered compressed mask elements were consecutively ordered, and even numbered compressed mask elements were consecutively ordered. Due to such reordering and interleaving of the compressed mask elements in the compressed mask 840, the upper array 830a of compressed mask elements includes odd numbered compressed mask elements $c_1, c_3, \ldots, c_{31}$, and the lower array $830b$ of compressed mask elements includes even numbered compressed mask elements $c_0, c_2, \ldots, c_{30}$. Accordingly, the upper array $830a$ of compressed mask elements and the lower array $830b$ of compressed mask elements are also referred to herein as an odd array of compressed mask elements and an even array of compressed mask elements, respectively. Note that the terms "upper" and "lower" merely imply that the upper array has MSBs and the lower array has LSBs of the compressed mask elements of the row $815a$, and these arrays can also be referred to simply as first and second arrays, respectively.

Figure 8D:
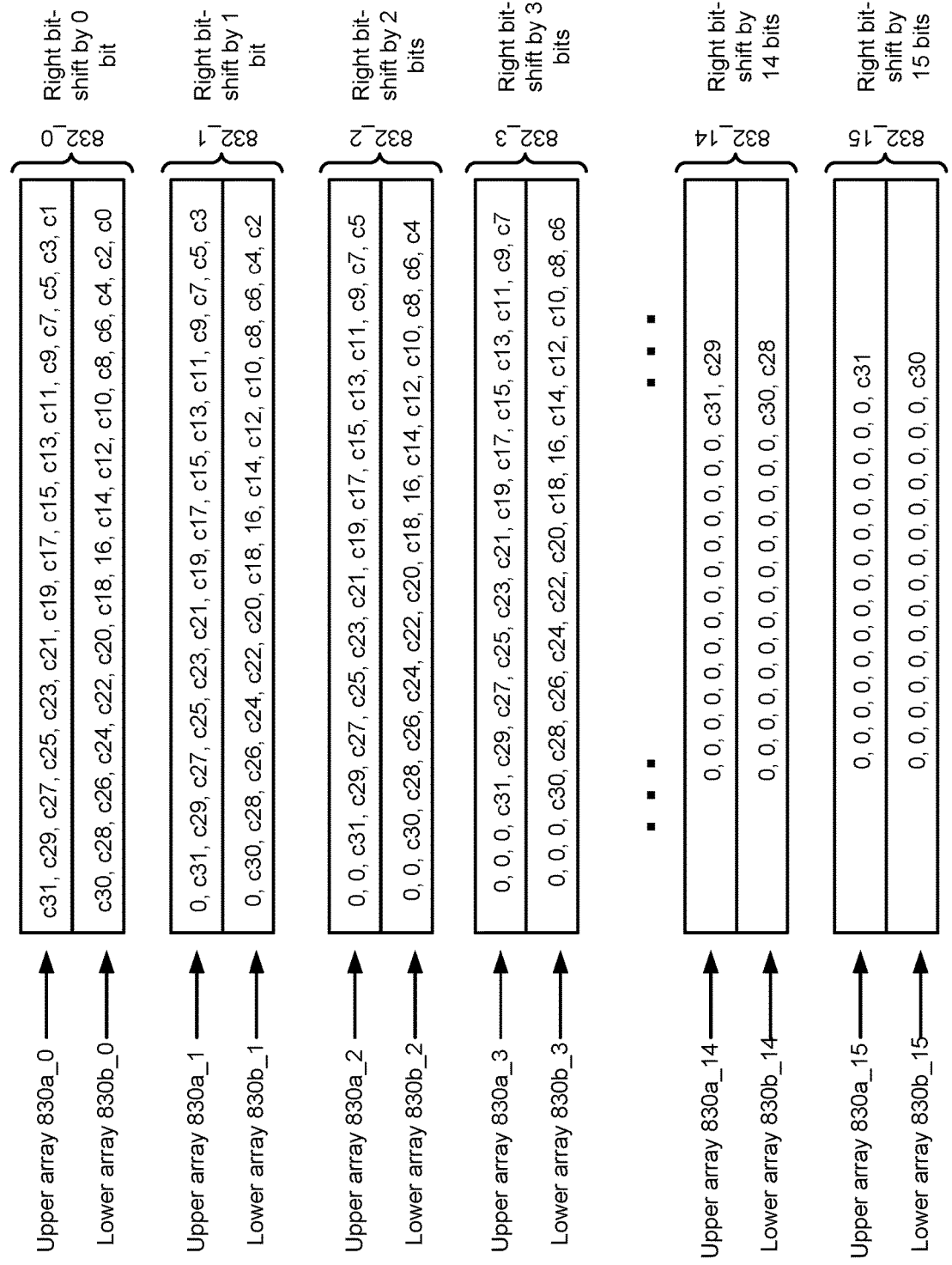
FIG. 8D illustrates selective logical right shifting of compressed mask elements in each of the upper array and the lower array of compressed mask elements.

FIG. 8D illustrates selective logical right shifting of compressed mask elements in each of the upper array $830a$ and the lower array $830b$ of compressed mask elements. For example, FIG. 8D illustrates multiple bit shifting examples $832$, where in each example, the compressed mask elements are shifted by corresponding bit(s) towards the right. Reasons for bit shifting will be discussed herein later in turn.

Referring to example $832\_0$, the compressed mask elements are shifted by 0 bits towards the right, resulting in the modified upper array $830a\_0$ and the modified lower array $830b\_0$ of compressed mask elements. As the compressed mask elements are shifted by 0 bits (i.e., not shifted at all), the modified upper array $830a\_0$ and the lower array $830b\_0$ of compressed mask elements are same as the upper array $830a$ and the lower array $830b$ of compressed mask elements, respectively. Note that compressed mask elements $c_0$ and $c_1$ are the LSBs of the modified lower array $830b\_0$ and the modified upper array $830a\_0$, respectively.

Referring to example $832\_1$, the compressed mask elements are shifted by 1 bit towards the right, resulting in the modified upper array $830a\_1$ and the modified lower array $830b\_1$ of compressed mask elements. As the compressed mask elements are shifted by 1 bit, the modified upper array $830a\_0$ and the lower array $830b\_0$ of compressed mask elements are different from the upper array $830a$ and the lower array $830b$ of compressed mask elements, respectively. Note that compressed mask elements $c_2$ and $c_3$ are the LSBs of the modified lower array $830b\_1$ and the modified upper array $830a\_1$, respectively.

Referring to example $832\_2$, the compressed mask elements are shifted by 2 bits towards the right, resulting in the modified upper array $830a\_2$ and the modified lower array $830b\_2$ of compressed mask elements. As the compressed mask elements are shifted by 2 bits, compressed mask elements $c_4$ and $c_5$ are the LSBs of the modified lower array $830b\_2$ and the modified upper array $830a\_2$, respectively.

Referring to example $832\_3$, the compressed mask elements are shifted by 3 bits towards the right, resulting in the modified upper array $830a\_3$ and the modified lower array $830b\_3$ of compressed mask elements. As the compressed mask elements are shifted by 3 bits, compressed mask elements $c_6$ and $c_7$ are the LSBs of the modified lower array $830b\_3$ and the modified upper array $830a\_3$, respectively.

This process continues, and referring to example $832\_14$, the compressed mask elements are shifted by 14 bits towards the right, resulting in the modified upper array $830a\_14$ and the modified lower array $830b\_14$ of compressed mask elements. As the compressed mask elements are shifted by 14 bits, compressed mask elements $c_{28}$ and $c_{29}$ are the LSBs of the modified lower array $830b\_14$ and the modified upper array $830a\_14$, respectively.

Finally, referring to example $832\_15$, the compressed mask elements are shifted by 15 bits towards the right, resulting in the modified upper array $830a\_15$ and the modified lower array $830b\_15$ of compressed mask elements. As the compressed mask elements are shifted by 15 bits, compressed mask elements $c_{30}$ and $c_{31}$ are the LSBs of the modified lower array $830b\_15$ and the modified upper array $830a\_15$, respectively.

Generally speaking, in example $832\_i$ (where i varies from $0, \ldots, 15$), the compressed mask elements are shifted by i bits towards the right, resulting in the modified upper array $830a\_i$ and the modified lower array $830b\_i$ of compressed mask elements. As the compressed mask elements are shifted by i bits, compressed mask elements $c_{2i}$ and $c(2i+1)$ are the LSBs of the modified lower array $830b\_i$ and the modified upper array $830a$ i, respectively.

Figure 8E:
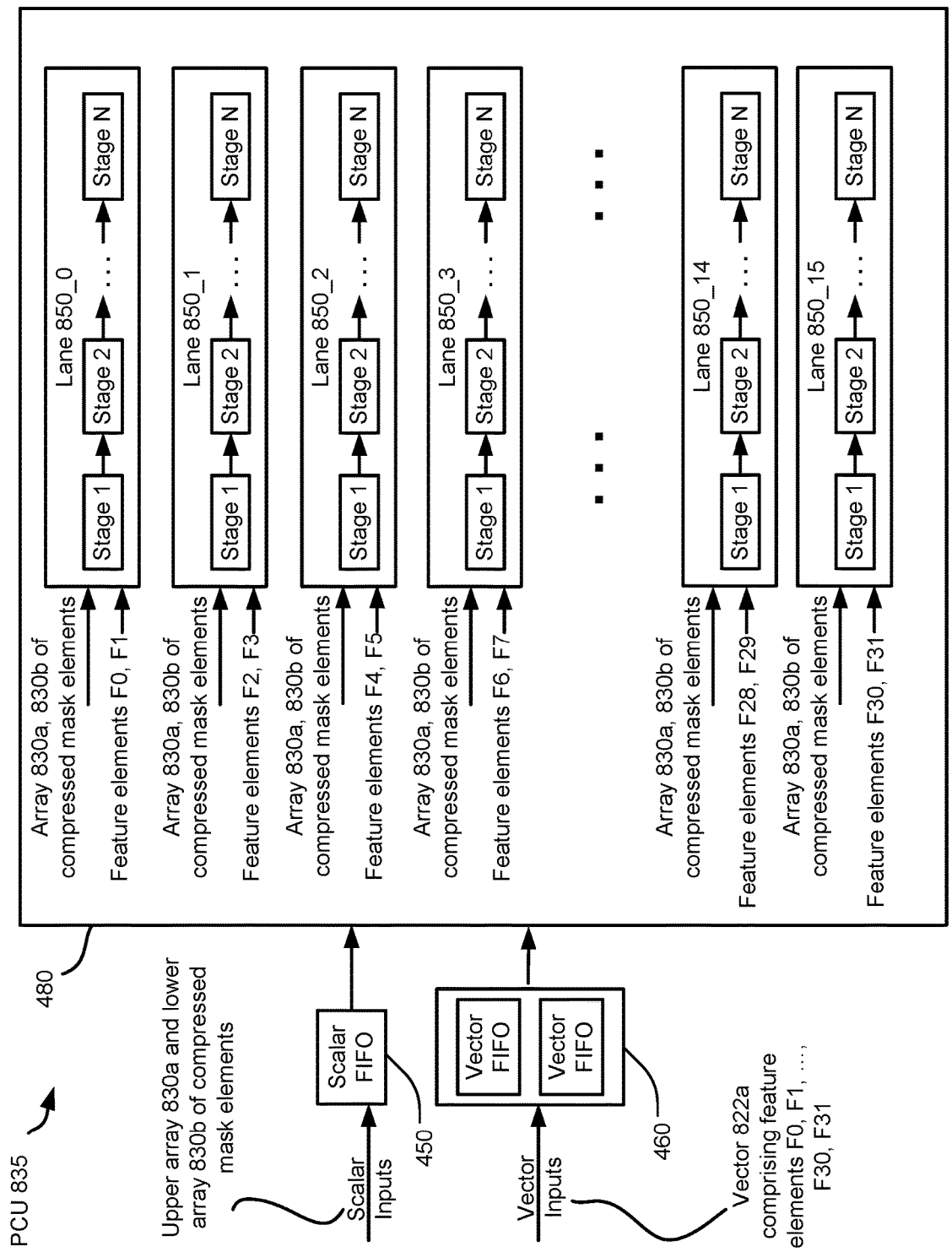
FIG. 8E illustrates a computing unit configured to implement dropout on a tensor output by a layer of FIG. 8A.

FIG. 8E illustrates a computing unit $835$ configured to implement dropout on the tensor $810$ output by the layer $804$ of FIG. 8A. In an example, the computing unit $835$ is a reconfigurable computing unit, such as a PCU discussed with respect to FIGS. 3, 4, and 7B, and hence, also referred to as PCU $835$. In another example, a non-reconfigurable computing unit can also be used to implement the dropout, instead of a reconfigurable computing unit or a PCU.

Referring to FIGS. 4 and 8E, only some components of the PCU from FIG. 4 are illustrated in FIG. 8E. For example, the PCU $835$ of FIG. 8E includes a scalar FIFO $450$ to receive scalar inputs. In an example, the scalar FIFO $450$ sequentially receives individual rows of the compressed mask $840$, each row of which is in scalar form. For example, initially, the scalar FIFO $450$ receives the first row $815a$ of the compressed mask $840$ (see FIG. 8B), and the PCU $835$ applies the first row $815a$ of the compressed mask $840$ on the first vector $822a$ (see FIG. 8A) of feature elements of the tensor $810$ to perform dropout operations on the feature elements of the first vector $822a$. Then the scalar FIFO $450$ receives the second row $815b$ of the compressed mask $840$, and the PMU $835$ applies the second row $815b$ of the compressed mask $840$ on the second vector $822b$ of feature elements of the tensor $810$ to perform dropout operations on the feature elements of the second vector $822b$. This sequential process continues until dropout operations on all the vectors $822a, \ldots, 822d$ of the tensor $810$ have been performed. FIG. 8E and some of the subsequent figures illustrate dropout operations specifically on the feature elements of the vector $822a$ using the first row $815a$ of the compressed mask $840$, and similar operations can then be repeated on other vectors $822b, 822c,$ and $822d$ of feature elements subsequently and sequentially.

As discussed, the scalar FIFO $450$ receives the first row $815a$ of the compressed mask $840$, such as the upper array $830a$ and the lower array $830b$ of the compressed mask elements of row $815a$ of the compressed mask $840$ (also see FIG. 8C). The vector FIFO $460$ receives the vector $822a$ comprising the feature elements $F_0, F_1, \ldots, F_{31}$.

In an embodiment and as discussed with respect to FIG. 4, the PCU $835$ of FIG. 8E includes multiple reconfigurable datapaths in block $480$. The block $480$ comprises a plurality of lanes $850\_0, 850\_1, \ldots, 850\_15$. Thus, each lane is associated with a corresponding lane number j, where j varies from $0, \ldots, 15$. Thus, in this example, there are 16 lanes. Each lane $850$ includes corresponding reconfigurable datapath comprising a plurality of stages $1, \ldots, N$. Merely as an example, there may be 6 stages in each lane. As will be discussed herein in turn, stage 1 of each lane is used for right shifting the upper and lower arrays $830a, 830b,$ and stage 2 is used to implement the dropout. Remaining stages of the lanes can be used to implement one or more other appropriate functions. Examples of such function include, but are not limited to, non-linearities like ReLU and its variants (e.g., leaky ReLU), convolution, transpose convolution, hyperbolic tangent, sigmoid, and softmax, element-wise addition, matrix multiplication (e.g., GeMM), layer normalization (e.g., batch normalization), loss functions like cross-entropy, and tensor shape modifiers like transpose.

As illustrated in FIG. 8E, in an example, the upper array 830a and the lower array 830b of the compressed mask elements of row 815a of the compressed mask 840 are broadcast to each of the 16 lanes 850_0, . . . , 850_15.

Furthermore, each lane 850_j (where j=0, . . . , 15) receives two corresponding feature elements of the vector 822a of the tensor 810. For example, lane 0 receives feature elements F0 and F1 of the vector 822a of the tensor 810 (also see FIG. 8A); lane 1 receives feature elements F2 and F3 of the vector 822a of the tensor 810; lane 2 receives feature elements F4 and F5 of the vector 822a of the tensor 810; lane 3 receives feature elements F6 and F7 of the vector 822a of the tensor 810; lane 14 receives feature elements F28 and F29 of the vector 822a of the tensor 810; lane 15 receives feature elements F30 and F31 of the vector 822a of the tensor 810; and so on. In general, lane j receives feature elements F(2j) and F(2j+1) of the vector 822a of the tensor 810, where j=0, . . . , 15.

Figure 8F:
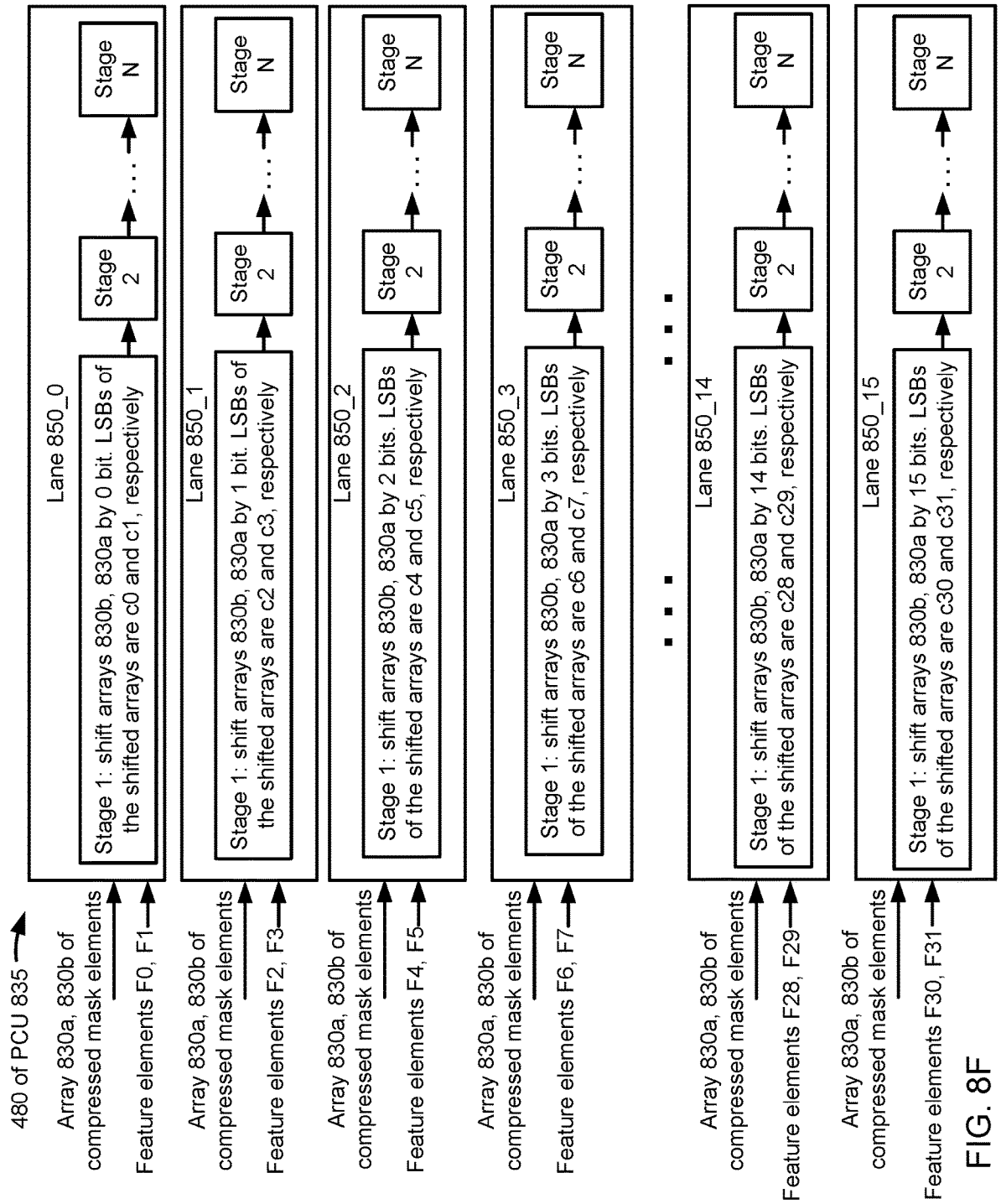
FIG. 8F illustrates logical right shift operations of an upper array and a lower array of a compressed mask within a computing unit.

FIG. 8F illustrates logical right shift operations of the upper array 830a and the lower array 830b of the compressed mask 840 within the computing unit 835 of FIG. 8E. FIG. 8F merely illustrates the block 480 of the computing unit 835, and other components of the computing unit 835 are not illustrated in FIG. 8F for purposes of illustrative clarity.

In FIG. 8F, in stage 1 of each lane 850_j (where j is 0, . . . , 15), each of the upper array 830a and the lower array 830b of the compressed mask 840 is right shifted by j bits. For example, in stage 1, the lane 850_0 logically right shifts each of the upper array 830a and the lower array 830b of the compressed mask 840 by 0 bits; in stage 1, the lane 850_1 logically right shifts each of the upper array 830a and the lower array 830b of the compressed mask 840 by 1 bit; in stage 1, the lane 850_2 logically right shifts each of the upper array 830a and the lower array 830b of the compressed mask 840 by 2 bits; in stage 1, the lane 850_3 logically right shifts each of the upper array 830a and the lower array 830b of the compressed mask 840 by 3 bits; in stage 1, the lane 850_14 logically right shifts each of the upper array 830a and the lower array 830b of the compressed mask 840 by 14 bits; in stage 1, the lane 850_15 logically right shifts each of the upper array 830a and the lower array 830b of the compressed mask 840 by 15 bits; and so on.

Logical right shifting of each of the upper array 830a and the lower array 830b of compressed mask elements by j bits (j varying between 0, . . . , 15) is discussed with respect to FIG. 8D. Thus, referring to FIGS. 8D and 8F, LSBs of the shifted lower array 830b and shifted upper array 830a (which were shifted by 0 bits) in the lane 850_0 are c0 and c1, respectively. Similarly, LSBs of the shifted lower array 830b and shifted upper 830a (which were shifted by 1 bit) in the lane 850_1 are c2 and c3, respectively. Similarly, LSBs of the shifted lower array 830b and shifted upper array 830a (which were shifted by 2 bits) in the lane 850_2 are c4 and c5, respectively. Similarly, LSBs of the shifted lower array 830b and shifted upper array 830a (which were shifted by 3 bits) in the lane 850_3 are c6 and c7 respectively. Similarly, LSBs of the shifted lower array 830b and shifted upper array 830a (which were shifted by 14 bits) in the lane 850_14 are c28 and c29, respectively. Similarly, LSBs of the shifted lower array 830b and shifted upper array 830a (which were shifted by 15 bits) in the lane 850_15 are c30 and c31, respectively. Generally, LSBs of the shifted lower array 830b and shifted upper array 830a (which were shifted by j bits) in the lane 850j are c(2j) and c(2j+1), respectively.

Figure 8G:
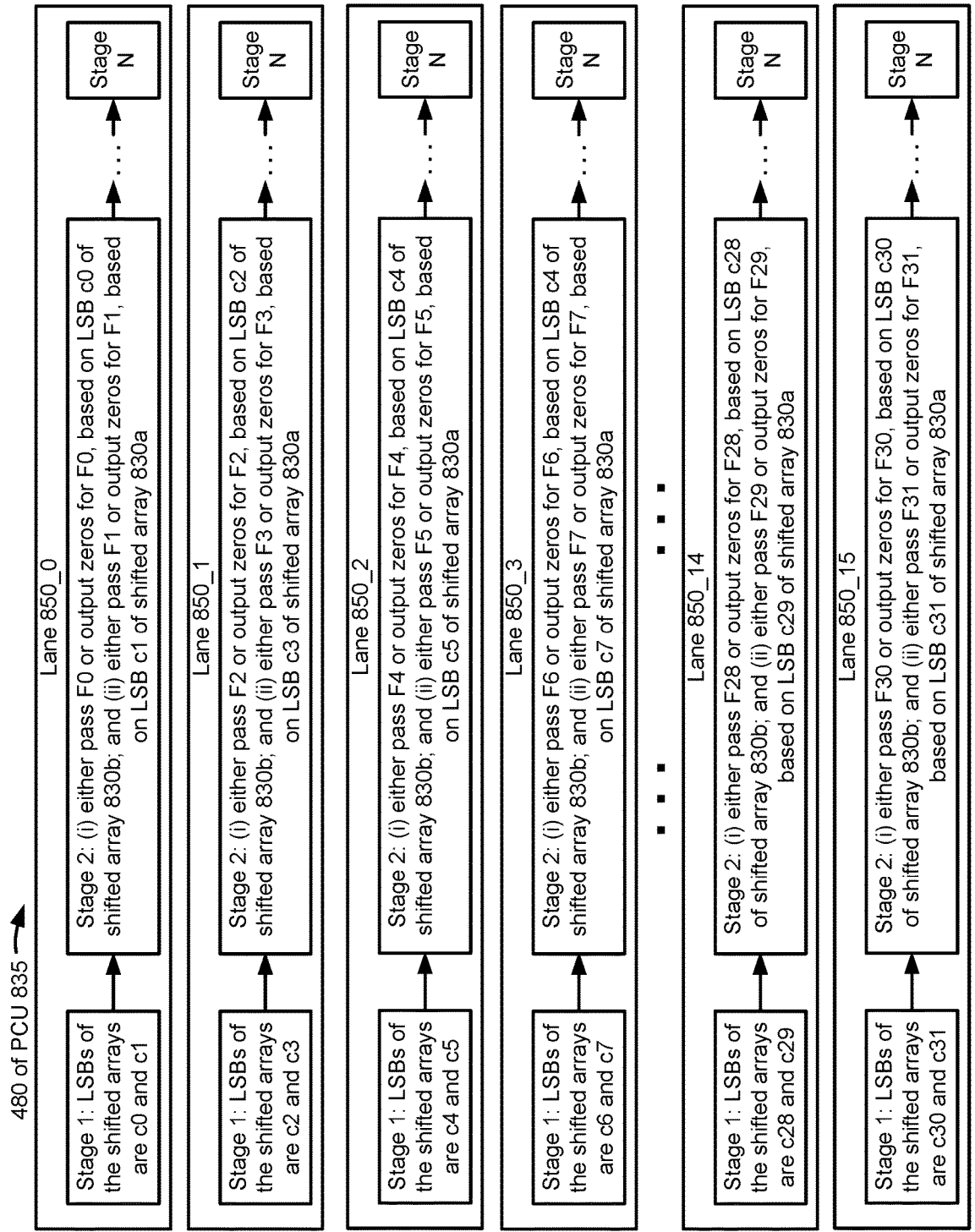
FIG. 8G illustrates dropout operations of feature elements of the tensor of FIG. 8A, using a shifted upper array and shifted lower array of a compressed mask, within the computing unit of FIGS. 8E and 8F.

FIG. 8G illustrates dropout operations of the feature elements F0, . . . , F31 of the tensor 810 of FIG. 8A, using the shifted upper array 830a and lower array 830b of the compressed mask 840, within the computing unit 835 of FIGS. 8E and 8F.

For example, as discussed with respect to FIG. 8E, the lane 850_0 receives feature elements F0 and F1. As discussed with respect to FIG. 8F, LSBs of the shifted lower array 830b and shifted upper array 830a in the lane 850_0 are c0 and c1, respectively. The second stage of lane 850_0 uses the LSB of the shifted lower array 830b (i.e., compressed mask element c0) to determine whether to pass the original feature element F0 to the next stage (i.e., not perform dropout of feature element F0), or pass all zeros to the next stage (i.e., perform dropout of feature element F0). Similarly, the second stage of lane 850_0 uses the LSB of the shifted upper array 830a (i.e., compressed mask element c1) to determine whether to pass the original feature element F1 to the next stage (i.e., not perform dropout of feature element F1), or pass all zeros to the next stage (i.e., perform dropout of feature element F1). In an example, the stage 2 of the lane 850_0 uses a conditional operator (e.g., a ternary operator) to determine whether to dropout a feature element, or pass the feature element without any change, based on a LSB of a corresponding upper or lower array of the compressed masked elements.

For example, referring to FIG. 8B, compressed mask elements c0 and c1 have values 0 and 1, respectively. Accordingly, feature element F0 is to be dropped out, while feature element F1 is to be retained and not dropped out. Accordingly, the second stage of lane 850_0 uses the "0" value of the LSB of the shifted lower array 830b (i.e., compressed mask element c0) to dropout feature element F0 and pass all zeros instead to the next stage. Similarly, the second stage of lane 850_0 uses the "1" value of the LSB of the shifted upper array 830b (i.e., compressed mask element c1) to refrain from dropping out the feature element F1, and pass the feature element F1 without any change to the next stage.

Similarly, the lane 850_1 receives feature elements F2 and F3, and LSBs of the shifted lower array 830b and shifted upper array 830a in the lane 850_0 are c2 and c3, respectively. The second stage of lane 850_1 uses the LSB of the shifted lower array 830b (i.e., compressed mask element c2) to determine whether to pass the original feature element F2 to the next stage (i.e., not perform dropout of feature element F2), or pass all zeros to the next stage (i.e., perform dropout of feature element F2). Similarly, the second stage of lane 850_2 uses the LSB of the shifted upper array 830a (i.e., compressed mask element c3) to determine whether to pass the original feature element F3 to the next stage (i.e., not perform dropout of feature element F3), or pass all zeros to the next stage (i.e., perform dropout of feature element F3). For example, referring to FIG. 8B, compressed mask elements c2 and c3 have values 1 and 0, respectively. Accordingly, feature element F2 is not dropped out, while feature element F3 is dropped out.

Similarly, the lane 850_2 receives feature elements F4 and F5, and LSBs of the shifted lower array 830b and shifted upper array 830a in the lane 850_0 are c4 and c5, respectively. Referring to FIG. 8B, each of the compressed mask elements c4 and c5 have a value of 1. Accordingly, both feature elements F4 and F5 are not dropped out.

This process continues for all other lanes, and will be evident to those skilled in the art based on the earlier discussion with respect to lane 850_0.

Thus, feature elements are selectively either retained (i.e., not dropped) or dropped out, based on the values of corresponding compressed mask elements. For example, referring to FIG. 8B, mask elements C0, C3, C8, C13, C17, C20, C25, and C29 are encircled, and hence, have zeros as their LSBs. Accordingly, each of the corresponding compressed mask elements c0, c3, c8, c13, c17, c20, c25, and c29 is zero. Hence, the corresponding feature elements F0, F3, F8, F13, F17, F20, F25, and F29 of the tensor 810 are dropped out, and zero values are passed to the subsequent stage instead of these feature elements, as discussed with respect to FIG. 8G. Remaining feature elements of the tensor 810 are not dropped, and are passed without any change to the subsequent stage, as also discussed with respect to FIG. 8G. Similar dropout operations are also performed at tensors in the backpropagation stage, as discussed herein previously.

Thus, as discussed herein, the mask generation logic 126 generates a mask comprising mask elements (such as the mask 820 of FIG. 8B), where each mask element includes a corresponding plurality of bits. Thus, the mask consumes relatively large storage space, and has relatively longer loading/unloading time. The mask is to be applied to a tensor in the forward path, and also to be applied to a corresponding tensor in the backpropagation path, e.g., as discussed with respect to FIG. 7B. As there is a time gap between applying the mask in the forward path and applying the mask in the backpropagation path, the mask has to be stored for this time gap, thereby consuming valuable on-chip memory resources. In an embodiment, the mask is compressed to generate a corresponding compressed mask (e.g., compressed mask 840 of FIG. 8B), which consumes much less storage space than the original mask. Once the compressed mask 840 is generated, the mask 820 can be discarded. In an embodiment, the compressed mask elements in the compressed mask are rearranged or interleaved, such that even numbered compressed mask elements are arranged consecutively and odd numbered compressed mask elements are arranged consecutively. Such rearrangement of the compressed mask elements results in efficient application of the compressed mask elements to corresponding feature elements during dropout operations in various lanes of a computing unit, as discussed with respect to FIGS. 8E, 8F, and 8G.

In the examples of FIGS. 8A-8G, each of the feature elements F0, F1, . . . , F31 comprises corresponding 16 bits, e.g., represented in any appropriate 16-bit format supported by the PCU 835, such as BF-16, INT16, or the like. Each of the mask elements C0, . . . , C31 also comprises 16 bits (i.e., has the same number of bits as the feature elements), and can be represented in INT16 data format, for example. In an example, each of rows 815a, . . . , 815d of the compressed mask 840 is in INT32 data format. Note that each lane of the PCU 835 processes corresponding two feature elements, e.g., because (i) each lane of the PCU 835 can handle 32 bits of feature elements and (ii) each feature element is 16 bits. As discussed, the compressed mask elements in the compressed mask 840 are interleaved or reordered, e.g., to enable each lane of the PCU 835 to handle corresponding 2 feature elements, as discussed with respect to FIGS. 8D-8G.

32-Bit Feature Elements and Compressed Mask Elements without Re-Ordering

Contrary to the examples illustrated in FIGS. 8A-8G in which the feature elements are 16 bits, in some other examples, each of the feature elements includes 32 corresponding bits. FIGS. 9A-9G illustrate a scenario where compressed mask elements are generated and feature elements are selectively dropped out based on the compressed mask elements, where individual feature elements are 32 bits and the compressed mask elements are not reordered during the compression process.

Figure 9A:
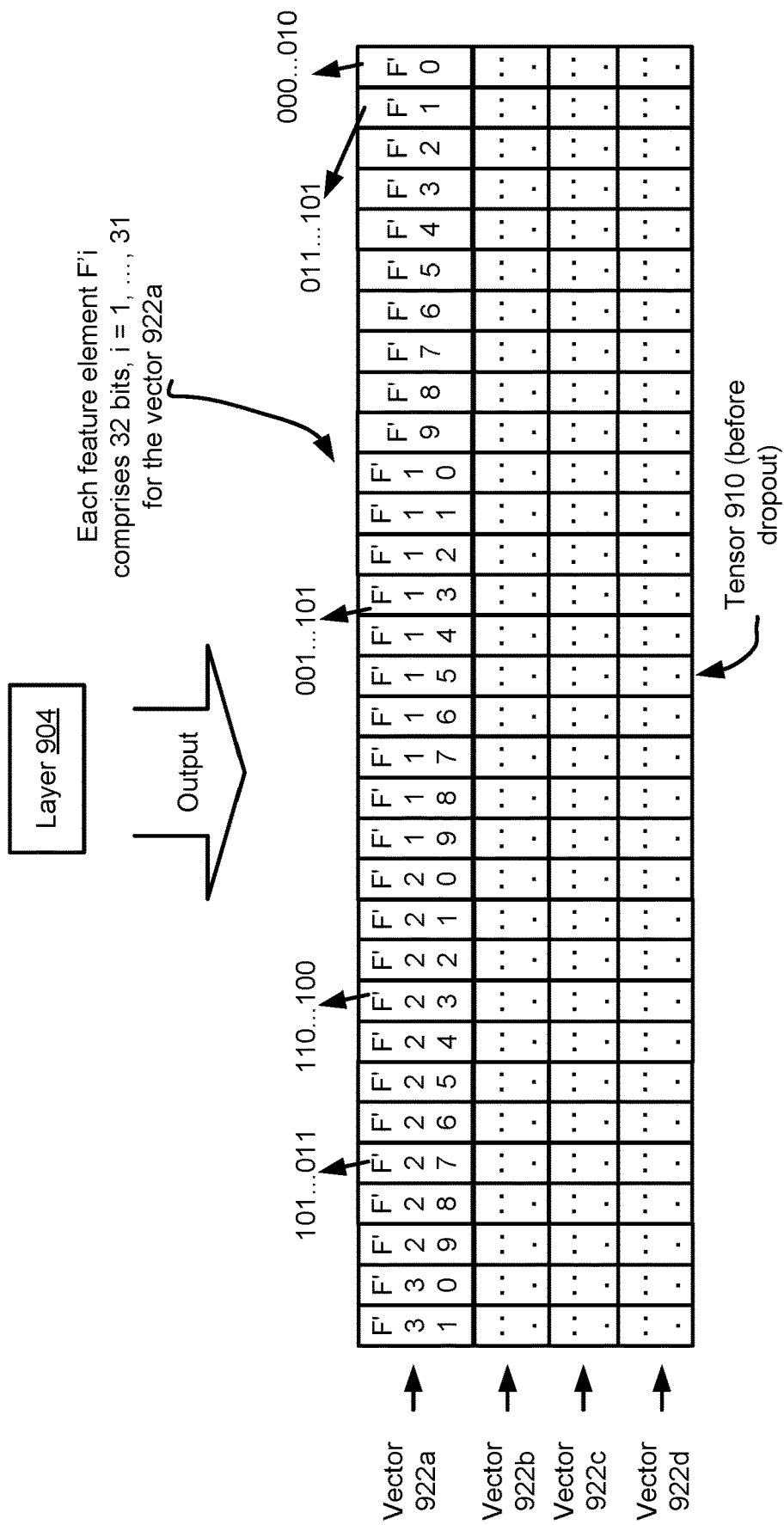
FIG. 9A illustrates an example tensor output by a layer of a neural network, where one or more feature elements of the tensor are to be selectively dropped out, and where individual feature elements comprises 32 bits.
Figure 9B:
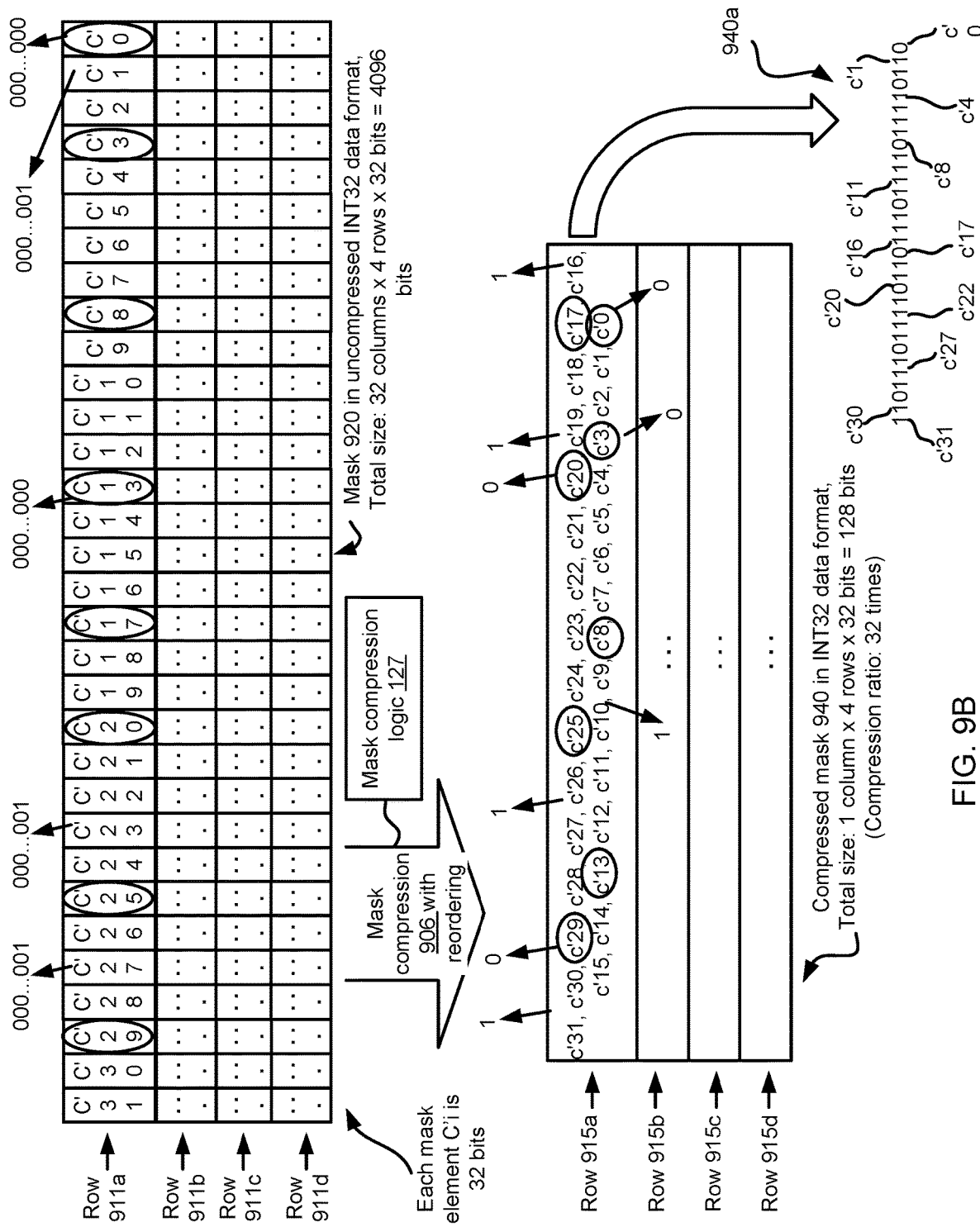
FIG. 9B illustrates a mask and a corresponding compressed mask for implementing the dropout of feature elements of the tensor of FIG. 9A.

FIG. 9A illustrates an example tensor 910 output by a layer 904 of a neural network, where one or more feature elements of the tensor 910 are to be selectively dropped out, and where individual feature elements comprises 32 bits; and FIG. 9B illustrates a mask 920 and a corresponding compressed mask 940 for implementing the dropout of feature elements of the tensor 910 of FIG. 9A. Referring to FIG. 9A, the layer 904 outputs the tensor 910 having feature elements arranged in a 4×32 array. Thus, there are four rows of feature elements. Each row of feature elements forms a corresponding vector, and accordingly, four vectors 922a, 922b, 922c, and 922d are formed corresponding to the four rows of feature elements.

In FIG. 9A, feature elements of only the first row (i.e., the feature elements of the vector 922a) are labelled, which includes feature elements F'0, F'1, . . . , F'31, generally referred to as F'i, where i varies from 0 to 31. In an embodiment, each feature element Fi is a multibit element, e.g., comprises 32 corresponding bits. Merely as an example, each feature element Fi is in INT32 data format, i.e., has 32 corresponding bits. In another example, each feature element Fi is in another appropriate 32-bit data format (e.g., which is supported by a PCU 935 discussed herein later), such as FP32 data format (e., which is an IEEE standard single-precision format). Example values of some of the feature elements (such as feature elements F'0, F'1, F'13, F'23, and F'27) are illustrated in FIG. 9A.

Referring now to FIG. 9B, illustrated is a mask 920 comprising a plurality of mask elements, for implementing selective dropout of feature elements of the tensor 910 of FIG. 9A. The mask elements of the mask 920 are also arranged in a 4×32 array (e.g., similar to the arrangement of feature elements of the tensor 910 of FIG. 9A). Thus, there are four rows 911a, 911b, 911c, 911d of mask elements.

In FIG. 9B, mask elements of only the first row 811a are illustrated, which includes mask elements C'0, C'1, . . . , C'31, generally referred to as C'i, where i varies from 0 to 31. Note that the labels using the capital letter --C'-- refer to the mask elements in the uncompressed form of the mask 920, whereas labels using the small letter --c'-- refer to compressed mask elements of a compressed mask 940.

In an example, each mask element of the mask 920 corresponds to a respective feature element of the tensor 910. For example, mask element C'0 dictates whether the corresponding feature element F'0 is to be dropped-out or retained, mask element C'1 dictates whether the corresponding feature element F'1 is to be dropped-out or retained, and so on, e.g., as discussed herein earlier with respect to FIGS. 6B-7C.

In an embodiment, each mask element C'i is a multibit element, e.g., comprises 32 corresponding bits. Merely as an example, each mask element C'i has a bit width that matches the bit width of the feature elements F'i of the tensor 910 (e.g., to maintain consistency of data, as discussed herein earlier with respect to FIGS. 6B-7C). Thus, in an example, each of the mask elements C'0, . . . , C'31 comprises corresponding 32 bits (i.e., has the same number of bits as the feature elements). In an example, each of the mask elements C'0, . . . , C'31 can be represented in INT32 data format (although another 32-bit data format can also be used for the mask elements). In an example, irrespective of the 32-bit data format used for the feature elements (e.g., INT32, FP32, or another appropriate 32 bit data format supported by the PCU 935), the mask elements C'0, . . . , C'31 are in INT32 data format. Example values of some of the mask elements are illustrated in FIG. 9B. Mask elements of the mask 920, which are circled, include 32 bits of zero, indicating that corresponding feature elements are to be dropped. In the example of FIG. 9B, mask elements C'0, C'3, C'8, C'13, C'17, C'20, C'25, and C'29 have all zero bits, indicating that corresponding feature elements F'0, F'3, F'8, F'13, F'17, F'20, F'25, and F'29 are to be dropped. Each of the remaining mask elements of the mask 920 has 32 bits, with a LSB of 1 and zeros as the remaining bits, indicating that the corresponding feature elements are not to be dropped (i.e., corresponding feature elements are to be retained during the dropout).

However, in other embodiments, other representations may be used for the mask elements to indicate which feature elements are to drop out. Merely as an example, in the INT32 format, 32 consecutive '1' bits may be used for a mask element to indicate that a corresponding feature element is to be dropped out; and 32 consecutive '0' bits may be used for a mask element to indicate that a corresponding feature element is to be retained (i.e., not dropped out). Generally, any two distinct values may be used to distinguish between mask elements that indicates corresponding feature elements should be dropped out and corresponding feature elements should be retained. These mask values may be compared against their respective constants, and the results of the comparison used to convert a mask element into the compressible format, or the mask element may be directly compressed by generating a single '1' or '0' bit as appropriate.

For ease of identification, in the mask 920, the mask elements C'0, C'2, C'4, . . . , C'30 are termed as "even" numbered mask elements, and the mask elements C'1, C'3, C'5, . . . , C'31 are termed as "odd" numbered mask elements. Thus, odd and even numbered mask elements are interleaved in the mask 920.

As discussed with respect to FIGS. 7A and 7B, the mask 920 of FIG. 9B is compressed, to generate a corresponding compressed mask 940, e.g., by compressing individual mask elements C'i to generate corresponding compressed mask elements c'i. For example, mask element C'0 is compressed to generate corresponding compressed mask element c'0, mask element C'1 is compressed to generate corresponding compressed mask element c'1, and so on. Thus, compressed mask elements c'0, c'1, . . . , c'31 are generated from mask elements C'0, C'1, . . . , C'31, respectively. During the compression, the LSB of each mask element (which can be either 1 or 0) is retained, and remaining bits (which are anyway zeros) are discarded. Thus, for example, mask element C'0 having a value of 000 . . . 000 is compressed to generate compressed mask element c'0 having a value of 0; mask element C'1 having a value of 000 . . . 001 is compressed to generate compressed mask element c'l having a value of 1; mask element C'31 having a value of 000 . . . 001 is compressed to generate compressed mask element c'31 having a value of 1; and so on, as illustrated in FIG. 9B.

The compressed mask 940 has four rows 915a, 915b, 915c, 915d, with each row having 32 compressed mask elements. For example, mask elements of the row 911a of the mask 920 are compressed to generate the compressed mask elements of the row 915a of the compressed mask 940; mask elements of the row 911b of the mask 920 are compressed to generate the compressed mask elements of the row 915b of the compressed mask 940, and so on.

Each of the compressed mask elements c'0, . . . , c'31 of the row 915a are also termed as either odd or even. For example, mask elements c'0, c'2, c'4, . . . , c'30 are even compressed mask element, and mask elements c'1, c'3, c'5, . . . , c'31 are odd compressed mask element.

Note that unlike FIG. 8B, in the example of FIG. 9B the compressed mask elements are not reordered or rearranged. Thus, the ordering of the mask elements C'31, C'30, C'29, . . . , C'1, C'0 of the mask 920 is preserved in the compressed mask elements of the compressed mask 940. For example, the compressed mask elements of the compressed mask 940 are arranged in the order c'31, c'30, c'29, . . . , c'1, c'0, where c'31 is the MSB of the row 915a. Thus, unlike FIG. 8B where the odd and even compressed mask elements were not interleaved in the compressed mask 840, the odd and even compressed mask elements are interleaved in the compressed mask 940 of FIG. 9B, reasons for which will be discussed herein in turn.

Thus, in the mask 920, the even and odd mask elements are interleaved; and in the compressed mask 940, the even and odd compressed mask elements are also interleaved.

The right-bottom corner of FIG. 9B illustrates the compressed mask row 940a, which includes example values of individual compressed mask elements c'31, c'30, c'29, . . . , c'3, c'2, c'1, c'0 of the first row 915a of the compressed mask 940. Merely as an example, the compressed mask row 940a is 11011101111011011101111011110110. Here, the LSB or bit 0 of the compressed mask row 940a is "0" corresponding to the compressed mask element c'0; the bit 1 of the compressed mask row 940a is "1" corresponding to the compressed mask element c'1; the bit 2 of the compressed mask row 940a is "1" corresponding to the compressed mask element c'2; the bit 30 of the compressed mask row 940a is "1" corresponding to the compressed mask element c'30; the bit 31 of the compressed mask row 940a is "1" corresponding to the compressed mask element c'31; and so on.

Thus, as illustrated, each row 915 of the compressed mask 940 has 32 bits, corresponding to the 32 mask elements of a row of the mask 920. In an example, each row 915 of the compressed mask 940 is in the INT32 data format. Thus, for example, the compressed mask row 940a having the 32 bits is in the INT32 data format (although another appropriate 32-bit data format can also be used). In an example, irrespective of the 32-bit data format used for the feature elements (e.g., INT32, FP32, or another appropriate 32-bit data format), each of rows 915a, . . . , 915d of the compressed mask 940 is in INT32 data format.

The size of the mask 920 is 32 columns×4 rows×32 bits=4096 bits, whereas the size of the compressed mask is 1 column×4 rows×32 bits=128 bits. Thus, a compression ratio of 32 is achieved.

Dropout of the feature elements of the vector 922a of the first row of the tensor 910 of FIG. 9A, using the compressed mask elements of the row 915a of the compressed mask 940, will be discussed herein in further detail below. Similar operations can be employed to implement dropout of the other vectors 922b, 922c, 922d of the tensor 910, as would be appreciated by those skilled in the art.

Figure 9C:
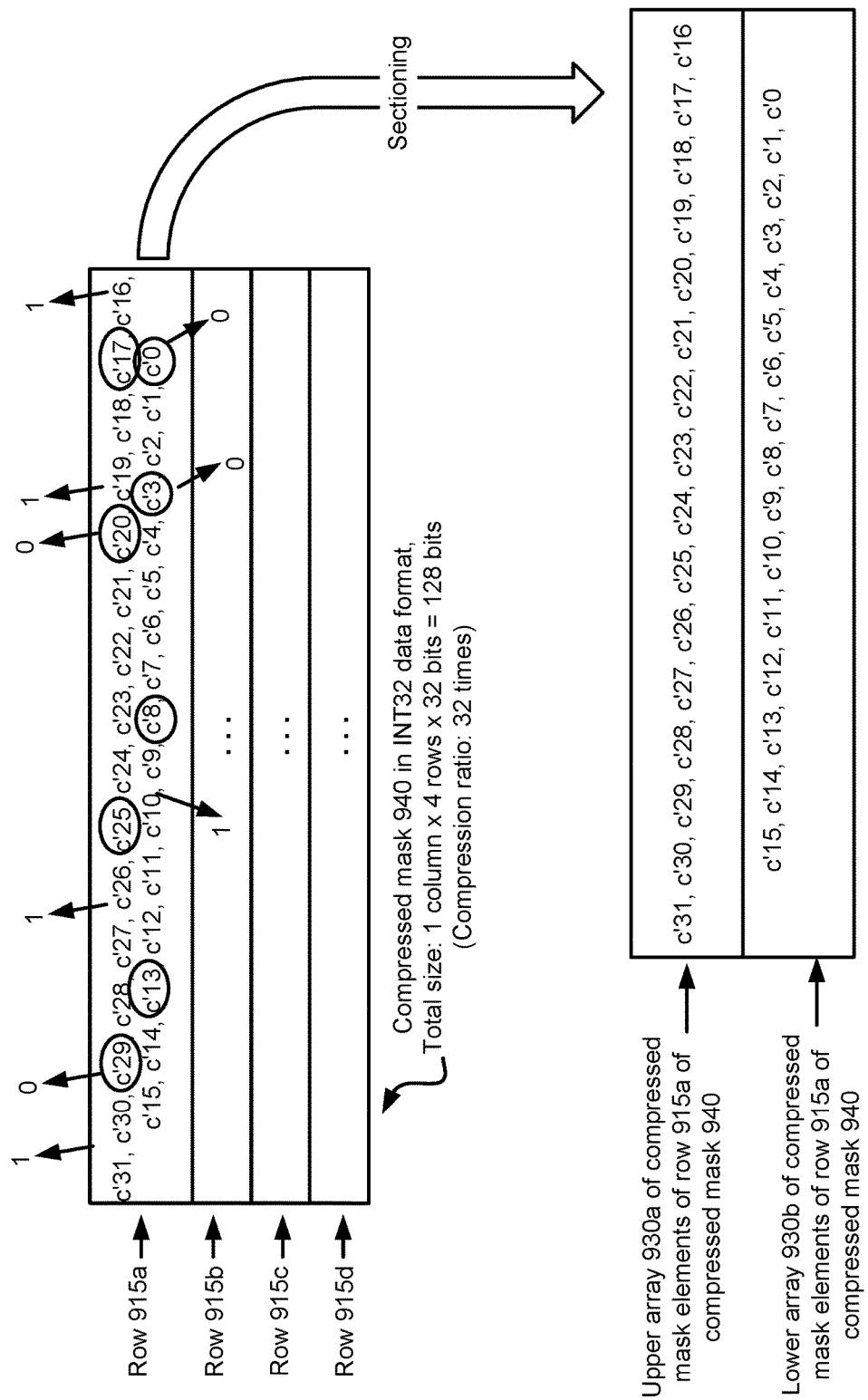
FIG. 9C illustrates sectioning a row of compressed mask elements in an upper array of compressed mask elements and a lower array of compressed mask elements.

FIG. 9C illustrates sectioning a row 915a of compressed mask elements in an upper array 930a of compressed mask elements and a lower array 930b of compressed mask elements. Thus, the 16 MSBs of the compressed mask elements in the row 915a are included in the upper array 930a, and the 16 LSBs of the compressed mask elements in the row 915a are included in the lower array 930b.

Note that in FIG. 8C, the upper array 830a only had odd compressed mask elements and the lower array 830b only had even compressed mask elements. In contrast, in FIG. 9C, the upper array 930a has odd and even interleaved compressed mask elements, and similarly, the lower array 930b has odd and even interleaved compressed mask elements.

Figure 9D:
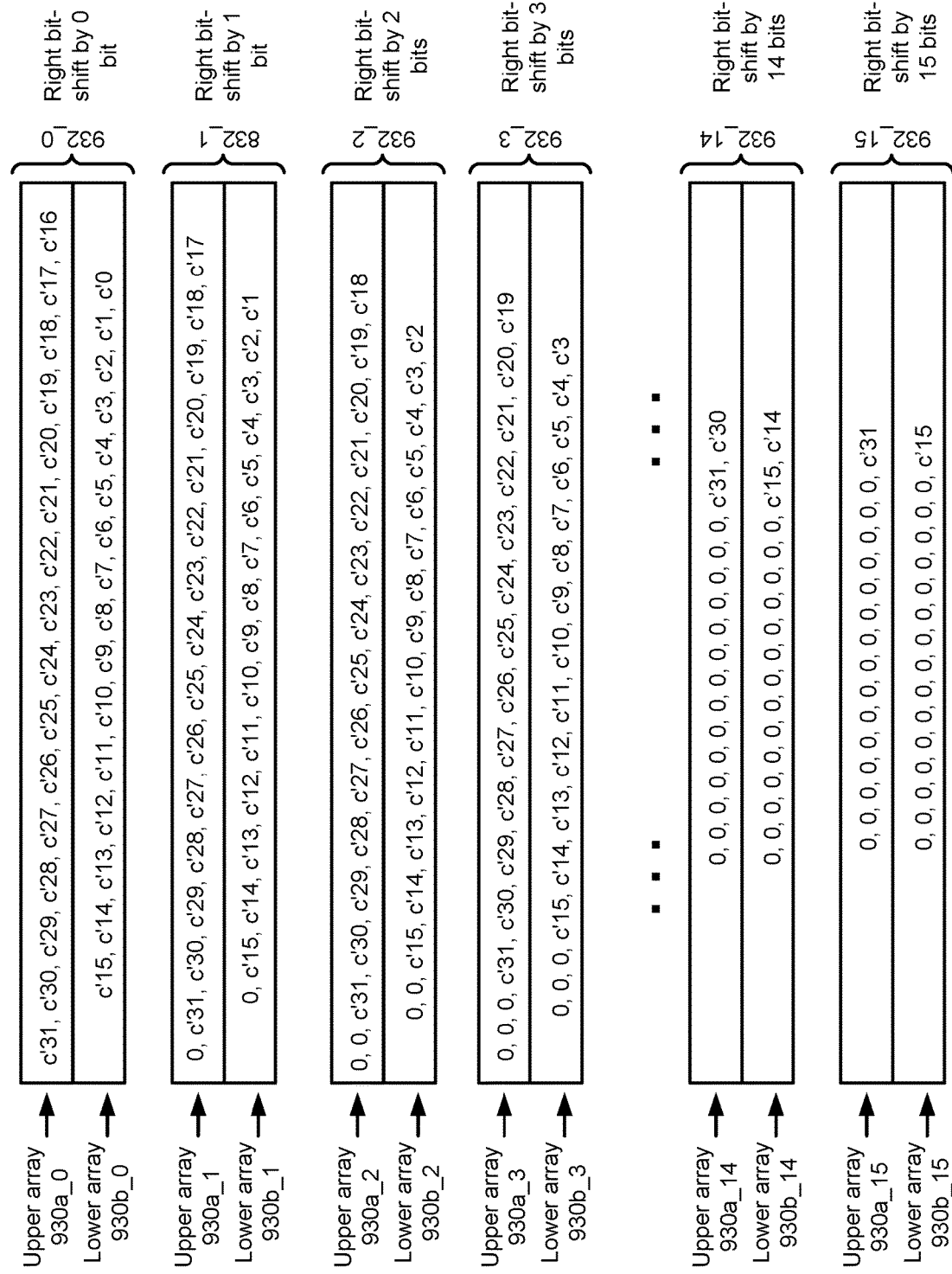
FIG. 9D illustrates selective logical right shifting of compressed mask elements in each of the upper array and the lower array of compressed mask elements of FIG. 9C.

FIG. 9D illustrates selective logical right shifting of compressed mask elements in each of the upper array 930a and the lower array 930b of compressed mask elements of FIG. 9C. For example, FIG. 9D illustrates multiple bit shifting examples 932, where in each example, the compressed mask elements are shifted by corresponding bit(s) towards the right.

Referring to example 932_0, the compressed mask elements are shifted by 0 bits towards the right, resulting in the modified upper array 930a_0 and the modified lower array 930b_0 of compressed mask elements. As the compressed mask elements are shifted by 0 bits (i.e., not shifted at all), the modified upper array 930a_0 and the lower array 930b_0 of compressed mask elements are same as the upper array 930a and the lower array 930b of compressed mask elements, respectively. Note that compressed mask elements c'0 and c'16 are the LSBs of the modified lower array 930b_0 and the modified upper array 930a_0, respectively.

Referring to example 932_1, the compressed mask elements are shifted by 1 bit towards the right, resulting in the modified upper array 930a_1 and the modified lower array 930b_1 of compressed mask elements. As the compressed mask elements are shifted by 1 bit, the modified upper array 930a_0 and the lower array 930b_0 of compressed mask elements are different from the upper array 930a and the lower array 930b of compressed mask elements, respectively. Note that compressed mask elements c'17 and c'1 are the LSBs of the modified lower array 930b_1 and the modified upper array 930a_1, respectively.

Various other example modified upper and lower arrays will be evident to those skilled in the art, based on the discussion above as well as the previous discussion with respect to FIG. 8D.

Generally speaking, in an example 832_i (where i varies from 0, . . . , 15), the compressed mask elements are shifted by i bits towards the right, resulting in the modified upper array 930a_i and the modified lower array 930b_i of compressed mask elements. As the compressed mask elements are shifted by i bits, compressed mask elements ci and c(i+16) are the LSBs of the modified lower array 930b_i and the modified upper array 930a i, respectively, as illustrated in FIG. 9D.

FIG. 9D1 illustrates a computing unit 935 configured to implement a first dropout cycle and a second dropout cycle on the tensor 910 output by the layer 904 of FIG. 9A. In an example, the computing unit 935 is a reconfigurable computing unit, such as a PCU discussed with respect to FIGS. 3, 4, and 7B, and hence, also referred to as PCU 935. In another example, a non-reconfigurable computing unit can also be used to implement the dropout, instead of a reconfigurable computing unit or a PCU. In an example, the PCU 935 of FIG. 9E can have similar configuration as the PCU 835 of FIG. 8E.

In an example, the PCU 935 comprises 16 lanes, 950_0, 950_1, . . . , 950_15 (also see FIG. 9E herein later). Each lane can simultaneously process 32 bits. Also, note that each of the feature elements F'0, F'31 of FIG. 9A comprises 32 bits. So, at a given dropout cycle, a lane 950_i (where i=0, . . . , 15) can handle at most one feature element. Note that in contrast, in FIGS. 8A-8G, each of the feature elements F0, . . . , F31 was 16 bits, and hence, each lane 850_i processed corresponding two feature elements during a given dropout cycle, as discussed with respect to FIGS. 8F-8G.

Thus, in FIG. 9D1, there are 16 lanes 950_0, 950_1, . . . , 950_15, with each lane being able to process a single 32 bit feature element at a given dropout cycle. Also, a vector 922 of feature element (see FIG. 9A) includes 32 number of feature elements F'0, F'31. Accordingly, as illustrated in FIG. 9D1, two dropout cycles are implemented to selectively dropout the 32 features elements.

For example, a first dropout cycle is implemented by the PCU 935, to selective dropout of one or more of the feature elements F'0, F'1, F'2, F'14, F'15, while retaining remaining of these feature elements, based respectively on the compressed mask elements c'0, c'1, c'2, c'14, c'15 included in the lower array 930b of compressed mask elements. During the first dropout cycle, the PCU 935 receives the lower array 930b of compressed mask elements c'15, c'14, . . . , c'1, c'0, and also receives the first 16 feature elements F'0, F'1, F'2, F'14, F'15, and performs dropout operations on these feature elements. The first dropout operation will be discussed herein in further detail in turn with respect to FIGS. 9E-9G.

Subsequent to the first dropout cycle, a second dropout cycle is implemented by the PCU 935, to selective dropout of one or more of the feature elements F'16, F'17, F'18, F'30, F'31, while retaining remaining of these feature elements, based respectively on the compressed mask elements c'16, c'17, c'18, . . . , c'30, c'31 included in the upper array 930a of compressed mask elements. During the second dropout cycle, the PCU 935 receives the upper array 930a of compressed mask elements c'31, c'30, . . . , c'17, c'16, and also receives the last 16 feature elements F'16, F'17, F'18, . . . , F'30, F'31, and performs dropout operations on these feature elements.

Various subsequent figures herein discuss the first dropout cycle in further detail. The second dropout cycle would be evident to those skilled in the art, based on the discussion of the first dropout cycle.

Figure 9E:
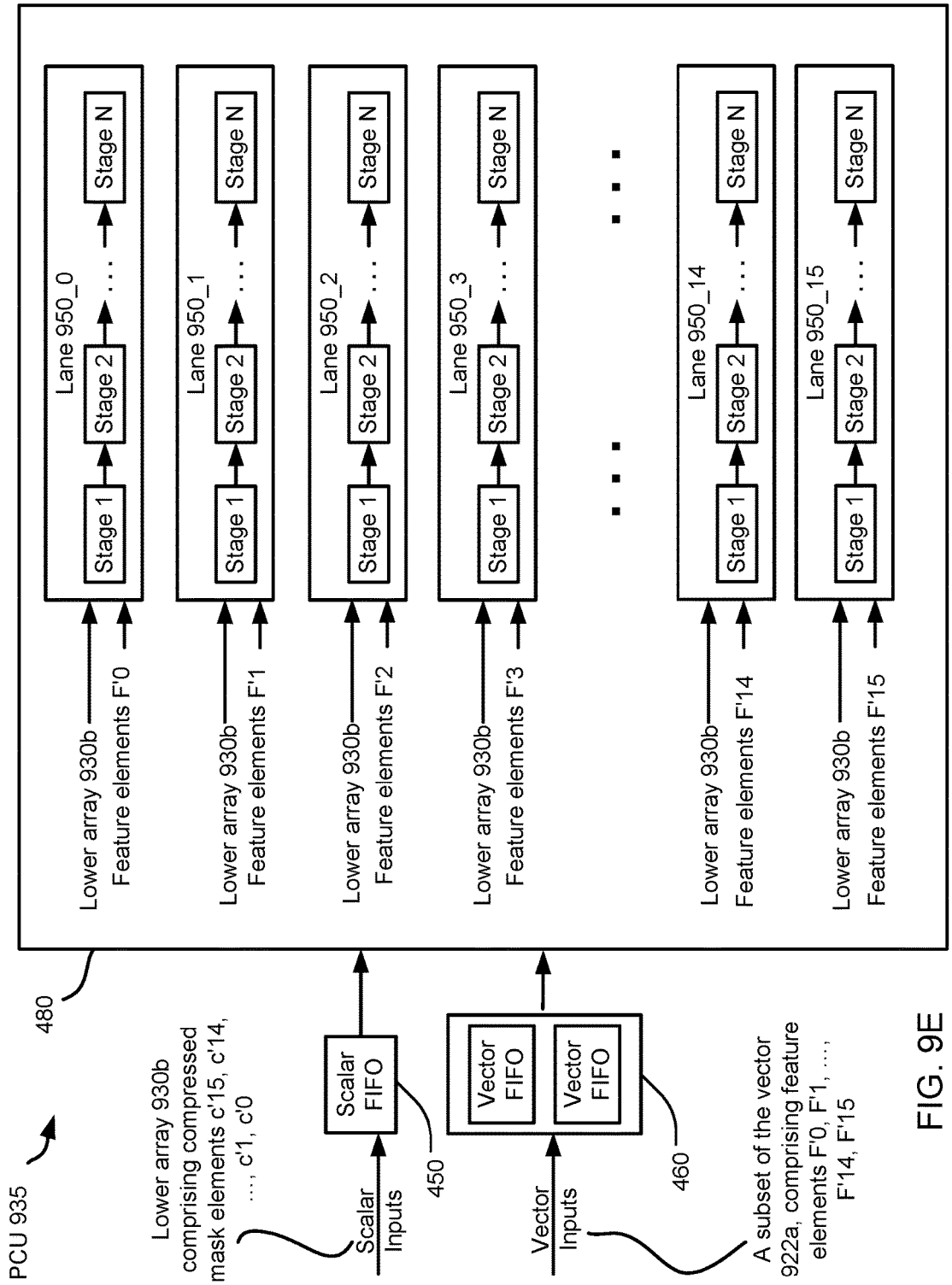
FIG. 9E illustrates a computing unit configured to implement a first dropout cycle on a subset of feature elements of the tensor output by the layer of FIG. 9A.

FIG. 9E illustrates a computing unit 935 (such as the PCU 935) configured to implement a first dropout cycle on feature elements F'0, F'1, F'2, . . . , F'14, F'15 of the tensor 910 output by the layer 904 of FIG. 9A.

Figure 9F:
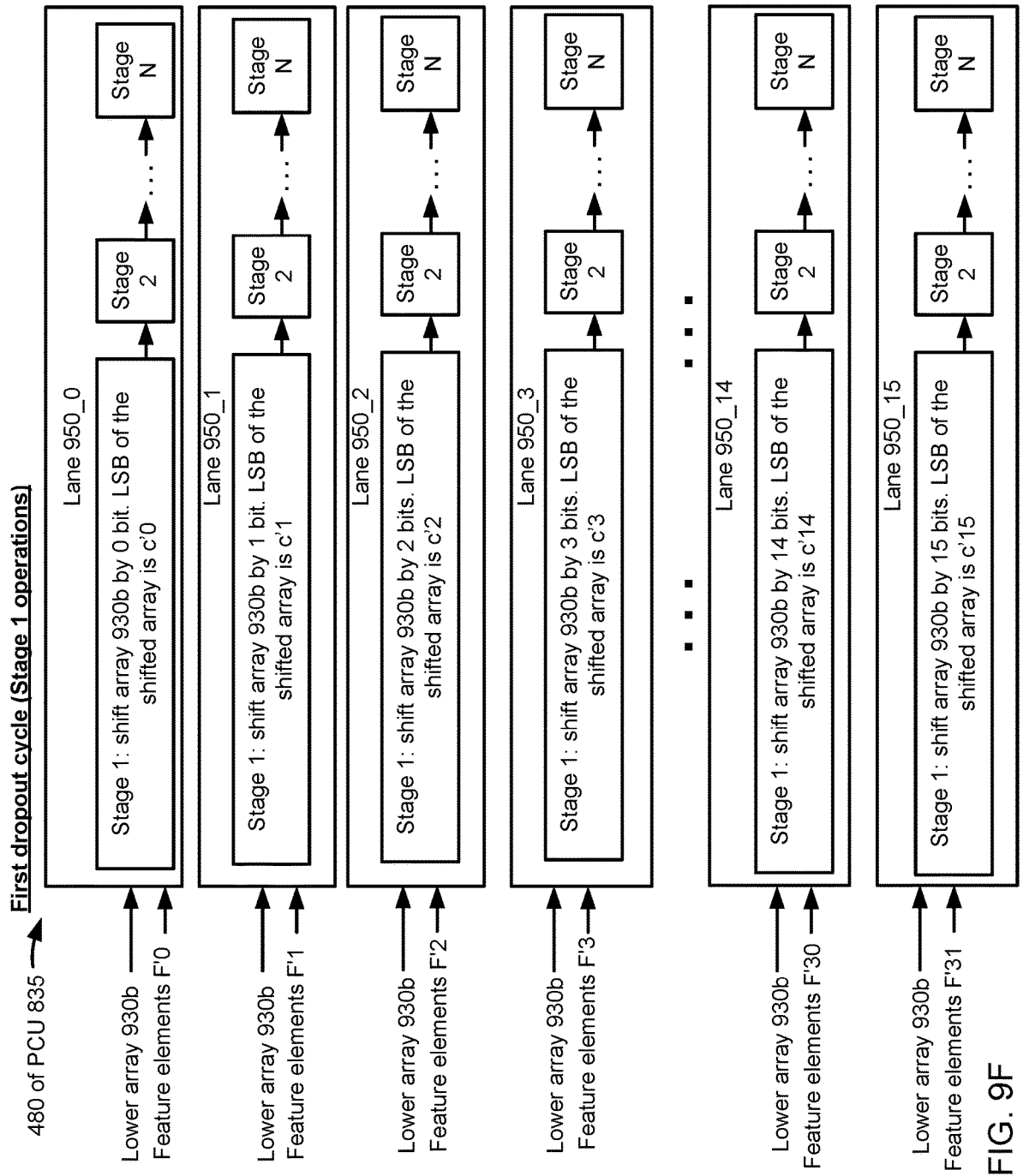
FIG. 9F illustrates logical right shift operations of the lower array of the compressed mask within the computing unit of FIG. 9E during the first dropout cycle.
Figure 9G:
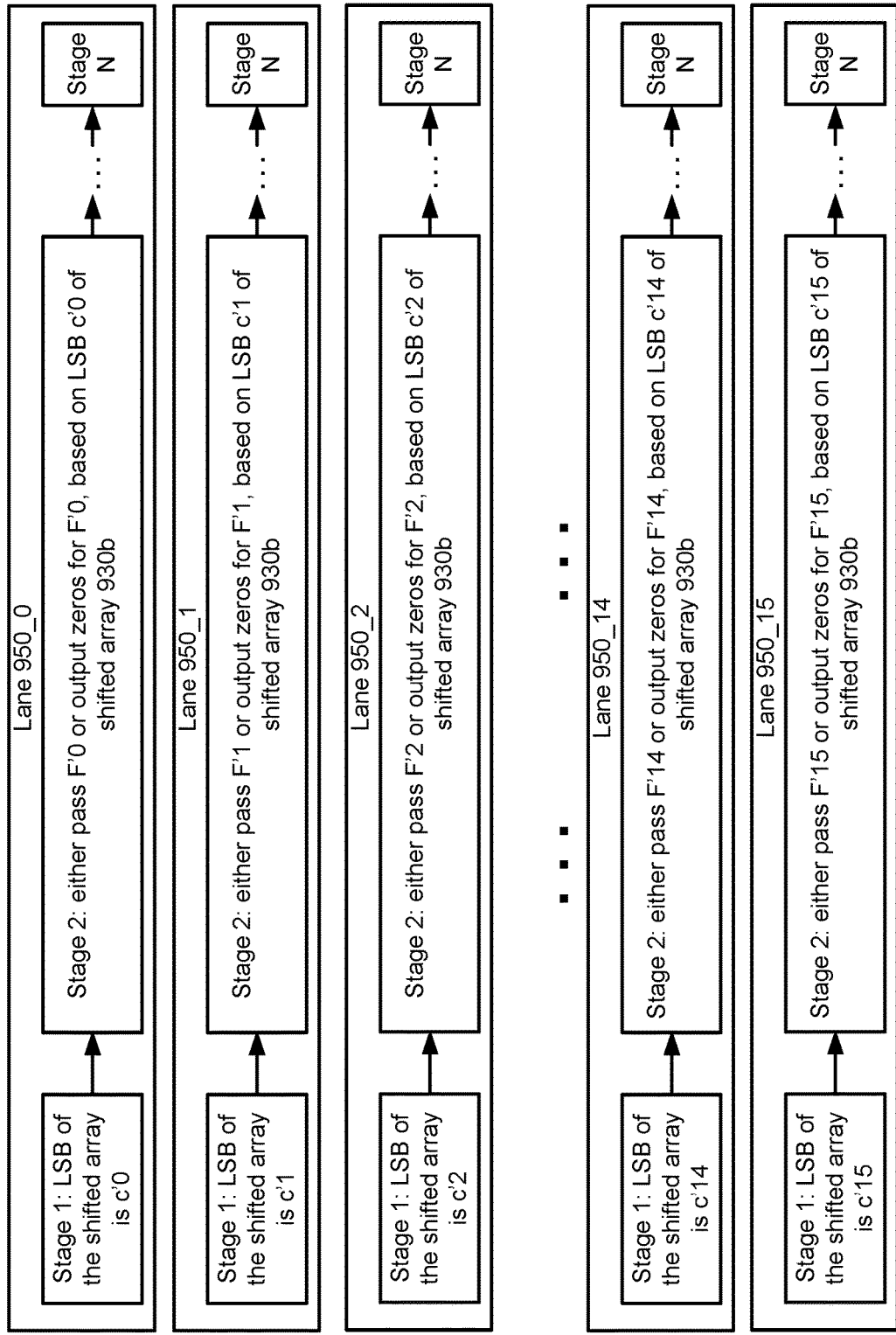
FIG. 9G illustrates dropout operations of a subset of the feature elements of the tensor of FIG. 9A during the first dropout cycle.

In an example, the tensor 910 of FIG. 9A has multiple rows of feature elements. The PCU 935 processes individual rows at a time, to implement the dropout of individual rows. For example, for each row, the PCU 935 employs (i) a corresponding first dropout cycle to perform selective dropout of a first subset of feature elements of the row, and (i) a corresponding second dropout cycle to perform selective dropout of a second subset of feature elements of the row. FIGS. 9E, 9F, and 9G are specifically directed to the first dropout cycle for the first subset of feature elements of the first row comprising the vector 922a of the tensor 910 of FIG. 9A. The second dropout cycle for the second subset of feature elements of the first row comprising the vector 922a of the tensor 910 of FIG. 9A will be evident to those skilled in the art, based on the discussion with respect to the first dropout cycle.

Referring now to the first dropout cycle for the first subset of feature elements of the first row of feature elements illustrated in FIG. 9E, the scalar FIFO 450 sequentially receives the lower array 930b of the compressed mask elements c'15, c'14, . . . , c'1, c'0 (note that the scalar FIFO 450 will receive, during the second dropout cycle, the upper array 930b of the compressed mask elements c'31, c'30, . . . , c'17, c'16, although the second dropout cycle is not illustrated in any subsequent figures).

The vector FIFO 460 receives, during the first dropout cycle illustrated in FIG. 9E, a first subset of the vector 922a comprising the feature elements F'0, F'1, F'2, . . . , F'14, F'15 (note that the vector FIFO 460 will receive, during the second dropout cycle, a second subset of the vector 922a comprising the feature elements F'16, F'17, F'18, . . . , F'30, F'31, although the second dropout cycle occurring subsequent to the first dropout cycle is not illustrated in any subsequent figures).

In an embodiment and as discussed with respect to FIG. 8E, the PCU 935 of FIG. 9E includes multiple reconfigurable datapaths in block 480. The block 480 comprises a plurality of lanes 950_0, 950_1, . . . , 950_15. Thus, each lane is associated with a corresponding lane number i, where i varies from 0, . . . , 15. As discussed, each lane 950 includes corresponding reconfigurable datapath comprising a plurality of stages 1, . . . , N. Merely as an example, there may be 6 stages in each lane. As will be discussed herein in turn, stage 1 of each lane is used for right shifting the corresponding array 930 of the compressed mask elements (e.g., during the first dropout cycle, lower array 930b of the compressed mask elements are shifted, as illustrated in FIG. 9F; and during the subsequent second dropout cycle, upper array 930a of the compressed mask elements are shifted). Stage 2 of each lane is used to implement the selective dropout. Remaining stages of the lanes can be used to implement one or more other appropriate functions. Examples of such function include, but are not limited to, non-linearities like ReLU and its variants (e.g., leaky ReLU), convolution, transpose convolution, hyperbolic tangent, sigmoid, and softmax, element-wise addition, matrix multiplication (e.g., GeMM), layer normalization (e.g., batch normalization), loss functions like cross-entropy, and tensor shape modifiers like transpose.

As illustrated in FIG. 9E, in an example, during the first dropout cycle, the lower array 930b of the compressed mask elements of row 915a of the compressed mask 940 are broadcast to each of the 16 lanes 950_0, . . . , 950_15.

As discussed herein earlier, each lane 950 can process, at a given dropout cycle, 32 bits of feature elements. Also, each feature element F'i (i=1, . . . , 32) is 32 bits. Accordingly, each lane 950 can process one corresponding feature element during a dropout cycle. Thus, each lane 850_i (where i=0, . . . , 15) receives a corresponding feature element of subset of the vector 822a of the tensor 810 received by the vector FIFO 460. For example, lane 950_0 receives feature element F'0; lane 950_1 receives feature element F'1; lane 950_2 receives feature element F'2; lane 950_14 receives feature element F'14; lane 950_15 receives feature element F'15; and so on.

Note that although not illustrated, in the second dropout cycle that will be performed after the first dropout cycle, lane 950_0 will receive feature element F'16; lane 950_1 will receive feature element F'17; lane 950_15 will receive feature element F'31; and so on.

FIG. 9F illustrates logical right shift operations of the lower array 930b of the compressed mask 940 within the computing unit 835 of FIG. 9E during the first dropout cycle. The logical right shift operations occur in the first stage of each lane. FIG. 9F merely illustrates the block 480 of the computing unit 935, and other components of the computing unit 935 are not illustrated in FIG. 9F for purposes of illustrative clarity.

In FIG. 9F, in stage 1 of each lane 950_i (where i is 0, . . . , 15), the lower array 930b of the compressed mask 940 is right shifted by i bits. For example, in stage 1, the lane 950_0 logically right shifts the lower array 930b of the compressed mask 940 by 0 bits; in stage 1, the lane 950_1 logically right shifts the lower array 930b of the compressed mask 940 by 1 bit; in stage 1, the lane 950_2 logically right shifts the lower array 930b of the compressed mask 940 by 2 bits; in stage 1, the lane 950_15 logically right shifts the lower array 930b of the compressed mask 940 by 15 bits; and so on.

Logical right shifting the lower array 930b of compressed mask elements by i bits (i varying between 0, . . . , 15) is discussed with respect to FIG. 9D. Thus, referring to FIGS. 9D and 9F, LSB of the shifted lower array 930b (which is shifted by 0 bits) in the lane 950_0 is c'0. Similarly, LSB of the shifted lower array 930b (which is shifted by 1 bit) in the lane 950_1 is c'1. Similarly, LSB of the shifted lower array 930b (which is shifted by 15 bits) in the lane 950_15 is c'15. Generally, during the first dropout cycle, LSB of the shifted lower array 930b (which is shifted by i bits) in the lane 950_i is c'i.

FIG. 9G illustrates dropout operations of the feature elements F'0, F'1, . . . , F15 of the tensor 910 of FIG. 9A, using the shifted lower array 930b of the compressed mask 940 during the first dropout cycle, within the computing unit 935 of FIGS. 9E and 9F.

For example, as discussed with respect to FIG. 9E, the lane 950_0 receives feature element F'0. As discussed with respect to FIG. 9F, LSB of the shifted lower array 930b is c'0. The second stage of lane 950_0 uses the LSB of the shifted lower array 930b (i.e., compressed mask element c'0) to determine whether to pass the original feature element F'0 to the next stage (i.e., not perform dropout of feature element F'0), or pass all zeros to the next stage (i.e., perform dropout of feature element F'0). Similarly, the second stage of lane 950_1 uses the LSB of the shifted lower array 930b (i.e., compressed mask element c'1) to determine whether to pass the original feature element F'1 to the next stage (i.e., not perform dropout of feature element F'1), or pass all zeros to the next stage (i.e., perform dropout of feature element F'1). This process continues for all other lanes, and selective dropout is performed on the feature elements F'1, F'1, . . . , F'15 during the first dropout cycle.

Although not illustrated, subsequent to the first dropout cycle, the second dropout cycle is implemented by the PCU 935, to selective dropout of one or more of the feature elements F'16, F'17, F'18, . . . , F'30, F'31, while retaining remaining of these feature elements, based respectively on the compressed mask elements c'16, c'17, c'18, . . . , c'30, c'31 included in the upper array 930a of compressed mask elements. During the second dropout cycle, the PCU 935 receives the upper array 930a of compressed mask elements c'31, c'30, . . . , c'17, c'16, and also receives the last 16 feature elements F'16, F'17, F'18, . . . , F'30, F'31, and performs dropout operations on these feature elements, e.g., similar to the first dropout cycle discussed with respect to FIGS. 9E-9G.

We disclose the following clauses:

Clause Set 1

1. A method for selectively dropping out feature elements from a tensor, the method comprising:

generating a mask comprising a plurality of mask elements, wherein each mask element of the plurality of mask elements includes a corresponding plurality of bits representing either a first value or a second value, wherein the first value of a first mask element indicates that a corresponding first feature element of the tensor output by a neural network layer is to be dropped out, and wherein the second value of a second mask element indicates that a corresponding second feature element of the tensor is not to be dropped out;

compressing each mask element of the plurality of mask elements of the mask to generate a corresponding compressed mask element of a plurality of compressed mask elements of a compressed mask, thereby generating the compressed mask from the mask, wherein each compressed mask element of the plurality of compressed mask elements includes a corresponding single bit;

storing the compressed mask in a memory; and selectively dropping out feature elements from the tensor, based on the compressed mask.

2. The method of claim 1, wherein:

the first value represents one of logical zero or logical one, and the second value represents another of logical zero or logical one.

2A. The method of claim 1, wherein:

each of the first value and the second value includes all zeros for all bits, except for a corresponding Least Significant Bit (LSB); and a LSB of the first value is one of zero or a one, and a LSB of the second value is another of zero or one.

2B. The method of claim 1, wherein:

the first value represents a logical zero, and the second value represents a logical one.

3. The method of claim 1, wherein further comprising:

grouping the plurality of compressed mask elements of the compressed mask in a first array of compressed mask elements and a second array of compressed mask elements, wherein selectively dropping out feature elements from the tensor comprises:

during a first dropout cycle, using the first array of compressed mask elements to selectively dropout feature elements from a first subset of feature elements of the tensor, and during a first second cycle, using the second array of compressed mask elements to selectively dropout feature elements from a second subset of feature elements of the tensor, the second subset being different from the first subset.

4. The method of claim 3, wherein during the first dropout cycle, using the first array of compressed mask elements to selectively dropout feature elements from the first subset comprises:

during the first dropout cycle, transmitting, to each of N lanes of a computing unit, (i) the first array of compressed mask elements and (ii) a corresponding feature element of the first subset, such that at lane i (where i=0, . . . , (N−1)), a feature element Fi is transmitted;

right shifting, at each lane i, the first array of compressed mask elements by i number of bits; and either dropping or retaining the feature element Fi at the lane i, based on a Least Significant Bit (LSB) of a right-shifted first array at the lane i.

5. The method of claim 4, further comprising:

at lane 0 (i.e., i=0), dropping the feature element F0, based on the LSB of a first right-shifted first array at the lane 0 having a first value, where first right-shifted first array at the lane 0 is generated by right shifting the first array by 0 bit;

at lane 1 (i.e., i=1), retaining the feature element F1, based on the LSB of a second right-shifted first array at the lane 1 having a second value that is different from the first value, where second right-shifted first array at the lane 1 is generated by right shifting the first array by 1 bit; and at lane 2 (i.e., i=2), retaining the feature element F2, based on the LSB of a third right-shifted first array at the lane 2 having the second value, where third right-shifted first array at the lane 2 is generated by right shifting the first array by 2 bits.

6. The method of claim 4, wherein during the second dropout cycle, using the second array of compressed mask elements to selectively dropout feature elements from the second subset comprises:

during the second dropout cycle, transmitting, to each of the N lanes of the computing unit, (i) the second array of compressed mask elements and (ii) a corresponding feature element of the second subset, such that at lane i (where i=0, . . . , (N−1)), a feature element F(i+N) is received;

during the second dropout cycle, right shifting, at each lane i, the second array of compressed mask elements by i number of bits; and during the second dropout cycle, either dropping or retaining the feature element F(i+N) at the lane i, based on a LSB of a right-shifted second array at the lane i.

7. The method of claim 5, further comprising, during the second dropout cycle, at lane 0 (i.e., i=0), perform one of:

dropping the feature element F(0+N), in response to the LSB of a first right-shifted second array at the lane 0 having the first value, where first right-shifted second array at the lane 0 is generated by right shifting the second array by 0 bit, or retaining the feature element F(0+N), in response to the LSB of the first right-shifted second array at the lane 0 having the second value.

8. The method of claim 1, wherein generating the mask comprises:

arranging the plurality of mask elements in a first order in the mask, wherein the plurality of compressed mask elements is arranged in a second order in the compressed mask, the second order being different from the first order.

8a. The method of claim 8, wherein:

the plurality of mask elements is arranged in the first order in the mask, such that the first mask element and the second mask element are consecutive mask elements in the mask;

the first mask element and the second mask element are compressed to respectively generate a first compressed mask element and a second compressed mask element; and the plurality of compressed mask elements is arranged in the second order in the compressed mask, such that the first compressed mask element and the second compressed mask element are non-consecutive compressed mask elements in the compressed mask.

8b. The method of claim 8a, wherein:

the first compressed mask element and the second compressed mask element are separated by one or more third compressed mask elements in the compressed mask.

8c. The method of claim 1, wherein:

the plurality of mask elements of the mask comprises (i) a plurality of even mask elements and (ii) a plurality of odd mask elements, such that even and odd mask elements are arranged in an interleaved manner in the mask, wherein compressing each mask element includes:

compressing each of the plurality of even mask elements to generate a corresponding compressed even mask element of a plurality of compressed even mask elements, and compressing each of the plurality of odd mask elements to generate a corresponding compressed odd mask element of a plurality of compressed odd mask elements, wherein the plurality of compressed mask elements includes (i) the plurality of compressed even mask elements and (ii) the plurality of compressed odd mask elements, and consecutively arranging the plurality of compressed even mask elements in the compressed mask, and consecutively arranging the plurality of compressed odd mask elements in the compressed mask.

8d. The method of claim 8c, further comprising:
forming a first array of compressed mask elements comprising the consecutively arranged compressed even mask elements; and
forming a second array of compressed mask elements comprising the consecutively arranged compressed odd mask elements.

8e. The method of claim 8d, wherein the first array of compressed mask elements excludes any compressed odd mask element, and the second array of compressed mask elements excludes any compressed even mask element.

8f. The method of claim 8d, wherein the feature elements of the tensor comprise a plurality of even feature elements and a plurality of odd feature elements, and wherein selectively dropping out the feature elements from the tensor comprises:
selectively dropping out one or more of the plurality of even feature elements, based on the first array; and
selectively dropping out one or more of the plurality of odd feature elements, based on the second array.

8g. The method of claim 8d, wherein:
the tensor includes 2N number of feature elements that includes a plurality of even feature elements and a plurality of odd feature elements, where N is a positive integer;
a computing unit includes N number of lanes to implement the selective dropping out, such that each lane of the N number of lanes processes a corresponding even feature element and a corresponding odd feature element; and
selectively dropping out feature elements from the tensor comprises:
receiving, at a lane i (where i=0, . . . , (N−1)) of the computing unit, (i) a corresponding even feature element 2i and a corresponding odd feature element (2i+1), (ii) the first array of compressed mask elements, and (iii) the second array of compressed mask elements, and
selectively dropping, at the lane i, none, at least one, or both the even feature element 2i and the odd feature (2i+1), based on the first array of compressed mask elements and the second array of compressed mask elements.

8h. The method of claim 8g, wherein selectively dropping, at the lane i, none, at least one, or both the even feature element 2i and the odd feature (2i+1) comprises:
logically right shifting, at the lane i of the computing unit, (i) the first array of compressed mask elements to generate a shifted first array of compressed mask elements and (ii) the second array of compressed mask elements to generate a shifted second array of compressed mask elements;
dropping, at the lane i, the even feature element 2i if a Least Significant Bit (LSB) of the shifted first array of compressed mask elements is a zero; and
dropping, at the lane i, the odd feature element (2i+1) if a LSB of the shifted second array of compressed mask elements is a zero.

8i. The method of claim 8h, wherein logically right shifting, at the lane i of the computing unit, the first array of compressed mask elements and the second array of compressed mask elements comprises:
logically right shifting, at the lane i of the computing unit, (i) the first array of compressed mask elements by i number of bits and (ii) the second array of compressed mask elements by i number of bits.

9. The method of claim 4, wherein:
each of the N lanes simultaneously processes K bits of feature elements, where K is a positive integer; and
each feature element has K bits, such that during a specific dropout cycle, each lane processes one corresponding feature element.

10. The method of claim 9, wherein:
each feature element has 32 bits (i.e., K=32); and
each mask element of the plurality of mask elements of the mask comprises corresponding 32 bits.

11. The method of claim 1, wherein selectively dropping out the feature elements from the tensor comprises:
dropping out the first feature element from the tensor, such that a zero value of the first feature element in the tensor is propagated to a subsequent neural network layer receiving the tensor; and
refraining from dropping out the second feature element from the tensor, such that an original value of the second feature element in the tensor is retained and propagated to the subsequent neural network layer receiving the tensor.

12. The method of claim 1, wherein:
generating the mask comprises generating the mask in a general-purpose hardware;
compressing each mask element comprises compressing each mask element in the general-purpose hardware;
storing the compressed mask in the memory comprises storing the compressed mask in a reconfigurable on-chip memory; and
selectively dropping out feature elements from the tensor comprises:
transferring the mask from the reconfigurable on-chip memory to a reconfigurable on-chip computing unit, and
selectively dropping out feature elements from the tensor in the reconfigurable on-chip computing unit, wherein the reconfigurable on-chip computing unit and the reconfigurable on-chip memory unit are within an Integrated Circuit (IC) chip.

13. The method of claim 12, wherein storing the compressed mask in the reconfigurable on-chip memory comprises:
storing the compressed mask in an off-chip memory, and transferring the compressed mask from the off-chip memory to the reconfigurable on-chip memory, wherein the off-chip memory is external to the IC.

14. The method of claim 1, wherein generating the mask comprises:
receiving an indication of a percentage of a plurality of feature elements of the tensor that are to be dropped;
randomly or pseudo-randomly selecting a subset of the plurality of feature elements of the tensor, the subset being the indicated percentage of the plurality of feature elements of the tensor; and
generating the mask comprising the plurality of mask elements, based on the randomly or pseudo-randomly selected subset of the plurality of feature elements.

14a. The method of claim 14, wherein a subset of the plurality of mask elements includes the first value indicating that the corresponding subset of the plurality of feature elements of the tensor are to be dropped, the subset of the plurality of mask elements being the percentage of the plurality of mask elements.

14b. The method of claim 1, wherein each mask element of the plurality of mask elements of the mask comprises a number of bits that is equal to a number of bits in each feature element of the tensor.

14c. The method of claim 1, wherein selectively dropping out feature elements from the tensor comprises:
selectively dropping out, based on the compressed mask, feature elements from the tensor output by the neural network layer that is on a forward path of a neural network topology, wherein the method further comprises selectively dropping out, based on the compressed mask, feature elements from another tensor output by another neural network layer that is on a backpropagation path of the neural network topology.

15. A data processing system, comprising:
general hardware to (i) generate a mask comprising a plurality of multi-bit mask elements, and (ii) compress the mask to generate a compressed mask comprising a plurality of single-bit compressed mask elements;
a bus system to transmit the compressed mask from the general hardware to reconfigurable hardware; and
the reconfigurable hardware to selectively drop out feature elements of a tensor, based on the compressed mask.

16. The data processing system of claim 15, wherein:
each mask element of the plurality of mask elements of the mask comprises a number of bits that is equal to a number of bits in each feature element of the tensor.

17. A data processing system, comprising:
a bus system; and
reconfigurable hardware to receive, over the bus system, a mask comprising a plurality of mask element arranged in an array, wherein the reconfigurable hardware comprises a reconfigurable computing unit comprising a plurality of lanes,
wherein each lane of the plurality of lanes is to (i) receive a corresponding feature element of a tensor and the array, (ii) shift the array by a corresponding number of bits, to generate a shifted array, and (iii) selectively drop or retain the corresponding received feature element of the tensor, based on a Least Significant Bit (LSB) of the corresponding shifted array.

18. The data processing system of claim 17, wherein a first lane of the plurality of lanes is to shift the array by a first number of bits that is different from a second number of bits by which the array is shifted by a second lane of the plurality of lanes.

19. A method for selectively dropping out feature elements from a tensor, the method comprising:
generating a mask comprising a plurality of multi-bit mask elements;
compressing each multi-bit mask element of the plurality of mask elements of the mask to generate a corresponding single-bit compressed mask element of a plurality of compressed mask elements of a compressed mask, thereby generating the compressed mask from the mask;
storing the compressed mask in a memory; and
selectively dropping out feature elements from the tensor, based on the compressed mask.

20. The method of claim 19, further comprising:
determining wherever to drop out a feature or retain the feature of the tensor, based on a corresponding compressed mask element of the plurality of compressed mask elements of the compressed mask.

Clause Set 2

1. A method for selectively dropping out feature elements from a tensor, the method comprising:
generating a mask comprising a plurality of mask elements arranged in a first order;
generating a compressed mask comprising a plurality of compressed mask elements arranged in a second order that is different from the first order, wherein generating the compressed mask comprises compressing each mask element of the plurality of mask elements of the mask to generate a compressed mask element of the plurality of compressed mask elements of the compressed mask, wherein individual compressed mask element of the plurality of compressed mask elements is indicative of whether a corresponding feature element of the tensor output by a neural network layer is to be dropped out or retained; and
selectively dropping out feature elements from the tensor, based on the compressed mask.

2. The method of claim 1, wherein:
the plurality of mask elements is arranged in the first order in the mask, such that a first mask element and a second mask element are consecutive mask elements in the mask;
the first mask element and the second mask element are compressed to respectively generate a first compressed mask element and a second compressed mask element; and
the plurality of compressed mask elements is arranged in the second order in the compressed mask, such that the first compressed mask element and the second compressed mask element are non-consecutive compressed mask elements in the compressed mask.

3. The method of claim 2, wherein:
the first compressed mask element and the second compressed mask element are separated by one or more third compressed mask elements in the compressed mask.

4. The method of claim 1, wherein:
the plurality of mask elements of the mask comprises (i) a plurality of even mask elements and (ii) a plurality of odd mask elements, such that even and odd mask elements are arranged in an interleaved manner in the mask,
wherein generating the compressed mask comprises:
compressing each of the plurality of even mask elements to generate a corresponding compressed even mask element of a plurality of compressed even mask elements, and
compressing each of the plurality of odd mask elements to generate a corresponding compressed odd mask element of a plurality of compressed odd mask elements, wherein the plurality of compressed mask elements includes (i) the plurality of compressed even mask elements and (ii) the plurality of compressed odd mask elements, and
consecutively arranging the plurality of compressed even mask elements in the compressed mask, and consecutively arranging the plurality of compressed odd mask elements in the compressed mask.

5. The method of claim 4, further comprising:
forming a first array of compressed mask elements comprising the consecutively arranged compressed even mask elements; and
forming a second array of compressed mask elements comprising the consecutively arranged compressed odd mask elements.

6. The method of claim 5, wherein the first array of compressed mask elements excludes any compressed odd mask element, and the second array of compressed mask elements excludes any compressed even mask element.

7. The method of claim 5, wherein the feature elements of the tensor comprise a plurality of even feature elements and a plurality of odd feature elements, and wherein selectively dropping out the feature elements from the tensor comprises:
selectively dropping out one or more of the plurality of even feature elements, based on the first array; and
selectively dropping out one or more of the plurality of odd feature elements, based on the second array.

8. The method of claim 7, wherein:
the tensor includes 2N number of feature elements that includes a plurality of even feature elements and a plurality of odd feature elements, where N is a positive integer; and
a computing unit includes N number of lanes to implement the selective dropping out, such that each lane of the N number of lanes processes a corresponding even feature element and a corresponding odd feature element.

9. The method of claim 8, wherein selectively dropping out feature elements from the tensor comprises:

receiving, at a lane i (where i=0, . . . , (N−1)) of the computing unit, (i) a corresponding even feature element 2i and a corresponding odd feature element (2i+1), (ii) the first array of compressed mask elements, and (iii) the second array of compressed mask elements; and selectively dropping, at the lane i, none, at least one, or both the even feature element 2i and the odd feature (2i+1), based on the first array of compressed mask elements and the second array of compressed mask elements.

10. The method of claim 9, wherein selectively dropping, at the lane i, none, at least one, or both the even feature element 2i and the odd feature (2i+1) comprises:

logically right shifting, at the lane i of the computing unit, (i) the first array of compressed mask elements to generate a shifted first array of compressed mask elements and (ii) the second array of compressed mask elements to generate a shifted second array of compressed mask elements;

dropping, at the lane i, the even feature element 2i if a Least Significant Bit (LSB) of the shifted first array of compressed mask elements is a zero; and dropping, at the lane i, the odd feature element (2i+1) if a LSB of the shifted second array of compressed mask elements is a zero.

11. The method of claim 10, wherein logically right shifting, at the lane i of the computing unit, the first array of compressed mask elements and the second array of compressed mask elements comprises:

logically right shifting, at the lane i of the computing unit, (i) the first array of compressed mask elements by i number of bits and (ii) the second array of compressed mask elements by i number of bits.

12. The method of claim 1, wherein selectively dropping out the feature elements from the tensor comprises:

dropping out the first feature element from the tensor, such that a zero value of the first feature element in the tensor is propagated to a subsequent neural network layer receiving the tensor; and refraining from dropping out the second feature element from the tensor, such that an original value of the second feature element in the tensor is retained and propagated to the subsequent neural network layer receiving the tensor.

13. The method of claim 1, wherein:

generating the mask comprises generating the mask in a general-purpose hardware;

compressing each mask element comprises compressing each mask element in the general-purpose hardware;

storing the compressed mask in the memory comprises storing the compressed mask in a reconfigurable on-chip memory; and selectively dropping out feature elements from the tensor comprises:

transferring the mask from the reconfigurable on-chip memory to a reconfigurable on-chip computing unit, and selectively dropping out feature elements from the tensor in the reconfigurable on-chip computing unit, wherein the reconfigurable on-chip computing unit and the reconfigurable on-chip memory unit are within an IC chip.

13a. The method of claim 13, wherein storing the compressed mask in the reconfigurable on-chip memory comprises:

storing the compressed mask in an off-chip memory, and transferring the compressed mask from the off-chip memory to the reconfigurable on-chip memory, wherein the off-chip memory is external to the IC.

13b. The method of claim 1, wherein generating the mask comprises:

receiving an indication of a percentage of a plurality of feature elements of the tensor that are to be dropped;

randomly or pseudo-randomly selecting a subset of the plurality of feature elements of the tensor, the subset being the indicated percentage of the plurality of feature elements of the tensor; and generating the mask comprising the plurality of mask elements, based on the randomly or pseudo-randomly selected subset of the plurality of feature elements.

13c. The method of claim 13a, wherein a subset of the plurality of mask elements includes the first value indicating that the corresponding subset of the plurality of feature elements of the tensor are to be dropped, the subset of the plurality of mask elements being the percentage of the plurality of mask elements.

13d. The method of claim 1, wherein each mask element of the plurality of mask elements of the mask comprises a number of bits that is equal to a number of bits in each feature element of the tensor.

13e. The method of claim 1, wherein selectively dropping out feature elements from the tensor comprises:

selectively dropping out, based on the compressed mask, feature elements from the tensor output by the neural network layer that is on a forward path of a neural network topology, wherein the method further comprises selectively dropping out, based on the compressed mask, feature elements from another tensor output by another neural network layer that is on a backpropagation path of the neural network topology.

14. The method of claim 1, wherein:

each mask element of the plurality of mask elements includes a corresponding plurality of bits representing either a first value or a second value, the first value being different from the second value;

first one or more mask elements of the plurality of mask elements having the first value are compressed to generate corresponding first one or more compressed mask elements of the plurality of compressed mask elements having a third value; and second one or more mask elements of the plurality of mask elements having the second value are compressed to generate corresponding second one or more compressed mask elements of the plurality of compressed mask elements having a fourth value, the fourth value being different from the third value;

14a. The method of claim 14, wherein:

each of the first value and the second value includes all zeros for all bits, except for a corresponding Least Significant Bit (LSB); and a LSB of the first value is one of zero or a one, and a LSB of the second value is another of zero or one.

15. The method of claim 14, wherein:

the first value represents a logical zero, and the second value represents a logical one; and each compressed mask element of the plurality of compressed mask elements has a single bit comprising either (i) a zero to indicate that the corresponding feature element of the tensor output is to be dropped out, or (i) a one to indicate that the corresponding feature element of the tensor output is to be retained.

16. The method of claim 1, wherein:
    each mask element of the mask comprises corresponding 16 bits; and
    each feature element of the tensor comprises corresponding 16 bits.
17. The method of claim 1, wherein:
    number of bits of each mask element of the mask is same as a number of bits of each feature element of the tensor.
18. A non-transitory computer readable storage medium impressed with computer program instructions, the instructions, when executed on a processor, implement a method comprising:
    generating a mask comprising a plurality of mask elements arranged in (i) a first array comprising a first subset of the plurality of mask elements and (ii) a second array comprising a second subset of the plurality of mask elements, wherein each mask element of the plurality of mask elements comprises a corresponding single bit representing either (i) a zero to indicate that a corresponding feature element of a tensor output by a neural network layer is to be dropped out, or (ii) a one to indicate that the corresponding feature element of the tensor output by the neural network layer is to be not dropped out;
    receiving, at a first lane of a plurality of lanes of a computing element, (i) at least a first feature element and a second feature element of the tensor output by the neural network layer and (ii) the first array and the second array;
    logically right shifting, at the first lane of the computing element, each of the first array and the second array by one or more bits, to respectively generate a shifted first array and a shifted second array;
    selectively either dropping out or retaining the first feature element of the tensor, based on a Least Significant Bit (LSB) of the shifted first array; and
    selectively either dropping out or retaining the second feature element of the tensor, based on the LSB of the shifted second array.
19. The computer readable storage medium of claim 18, wherein the plurality of lanes includes N number of lanes, each lane of the plurality of lanes having a corresponding lane number that varies from 0 to (N−1), and wherein logically right shifting at the first lane comprises:
    logically right shifting, at the first lane of the computing element, each of the first array and the second array by a number of bits that is based on a corresponding first lane number of the first lane.
20. The computer readable storage medium of claim 19, wherein the number of bits, by which each of the first array and the second array is logically right shifted, is equal to the first lane number of the first lane.
21. The computer readable storage medium of claim 18, wherein:
    the first feature element of the tensor is dropped out and replaced by zeros, based on the LSB of the shifted first array being a zero; and
    the second feature element of the tensor is not dropped out and retained, based on the LSB of the shifted second array being a one.
22. The computer readable storage medium of claim 18, wherein the mask is a first mask, wherein the plurality of mask elements is a first plurality of mask elements, and wherein the method further comprises:
    prior to generating the first mask, generating a second mask comprising a plurality of second mask elements, each mask element of the plurality of second mask elements comprising a corresponding plurality of bits; and
    compressing each mask element of the second plurality of mask elements of the second mask to generate the corresponding mask element of the first plurality of mask elements of the first mask, thereby generating the second mask from the first mask.
23. A method for selectively dropping out feature elements from a tensor, the method comprising:
    generating a mask comprising a plurality of mask elements arranged in a first order; and
    compressing each mask element of the plurality of mask elements to generate a corresponding compressed mask element of a plurality of compressed mask elements, and arranging the plurality of compressed mask elements in a second order that is different from the first order, wherein the compressed mask elements are to selectively implement dropout of feature elements of a tensor.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:
1. A method for selectively dropping out feature elements from a tensor in a neural network, the method comprising:
    receiving a first tensor (T1) from a first layer of a neural network, the first tensor comprising a plurality of feature elements arranged in a first order;
    obtaining a compressed mask for the first tensor, the compressed mask comprising a plurality of single-bit mask elements respectively corresponding to the plurality of feature elements of the first tensor and having a second order that is different than the first order of their corresponding feature elements in the first tensor;
    selectively dropping out feature elements from the first tensor based on the compressed mask to form a second tensor (T2); and
    propagating the second tensor to a second layer of the neural network.
2. The method of claim 1, wherein:
    the plurality of feature elements of the first tensor includes a plurality of even feature elements and a plurality of odd feature elements, with the even feature elements and the odd feature elements arranged in an interleaved manner in the first tensor; and
    the compressed mask includes a first array of consecutively arranged even single-bit mask elements and a second array of consecutively arranged odd single-bit mask elements.
3. The method of claim 2, further comprising:
    selectively dropping out one or more of the plurality of even feature elements of the first tensor based on the first array as a part of forming the second tensor; and
    selectively dropping out one or more of the plurality of odd feature elements of the first tensor based on the second array as a part of forming the second tensor.
4. The method of claim 1, further comprising:
    generating a mask for the first tensor comprising a plurality of multi-bit mask elements arranged in the first order and corresponding to the plurality of feature elements of the first tensor; and
    compressing the mask for the first tensor to create the compressed mask;

wherein the first order of the multi-bit mask elements in the mask is different than the second order of the corresponding single-bit mask elements in the compressed mask.

5. The method of claim 4, wherein:

the plurality of multi-bit mask elements is arranged in the first order in the mask, such that a first mask element and a second mask element are consecutive mask elements in the mask;

the first mask element and the second mask element are compressed to respectively generate a first single-bit mask element and a second single-bit mask element; and the plurality of single-bit mask elements is arranged in the second order in the compressed mask, such that the first single-bit mask element and the second single-bit mask element are non-consecutive single-bit mask elements of the plurality of single-bit mask elements in the compressed mask.

6. The method of claim 1, wherein the first tensor (T1) includes N even feature elements and N odd feature elements (where N is a positive integer), the compressed mask includes a first array of single-bit mask elements corresponding to the N even feature elements of the first tensor and a second array of single-bit mask elements corresponding to the N odd feature elements of the first tensor, the method further comprising:

receiving, at a lane i (where i=0, . . . , (N−1)) of a computing unit having N lanes, a corresponding even feature element T1(2i) of the N even feature elements, a corresponding odd feature element T1(2i+1) of the N odd feature elements, and the compressed mask;

selectively dropping out, at the lane i, the even feature element T1(2i) based on the first array of single-bit mask elements; and selectively dropping out, at the lane i, the odd feature element T1(2i+1) based on the second array of single-bit mask elements.

7. The method of claim 6, further comprising:

right shifting, at the lane i of the computing unit, the first array of single-bit mask elements by i bits to generate a shifted first array of single-bit mask elements;

selecting either the even feature element T1(2i) or a zero value based on a Least Significant Bit (LSB) of the shifted first array of single-bit mask elements for feature element T2(2i) of the second tensor to selectively drop out the even feature element T1(2i);

right shifting, at the lane i of the computing unit, the second array of single-bit mask elements by i bits to generate a shifted second array of single-bit mask elements; and selecting either the odd feature element T1(2i+1) or a zero value based on a LSB of the shifted second array of single-bit mask elements for feature element T2(2i+1) of the second tensor to selectively drop out the odd feature element T1(2i+1).

8. The method of claim 6, wherein each feature element of the first tensor consists of M bits and each lane of the N lanes of the computing unit is at least 2M bits wide.

9. A non-transitory computer readable storage medium impressed with computer program instructions, the instructions, when executed on a processor, implement a method comprising:

obtaining a first tensor (T1) comprising a plurality of feature elements arranged in a first order;

obtaining a compressed mask for the first tensor, the compressed mask comprising a plurality of single-bit mask elements respectively corresponding to the plurality of feature elements of the first tensor and having a second order that is different than the first order of their corresponding feature elements in the first tensor; and selectively dropping out feature elements from the first tensor based on the compressed mask to form a second tensor (T2).

10. The non-transitory computer readable storage medium of claim 9, wherein:

the plurality of feature elements of the first tensor includes a plurality of even feature elements and a plurality of odd feature elements, with the even feature elements and the odd feature elements arranged in an interleaved manner in the first tensor; and the compressed mask includes a first array of consecutively arranged even single-bit mask elements and a second array of consecutively arranged odd single-bit mask elements.

11. The non-transitory computer readable storage medium of claim 10, the method further comprising:

selectively dropping out one or more of the plurality of even feature elements of the first tensor based on the first array as a part of forming the second tensor; and selectively dropping out one or more of the plurality of odd feature elements of the first tensor based on the second array as a part of forming the second tensor.

12. The non-transitory computer readable storage medium of claim 9, the method further comprising:

generating a mask for the first tensor comprising a plurality of multi-bit mask elements arranged in the first order and corresponding to the plurality of feature elements of the first tensor; and compressing the mask for the first tensor to create the compressed mask;

wherein the first order of the multi-bit mask elements in the mask is different than the second order of the corresponding single-bit mask elements in the compressed mask.

13. The non-transitory computer readable storage medium of claim 10, wherein the first tensor (T1) includes N even feature elements and N odd feature elements (where N is a positive integer), the compressed mask includes a first array of single-bit mask elements corresponding to the N even feature elements of the first tensor and a second array of single-bit mask elements corresponding to the N odd feature elements of the first tensor, the method further comprising:

receiving, at a lane i (where i=0, . . . , (N−1)) of a computing unit having N lanes, a corresponding even feature element T1(2i) of the N even feature elements, a corresponding odd feature element T1(2i+1) of the N odd feature elements, and the compressed mask;

selectively dropping out, at the lane i, the even feature element T1(2i) based on the first array of single-bit mask elements; and selectively dropping out, at the lane i, the odd feature element T1(2i+1) based on the second array of single-bit mask elements.

14. The non-transitory computer readable storage medium of claim 13, the method further comprising:

right shifting, at the lane i of the computing unit, the first array of single-bit mask elements by i bits to generate a shifted first array of single-bit mask elements;

selecting either the even feature element T1(2i) or a zero value based on a Least Significant Bit (LSB) of the shifted first array of single-bit mask elements for feature element T2(2i) of the second tensor to selectively drop out the even feature element T1(2i);

right shifting, at the lane i of the computing unit, the second array of single-bit mask elements by i bits to generate a shifted second array of single-bit mask elements; and selecting either the odd feature element T1(2i+1) or a zero value based on a LSB of the shifted second array of single-bit mask elements for feature element T2(2i+1) of the second tensor to selectively drop out the odd feature element T1(2i+1).

15. The non-transitory computer readable storage medium of claim 9, the method further comprising:

obtaining the first tensor from a first layer of a neural network; and propagating the second tensor to a second layer of the neural network.

16. A neural network circuit, comprising:

a first layer to generate a first tensor comprising even feature elements and odd feature elements interleaved in the first tensor;

a second layer to receive a second tensor created by dropping out features of the first tensor;

a reconfigurable memory to store a compressed mask comprising an array of N even mask bits and an array of N odd mask bits, where N is a positive integer; and a reconfigurable computing unit having N lanes, coupled to the first layer and the second layer by a vector bus and to the reconfigurable memory by a scalar bus, the reconfigurable computing unit configured to:

receive, at each lane of the reconfigurable computing unit over the scalar bus, the compressed mask from the reconfigurable memory;

selectively dropout feature elements from the first tensor at each individual lane of the computing unit by:

(a) receiving from the first layer over the vector bus at each individual lane, an even feature element and an odd feature element of the first tensor based on a lane number of the individual lane;

(b) selectively dropping out the received even feature element based on the array of N even mask bits; and (c) selectively dropping out the received odd feature element based on the array of N odd mask bits; and propagate the second tensor to the second layer of the neural network circuit.

17. The neural network circuit of claim 16, wherein the reconfigurable computing unit is further configured to selectively dropout feature elements from the first tensor at each individual lane of the computing unit by:

right-shifting both the array of even mask bits and the array of odd mask bits by a number of bits based on a lane number of the individual lane to generate a right-shifted even array of compressed mask elements and a right-shifted odd array of compressed mask elements;

selecting, for a corresponding even feature element of the second tensor, either the received even feature element or a zero value based on a Least Significant Bit (LSB) of the right-shifted even array of compressed mask elements; and selecting, for a corresponding odd feature element of the second tensor, either the received odd feature element or a zero value based on a LSB of the right-shifted odd array of compressed mask elements.

18. The neural network circuit of claim 16, wherein the reconfigurable memory comprises a memory unit of a Coarse Grain Reconfigurable Architecture (CGRA) processor and the reconfigurable computing unit comprises a compute unit of the CGRA processor.

19. The neural network circuit of claim 16, further comprising an external Input/Output (I/O) interface to connect to a host computer, wherein the reconfigurable memory is configured to receive the compressed mask through the I/O interface.

20. The neural network circuit of claim 16, wherein each feature element of the first tensor consists of M bits and each of the N lanes of the reconfigurable computing unit is at least 2M bits wide.

\* \* \* \* \*